US007215563B2

(12) United States Patent
Brandon et al.

(10) Patent No.: US 7,215,563 B2
(45) Date of Patent: May 8, 2007

(54) MULTI-LAYERED MEMORY CELL STRUCTURE

(76) Inventors: Tyler L. Brandon, ECERF, University of Alberta, Edmonton (CA) T6G 2V4; Duncan G. Elliott, ECERF, University of Alberta, Edmonton (CA) T6G 2V4

( * ) Notice: Subject to any disclaimer, the term of this patent is extended or adjusted under 35 U.S.C. 154(b) by 226 days.

(21) Appl. No.: 10/906,594

(22) Filed: Feb. 25, 2005

(65) Prior Publication Data
US 2005/0226068 A1 Oct. 13, 2005

Related U.S. Application Data

(60) Provisional application No. 60/558,976, filed on Apr. 2, 2004.

(51) Int. Cl.
*G11C 17/00* (2006.01)
(52) U.S. Cl. .................. 365/94; 365/103; 365/104; 365/63
(58) Field of Classification Search .................. 365/94, 365/103, 104, 63
See application file for complete search history.

(56) References Cited

U.S. PATENT DOCUMENTS

| | | | | |
|---|---|---|---|---|
| 5,365,475 | A | 11/1994 | Matsumura | 365/154 |
| 5,581,505 | A | 12/1996 | Lee | 365/189.11 |
| 6,002,607 | A | 12/1999 | Dvir | 365/103 |
| 6,041,008 | A | 3/2000 | Marr | 365/225.7 |
| 6,128,218 | A | 10/2000 | You | 365/156 |
| 6,438,024 | B1 | 8/2002 | Gold | 365/154 |
| 6,636,434 | B2 * | 10/2003 | Poullet | 365/94 |
| 6,661,691 | B2 * | 12/2003 | Fricke et al. | 365/63 |
| 6,703,652 | B2 * | 3/2004 | Van Brocklin et al. | 257/209 |

OTHER PUBLICATIONS

K. Agawa, H. Hiroyuki, T. Takayangi, and T. Kuroda. A Bitline Leakage Compensation Scheme for Low-Voltage SRAMs. IEEE Journal of Solid-State Circuits, 36(5):726-34, May 2001.
George M. Ansel, Read Only-Random Access Memory Architecture and Methods for Operating Same. Technical Report 5,880,999, US Patent Office, 1999.
Semiconductor Industry Association. International Technology Roadmap for Semiconductors. Technical report, Semiconductor Industry Association, 2001.

(Continued)

*Primary Examiner*—Connie C. Yoha

(57) ABSTRACT

A high-density memory device and design method that utilizes some or all of the existing stacked process conductor layers provided by a manufacturing process to enhance the number of available bitlines and/or wordlines within the memory device. The memory device includes a plurality of memory cells arranged in columns and rows, a plurality of wordlines, a plurality of bitlines, at least one via-stack, wherein said existing stacked process conductor layers are used to implement at least one additional wordline or bitline. The via-stacks consist of a plurality of vias, are located close to a memory cell, and adapted to electrically connect the memory cell to multiple bitlines or multiple wordlines or both0. This design method increases the number of possible connections to or from each individual memory cell. When this design method is combined with varied configurations of basic underlying ROM cell types, even further increased cell density can be achieved.

36 Claims, 50 Drawing Sheets

Example: Hybrid 3 NOR to 1 Multi-Layered ROM Cell Cross-Sectional Layout

OTHER PUBLICATIONS

C. Bleiker and H. Melchior. A Four-State EEPROM Using Floating-Gate Memory Cells. IEEE Journal of Solid-State Circuits, 22(3):460-3, Jun. 1987.

William D. Brown and Joe E. Brewer. Nonvolatile Semiconductor Memory Technology. IEEE Press, 1st edition, 1998.

D.L. Kencke, A multilevel approach toward quadrupling the density of flash memory. IEEE Electron Device Letters, 19(3):86-8, Mar. 1998.

Carver Mead and Lynn Conway. Introduction to VLSI Systems. Addison-Wesley, 1st edition, 1980.

E. Seevinck, Current-Mode Techniques for High-Speed VLSI Circuits with Application to Current Sense Amplifier for CMOS SRAM's. IEEE JSSC, 26(4):525-536, Apr. 1991.

N. Shibata, Megabit-Class Size-Configurable 250-MHz SRAM Macrocells with a Squashed-Memory-Cell Architecture. IEICE Trans. Electron., E82-C(1):94-104, Jan. 1999.

B. Wicht, Analysis and Compensation of the Bitline Multiplexer in SRAM Current Sense Amplifiers. IEEE Journal of Solid-State Circuits, 36(11):1745-55, Nov. 2001.

* cited by examiner

NAND ROM Schematic

Multi-Valued ROM Schematic

Multiple Adjacent Bitline Schematic

Multiple Transistor Schematic

Example: Hybrid 3 NOR to 1 Multi-layered ROM Cell Layout

Example: Hybrid 3 NOR to 1 Multi-Layered ROM Cell Cross-Sectional Layout

ViaStack

Metals 1-5

Short Via Stack Layout Technique

Hybrid Cross-Over Layout Technique

Conventional NOR ROM Cell Schematic

Conventional NOR ROM Cell Layout

Conventional NAND ROM Cell Schematic

Conventional NAND ROM Cell Layout

Multi-Valued ROM Cell Layout

Multi-Valued ROM Cell Layout, 1.16 bits per Λ

Multi-Bitline ROM Cell Schematic

Multi-Bitline ROM Cell Layout, 0.86 bits per Λ

Multiple Transistor ROM Cell Schematic

Multiple Transistor ROM Cell Layout, 0.92 bits per Λ

Multiple Wordline ROM Cell Schematic

Multiple Wordline ROM Cell Layout, 0.65 bits per Λ

Vertical Wordline ROM Cell Schematic

Hybrid 3 NOR to 1 Multi-Layer ROM Cell Schematic

Hybrid 3 NOR to 1 Multi-Layer ROM Cell Layout, 1.33 bits per Λ

Hybrid 1 NOR to 2 Multi-Transistor ROM Cell Schematic

Hybrid 1 NOR to 2 Multi-Transistor ROM Cell Layout, 1.11 bits per A

Hybrid 1 NOR to 3 Multi-Transistor ROM Cell Schematic

Hybrid 1 NOR to 3 Multi-Transistor ROM Cell Layout, 1.07 bits per Λ

Hybrid 2 NOR to 2 Multi-Transistor ROM Cell Schematic

Hybrid 2 NOR to 2 Multi-Transistor ROM Cell Layout, 1.14 bits per Λ

Hybrid 2 Multi-Valued to 1 Multi-Layer ROM Cell Schematic

Hybrid 2 Multi-Valued to 1 Multi-Layer ROM Cell Layout, 1.74 bits per Λ

Hybrid 1 Multi-Value to 1 Multi-Layer ROM Cell Schematic

Hybrid 1 Multi-Value to 1 Multi-Layer ROM Cell Layout, 1.55 bits per Λ

Hybrid 1 NAND to 1 Multi-Wordline ROM Cell Schematic

Hybrid 1 NAND to 1 Multi-Wordline ROM Cell Layout, 0.75 bits per Λ

Normalized Cell Density vs. Number of Metal Interconnect Layers

Process Metal Vs. Relative Width

Process Metal Vs. Relative Metal Pitch

1 Bitline-Column SRAM-ROM Cell Schematic

1 Bitline-Column SRAM-ROM Cell Layout

2 Bitline-Column SRAM-ROM Cell Schematic

2 Bitline-Column SRAM-ROM Cell Layout

2 Bitline-Column SRAM-ROM Cell Layout

Theoretical cell storage capacity for various manufacturing technologies in a 1-mm² area, based on Λ.

Theoretical cell storage capacity for various manufacturing technologies in a 1-mm² area, based on metal layers and minimum transistor sizes.

MULTI-LAYERED MEMORY CELL STRUCTURE

CROSS REFERENCE TO RELATED APPLICATIONS

This is a continuation of 60/558,976, filed Apr. 02, 2004.

FIELD OF THE INVENTION

This invention relates to integrated memory circuits and more particularly to a multi-layered memory cell structure.

BACKGROUND OF THE INVENTION

Read-only memories (ROMs) are non-volatile memory devices that are programmed once. ROMs are high-density storage elements designed to accept an address and to return data associated with that address. As shown in FIG. 1, a conventional ROM 2 consists of a two-dimensional array of storage elements or memory cells 3, wordline WL (row) decoder circuitry 4 and data or bitline BL (column) decoders 6 and sense amplifiers 8. Wordline decoder circuitry 4, positioned on one side of the array, is designed to activate one row of storage cells at a time based on the input address provided to ROM 2.

Each memory cell 3 is programmed to store one of the two logic states during the fabrication of the cell by connecting the gate of the transistor to either the source of the transistor (e.g. if the cell is to store a logic "1") or to the wordline WL that corresponds with the cell if the cell is to store a second logic state (e.g. logic "0"). The information stored within the two-dimensional array of memory cells 3 traverses the bitlines (in column formation) to the sense amplifiers 8, where the analog voltages from the bitlines are converted to a digital signal. Bitline data decoders 6 relay the requested data to external circuitry (not shown) based on the other part of the input address. One current example of ROMs being used today, is in lookup tables for complex calculations in micro-processor units (e.g. fast division or transcendental functions).

Typically, the data contents of a ROM are determined at the time of creation and are static. However, there are exceptions in which the contents of a ROM can be modified at a later point in time. One example of such an arrangement is disclosed in William D. Brown and Joe E. Brewer, *Nonvolatile Semiconductor Memory Technology* IEEE Press, 1st edition, 1998. Even so, the desireability of ROMs over other non-volatile memories (e.g. flash EEPROMs) is related to the fact that while non-volatile memory can be altered after manufacturing, this capability comes at the cost of decreased density and increased manufacturing complexity. If an application truly requires a static data set, a ROM will cost less and operate at higher speed.

Accordingly, various types of ROM memory cells are in widespread use in the electronics industry. The following are a few examples of conventionally utilized ROM memory cells.

NOR ROM Cell

FIG. 2A illustrates the structure of a NOR ROM memory cell 10 that uses one transistor to represent one bit. The combination 11 of a resistive device connected to a fixed potential, provides a default value for the memory cells. The wordlines WL0 and WL1 run along rows of cells. Also, since wordlines are built using polysilicon (a high resistive material), a conductor layer is typically placed on top of the polisilicon and electrically connected to the polisilicon periodically. This allows the metal to act as a low resistance backup path and results in a low resistance wordline. As is conventionally known, a one or zero in a memory cell is represented through the presence or absence of the cell transistor or connection to the bitline. Some ROMs are built such that the connection to the bitlines is made in the highest layer of metal, to facilitating the "writing" of the ROM data contents at a later date. Bitlines are either actively pre-charged between reads or are connected to a weak pull-up device. FIG. 2A shows two NOR ROM cells connected to a bitline BL along with a pre-charge device 11. In this case, if either wordline WL0 or WL1 turns on, the bitline BL would be pulled low.

The number of cells attached to a bitline depends on the design considerations, namely the desired density versus speed. Typical values range from 32 to 256 cells in a column. A read operation is conducted by first decoding the address to activate one wordline. The wordline turns the access transistors "on", which may or may not exist. Depending on the presence or absence of the transistor within the cell, the associated bitline will or will not be pulled low from a pre-charged level. The voltage swing on the bitlines is sensed by a sense amplifier and the data at the columns is multiplexed out to produce the output of the ROM. The wordline is turned "off" and the bitlines are then pre-charged in preparation for the next read.

NAND ROM Cell

FIG. 2B illustrates a conventional NAND ROM memory cell 12 where memory cells are connected in series within a column to form the bitline BL. This is in contrast to the NOR ROM 10 of FIG. 2A, where memory cells within a column are connected to the bitline in parallel. During normal operation, all the wordlines WL0 and WL1 are "on", with the exception of the addressed wordline, which is turned "off". If a bypass connection (from the source to drain of the transistor) exists, "zero" is stored in the memory cell. In such a case, the act of turning "off" the cell transistor has no effect on the state of the bitline BL. On the other hand, if a bypass connection does not exist, the transistor will turn off, the bitline BL will charge high and a value of "one" will be read. The NAND ROM 12 of FIG. 2B has its cells in series and no bypass connection exists in either cell. Therefore, if either wordline WL0 or WL1 was to turn "off" (it should be noted that all wordlines in a NAND rom are by default "on") the bitline BL would charge high. Due to the series connection between cells, a large amount of resistance can be seen on bitline BL, thus limiting the speed of operation for this NAND ROM cell architecture.

Multi-Valued ROM Cell

FIG. 2C illustrates a multi-valued ROM memory cell 14 which operates in much the same way as the NOR ROM 10 of FIG. 2A, except that multi-valued cells store information through the modification of the storage transistor (e.g. by changing the width or length of the transistor). The resulting variation in sourcing current can be sensed and converted to a binary value. Specifically, in FIG. 2C, the relative widths of the transistor are represented above the transistor (i.e. as "1", "2", "3" or "4"). Shown are four variations on the size of the transistor, which effect the drive strength. The underlying cell configuration is that of a NOR network, where the cells are connected to the bitline BL in parallel.

Non-Volatile Memories

Non-volatile memories allow the contents of the memory to be modified. For example, Flash EEPROMs, consist of many different types: floating gate, charge-trapping, ferroelectric and magnetic devices. In principle, floating gate and charge-trapping non-volatile memories work by altering the threshold of a transistor though the injection of charge into a region between the transistor gate and the channel. This charge can be stored in a conducting layer (floating gate) or a non-conduction layer (charge trapping). Depending on the technique used, densities can approach those of DRAM. However, non-volatile memories typically lag behind by one or two generations as documented in William D. Brown and Joe E. Brewer. *Nonvolatile Semiconductor Memory Technology*, IEEE Press, 1st edition, 1998.

Further, by finely controlling the amount of charge injected into the floating gate, more than two levels can be stored as discussed in C. Bleiker and H. Melchior. A four-state eeprom using floating-gate memory cells. *IEEE Journal of Solid-State Circuits*, 22(3):460–3, June 1987. Specifically, both 4-level and 16-level EEPROMs have been reported (see D. L. Kencke, R. Richart, Shyam Garg, and S. K. Banerjee. A multilevel approach toward quadrupling the density of flash memory. *IEEE Electron Device Letters*, 19(3):86–8, March 1998). EEPROMs benefit from their re-programmability and that they can hold there charge for over ten years. However, for those applications that do not require the memory to be modified, ROMs hold a clear advantage in that they require no modification to the integrated circuit manufacturing process and they typically have a smaller cell size.

Multiple Bitline ROM Cell

FIG. 2D illustrates an example of a multiple adjacent bitline ROM memory cell 16 designed according to a relatively new technique which uses multiple bitlines BL1, BL2, BL3 and BL4 in a ROM as disclosed in U.S. Pat. No. 6,002,607 to Dvir. Dvir describes a method by which the drain of a transistor in a ROM cell can connect to one of many adjacent bitlines BL1, BL2, BL3 and BL4 which allows a single transistor to store multiple bits. Also presented is a method by which x bits can be stored using x+1 bitlines and x/2 transistors. This reference states that for a 2-bit cell, that the bitline capacitance is reduced by approximately 75%. This reduction is due the to reduced number of transistors connected to each bitline BL1, BL2, BL3 and BL4. However, such a large reduction would only appear possible if the parasitic capacitance of the bitlines is ignored.

Multiple Transistor Cell

FIG. 2E shows an example of how two transistors can be used to connect to a combination of two of the bitlines BL1, BL2, BL3, BL4 and BL5 (or one or no bitlines). In the case of multiple bitlines BL1, BL2, BL3, BL4 and BL5, it is possible to use multiple transistors to connect to them. This allows for multiple bits to be represented by two or more transistors configured together in this way. The theoretical number of bits that can be represented is the "log base two" of the total number of combinations of connections between the transistors and the bitlines BL1, BL2, BL3, BL4 and BL5.

Storage density, or simply density, is defined to be the amount of storage divided by the area required to implement the storage. For a ROM, the area includes decoders, sense amplifiers and an external interface (periphery circuitry) along with the storage elements. Generally, the periphery area is ignored and cell density is calculated as the number of bits stored in the cell divided by the area of the cell. While the density of the above-noted ROM devices have been sufficient for past and present computing needs, as the devices that utilize ROMs get smaller, cheaper and faster, there is a continuing need for ROMs that are faster, consume less power, and require less silicon to implement and manufacture.

SUMMARY OF THE INVENTION

The invention provides in one aspect a multi-layered memory device for storing data and subsequently reading out the stored data, said memory device utilizing a plurality of existing stacked process conductor layers, said memory device comprising:

(a) a plurality of memory cells arranged in columns and rows, each memory cell including at least one transistor, each transistor being adapted to store a logic state;

(b) a plurality of wordlines corresponding to the plurality of rows, each wordline being used in common in each row of said memory cells, at least one of said wordlines being connected to a corresponding memory cell in the column of memory cells;

(c) a plurality of bitlines, said bitlines arranged substantially orthogonal to said wordlines, at least one of said bitlines being used in common for data read-out along a column of memory cells;

(d) at least one via-stack consisting of a plurality of vias arranged in close proximity to at least one memory cell, said via-stack being adapted to electrically connect at least one transistor within at least one memory cell to at least one of the existing process conductor layers;

wherein said existing stacked process conductor layers are used to implement at least one additional wordline as defined in (b) or additional bitline as defined in (c) within the device.

The invention provides in another aspect, a method of designing a multi-layered memory device for storing data and subsequently reading out the stored data, said method utilizing existing stacked process conductor layers, said method comprising the steps of:

(a) providing and arranging a plurality of memory cells in columns and rows, each memory cell including at least one transistor, each transistor being adapted to store a logic state;

(b) providing a plurality of wordlines corresponding to the plurality of rows, each wordline being used in common in each row of said memory cells, at least one of said wordlines being connected to a corresponding memory cell in the column of memory cells;

(c) providing and arranging a plurality of bitlines substantially orthogonal to said wordlines, at least one of said bitlines being used in common for data read-out along a column of memory cells;

(d) providing and arranging at least one via-stack consisting of a plurality of vias arranged in close proximity to at least one memory cell, said via-stack being adapted to electrically connect the transistor within the at least one memory cell to at least one of the existing process conductor layers;

wherein the existing stacked process conductor layers are used to implement at least one additional wordline as defined in (b) or bitline as defined in (c) within the device.

Further aspects and advantages of the invention will appear from the following description taken together with the accompanying drawings.

DETAILED DESCRIPTION OF THE INVENTION

Figure 1:
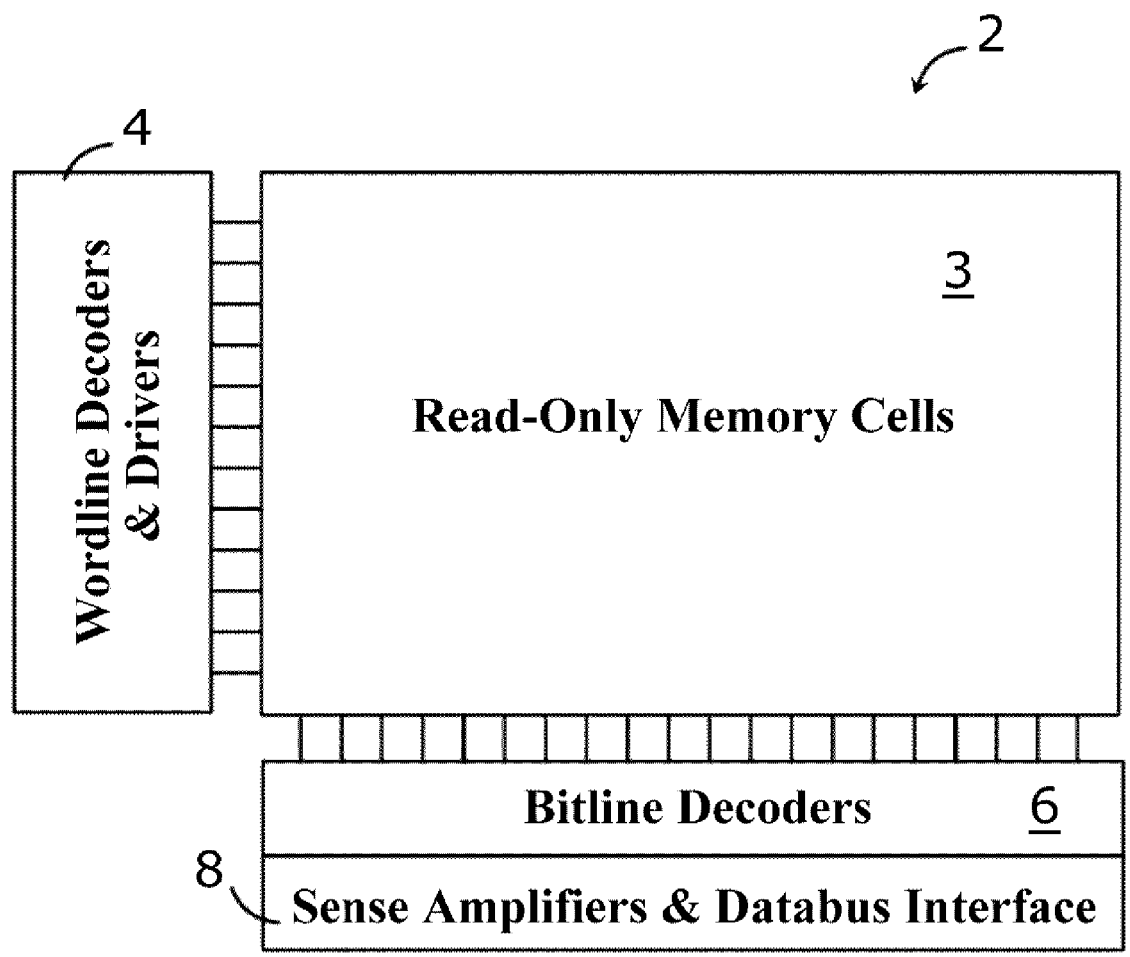
FIG. 1 is a block diagram of a conventional prior art ROM memory device.
Figure 2A:
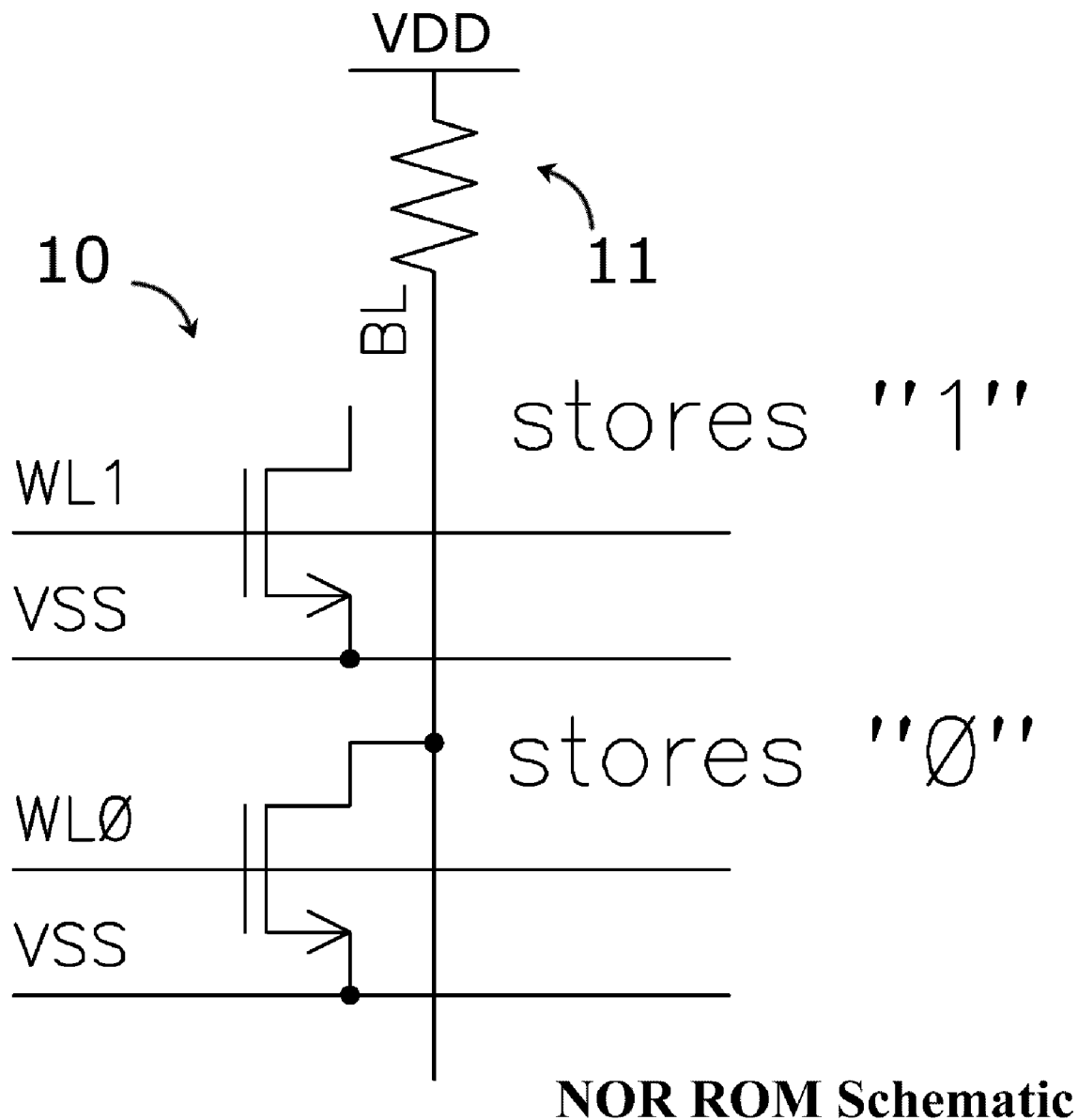
FIG. 2A is a schematic diagram of a conventional prior art NOR ROM device.
Figure 2B:
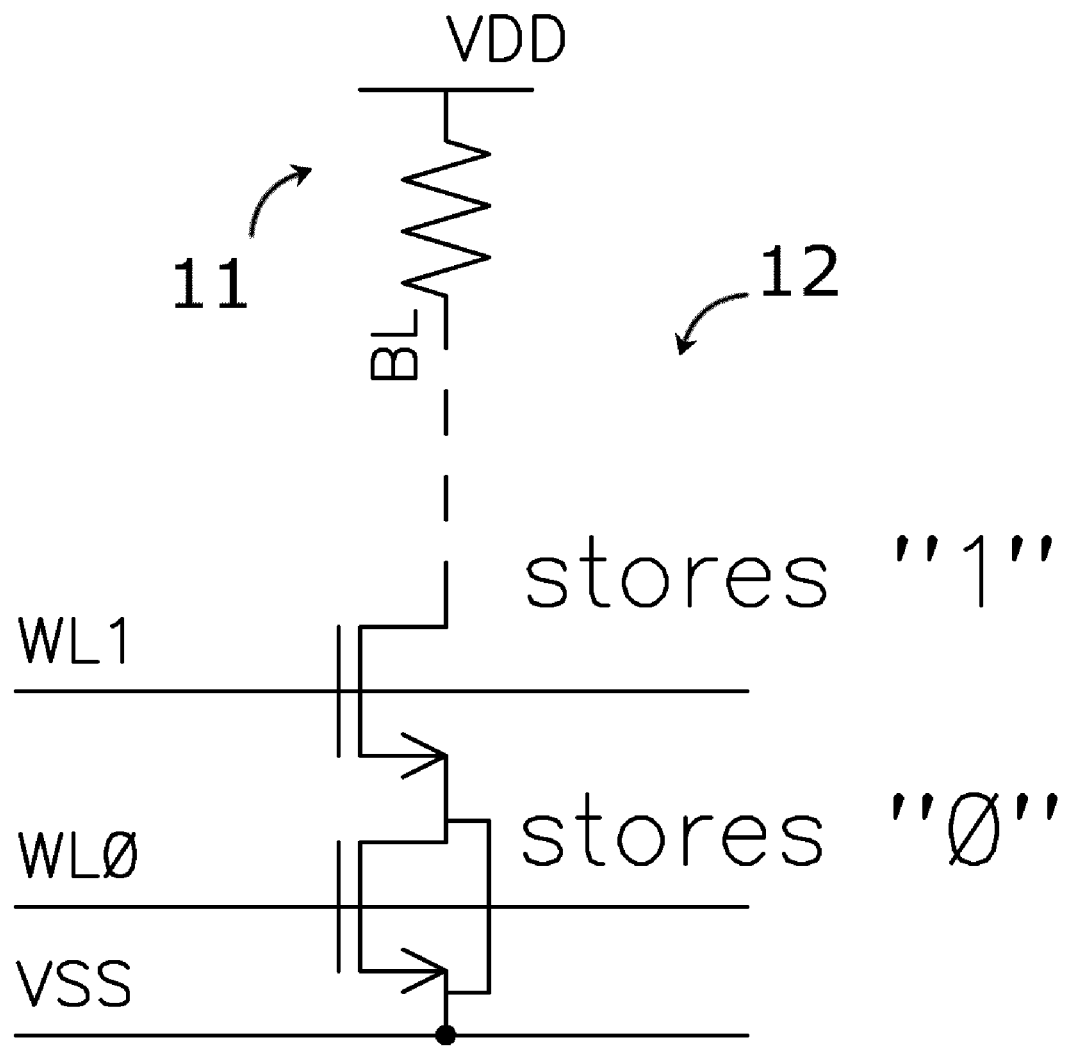
FIG. 2B is a schematic diagram of a conventional prior art NAND ROM device.
Figure 2C:
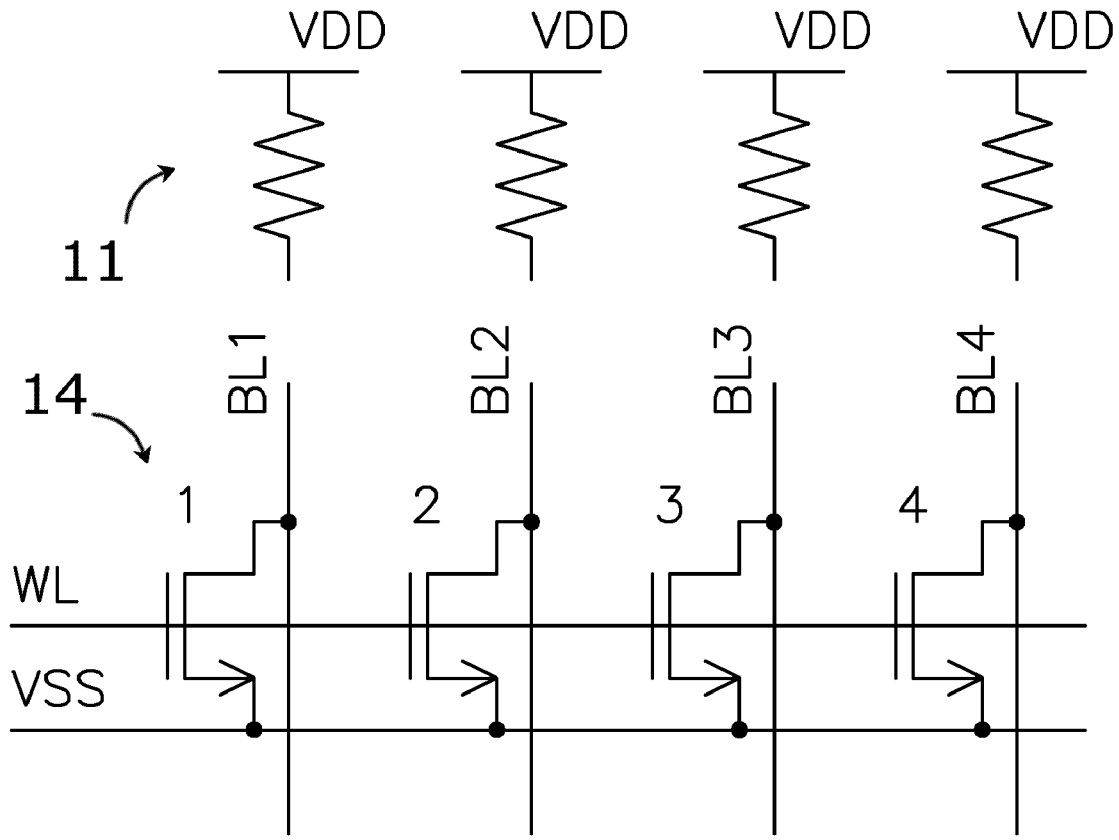
FIG. 2C is a schematic diagram of a conventional prior art multi-valued device.
Figure 2D:
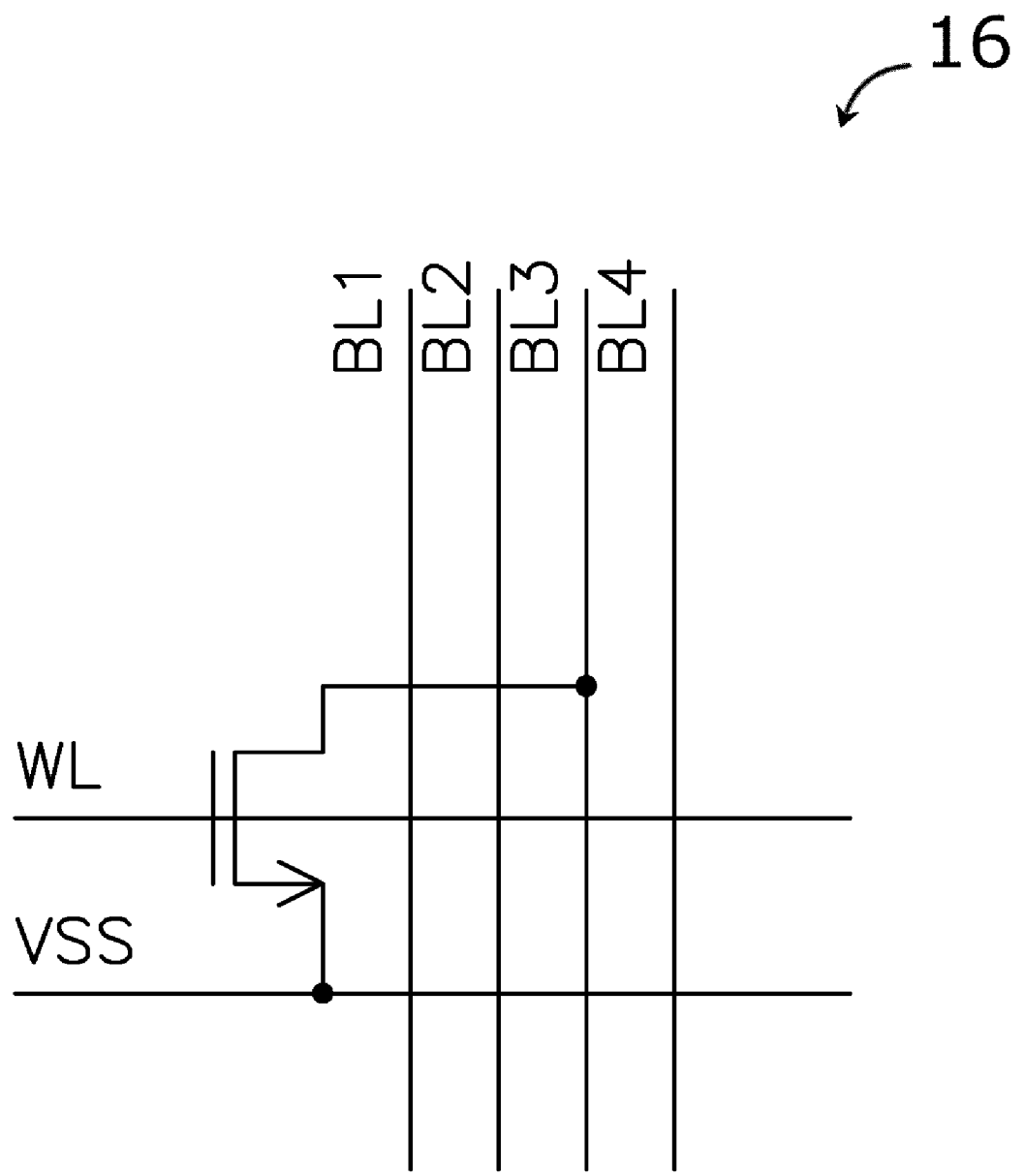
FIG. 2D is a schematic diagram of a conventional prior art multiple adjacent bitline device.
Figure 2E:
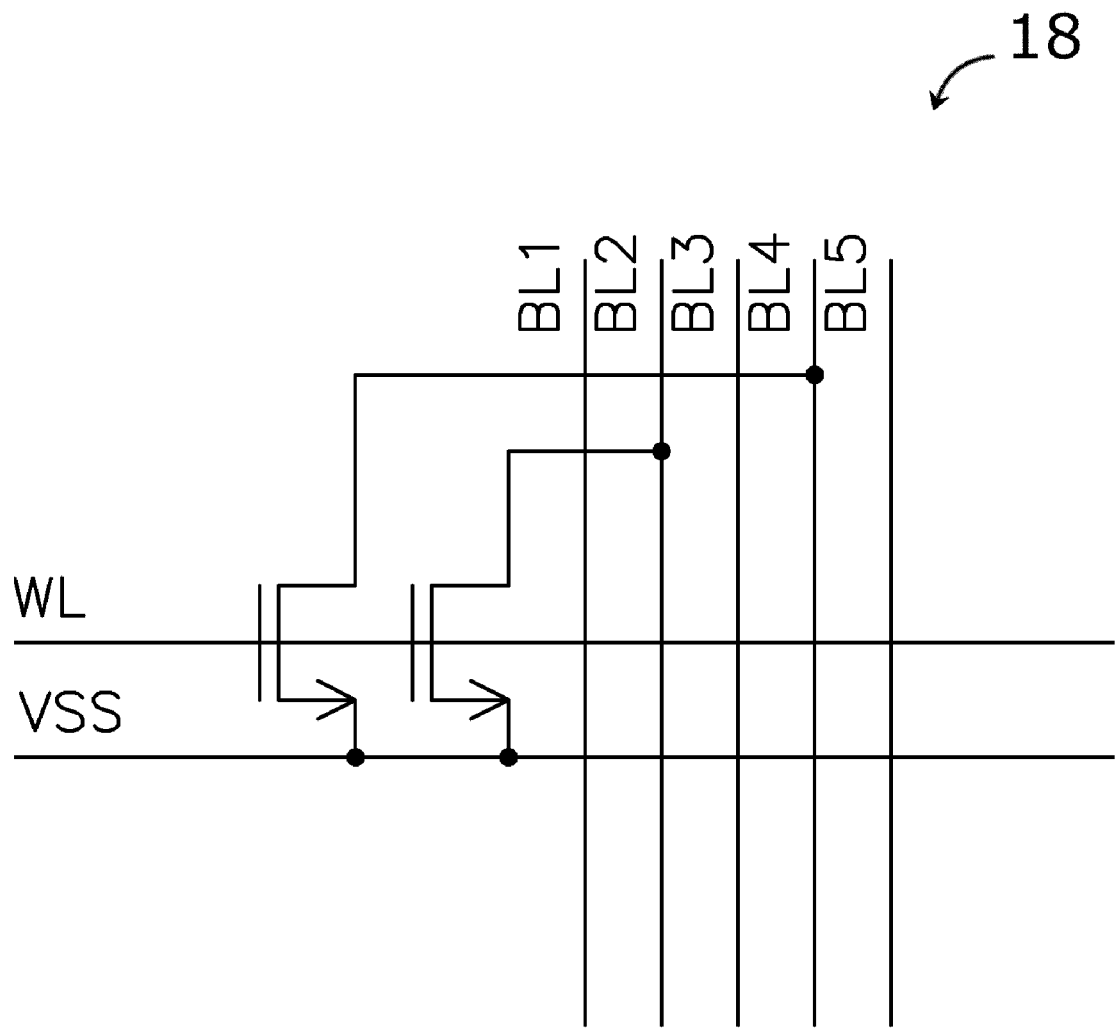
FIG. 2E is a schematic diagram of a conventional prior art multiple transistor device.

As is conventionally known, commercially available ROMs use a single conductor layer for all of the bitlines (typically columns) and an additional conductive layer or layers for all of the wordlines (typically rows). As will be described, the use of multiple layers for additional bitlines results in a higher-density ROM with a small associated cost of providing of additional bitlines (in terms of area). As will be described, the architectures and design techniques of the present invention have been found to increase the density of the storage cell with minimal impact on the area of the periphery. The application of the multi-layer techniques of the present invention to the conventional ROM architectures discussed above will be described.

To facilitate a general discussion of the relative density of various ROM architectures, it is preferable to use a common measure across manufacturing processes. Since every manufacturing process is different, a common measure based solely on physical design rules is not possible. For comparison purposes, the following discussion will adopt measurement unit Λ (Lambda). That is, the size of each device (e.g. substrate contacts, vias, metal pitches and transistors) will be represented in terms of the measurement unit Λ. For illustrative reasons, we define Λ as a measurement of unit area that has a different physical size in each manufacturing process. It should be noted that measurement unit Λ grows in physical size until all relevant devices can be constructed. In this way, measurement unit Λ is an appropriate measuring stick used for devices across manufacturing processes. In contrast, the measure λ (lambda), is defined to be a common measuring stick for design rules across various manufacturing processes. Unlike λ, which is a unit of length, Λ represents a unit of area. The physical size of measurement unit Λ provides for spacing between the devices such that a device layout can be constructed without violating any manufacturing design rules. For example, a small transistor can fit in an area of 2Λ and contact/via structures in 1Λ. While using Λ does not necessarily produce the densest possible layout, it does provide a method by which layout architectures can be compared across multiple manufacturing process technologies.

To design and build an architecture that would provide the absolute highest density would require the disclosure of the manufacturing rules upon which the design is based which is forbidden by most manufacturing companies. Furthermore, such designs and claims would only be valid for the specific process for which they were built. It is our intention to investigate architectures that provide higher-density ROMs across many processes when compared with other conventional ROM architectures. By abstracting each process to meet a common set of layout or design conditions, it is possible to construct a scalable relative measurement unit that allows for the comparison of ROM architectures across technologies. Such comparison results remain valid as process technology continues to scale (in the absence of radical shifts in the way integrated devices are built).

Figure 3A:
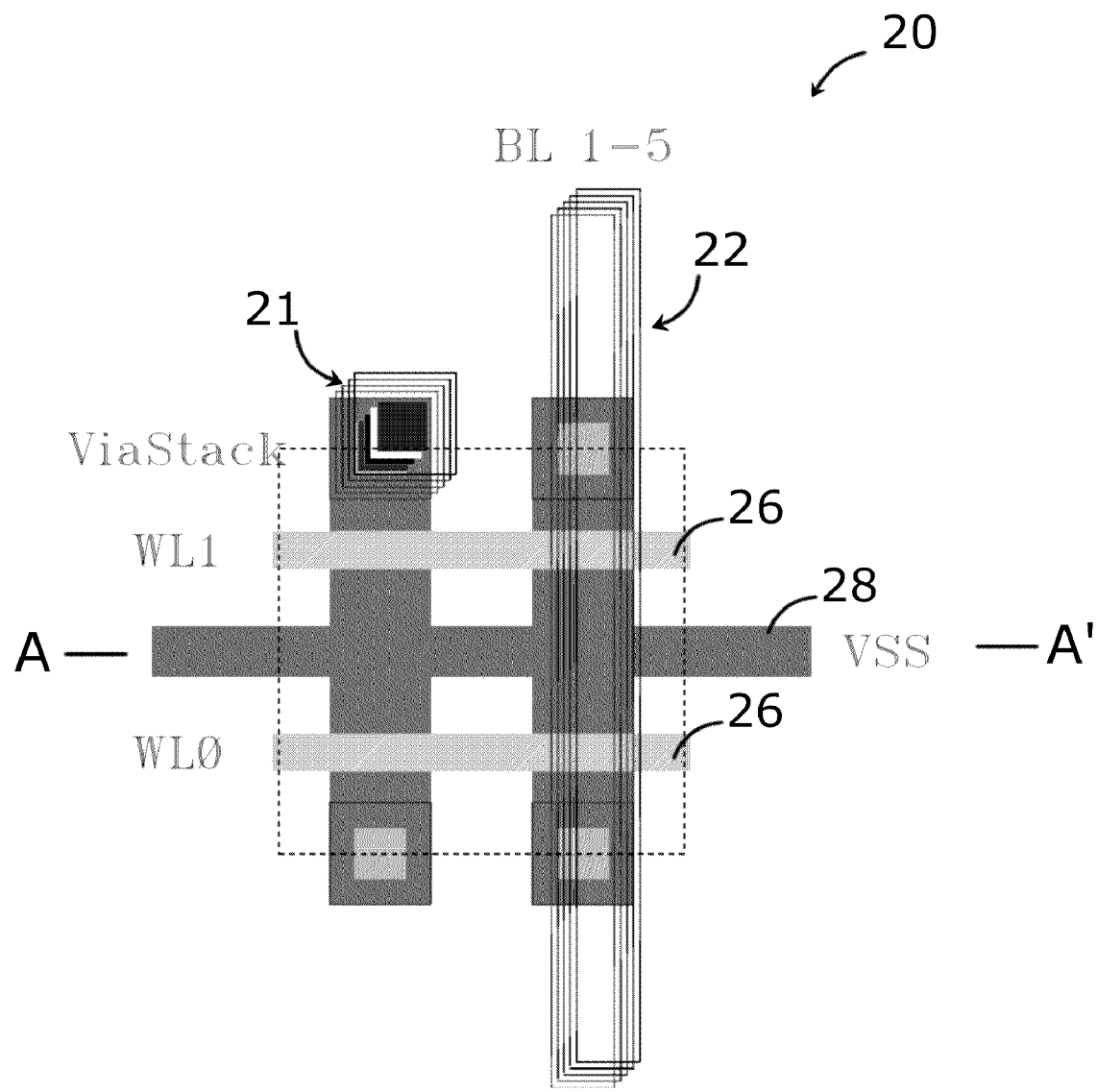
FIG. 3A is a layout design for a ROM memory cell designed in accordance with the present invention.
Figure 3B:
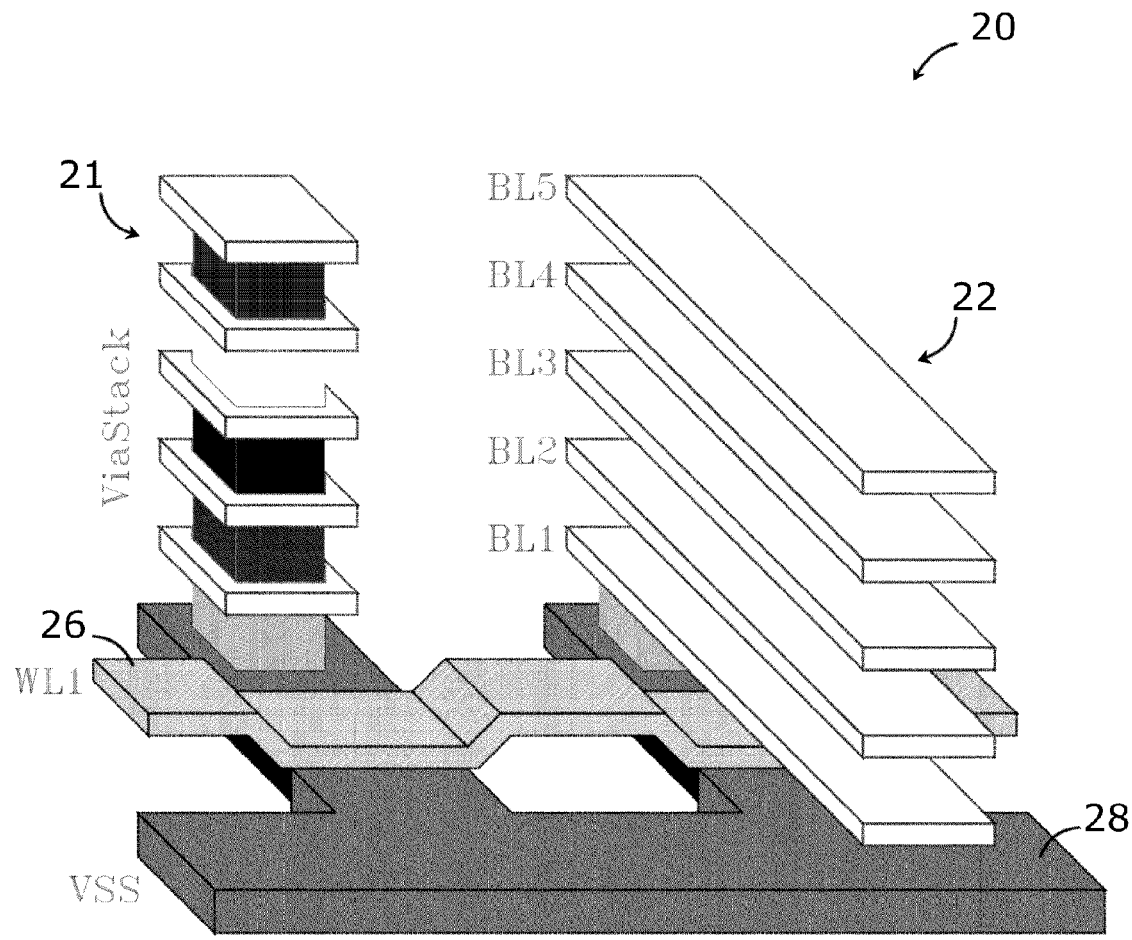
FIG. 3B is a side perspective view of the memory cell of FIG. 3A taken along the line A–A' of FIG. 3A.

FIGS. 3A and 3B show different views of an example layout for a memory cell 20 designed in accordance with the present invention. Stacks of a multiple via-stack 21 and conductor layers 22 are used to provide additional connectivity within the memory cell 20. Specifically, via-stack 21 allows a connection to be made from the drain of the transistors to any of the five metal bitlines BL1, BL2, BL3, BL4, and BL5 that run vertically over the cell. The conventional notation of a dashed box is used to represent the repeatable boundary for the ROM memory cell 20. Wordlines 26 (typically a poly-silicon layer represented in light grey in FIGS. 3A and 3B) are represented by "WL0", "WL1", etc. as shown. The ground potential is referred to as "VSS" and the dark layer, next to "VSS", is a diffusion layer 28. As is conventionally known, where a wordlines WL0, WL1, etc. crosses diffusion 28, a transistor is formed.

For ease of explanation, no connections are shown between the via-stacks and the multiple bitlines in the layout figures in order to illustrate the simplest representation of memory cell 20 (in its un-programmed state). It should be understood that when programmed, the connections between the via-stacks and the bitlines would depend on the information being stored in the ROM. A via stack is a collection of electrically conductive vias that form an electrical connection between a plurality of conductive layers. In the figures via stacks are depicted as vertically aligned stacks or vias, which have a compact layout. Other possible implementations of a via stack include a zigzag layout, a staircase layout, or any layout with some or all of the vias horizontally offset from the via immediately below it.

Figure 4A:
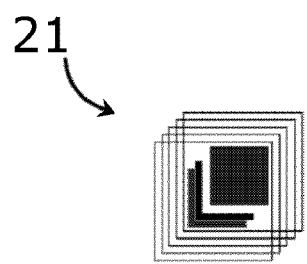
FIG. 4A is a layout of the via-stack of the memory cell of FIG. 3B.
Figure 4B:
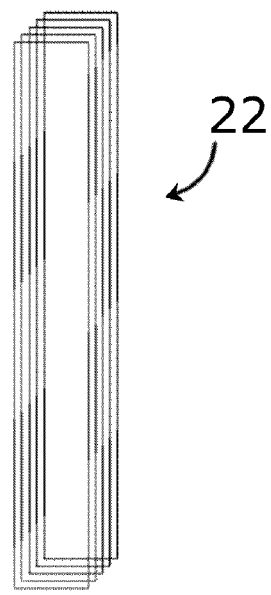
FIG. 4B is a layout of the metal stack of the memory cell of FIG. 3B.

FIGS. 4A and 4B illustrate how multiple via layers 21 are stacked and how multiple conductor layers 22 are stacked. Both via-stacks 21 and metal stacks 22 are produced using conventional integrated circuit production methods and are used within the memory cell structure 20 of FIGS. 3A and 3B as will be discussed in detail. Specifically, FIGS. 3A and 4A show each via surrounded by the conductor layers each via connects to. Via-stack 21 connects conductor layer 1 to conductor layer 5 (i.e. bitlines BL1 to BL5) where conductor layer 5 is physically the highest layer in the stack and conductor layer1 is the lowest as shown. FIGS. 3B and 4B illustrate how the five conductor layers 1 to 5 (i.e. bitlines BL1 to BL5), which are not connected, but which overlap each other as shown.

As shown in FIGS. 3A and 3B, the conductor layers provided by conventional integrated circuit manufacturing can be utilized to substantially increase the density of various conventional ROM memory cells. Specifically, it will be demonstrated using the conventional ROM structures discussed above in respect of FIGS. 2A to 2E how memory structures built in accordance with the present invention can use multiple conductor layers to increase the number of bitlines and wordlines attached to each cell. As conventionally known, the more bitlines that can attach to a cell, the more information can be stored in that cell. Cell density is typically measured in bits per normalized area where normalized area is based on the NOR ROM cell. The relationship between increased bitlines and increased density will be discussed further.

ROM storage mainly involves three principles, namely the re-use of physical structures, the creation of unique paths to or from the cell, and electrical differentiation. The amount of information that can be stored in a ROM depends on the number of unique conditions the cells within the ROM can generate. The memory structures 20 built in accordance with the invention use multiple bitlines per storage cell to create additional unique paths from the storage element. By connecting the multiple conductor layers created during the fabrication process within a ROM cell to one of many bitlines running over the cell (instead of the conventional single bitline), the number of unique conditions a cell can generate can be substantially increased as can the cell density.

This approach differs from electrical storage, which creates identifiable conditions along a path. Electrical storage relies on the ability to create unique and identifiable conditions along a path. By varying the current drive of a storage cell by altering a transistor width or length, it is possible to store varying amounts of information. Also, it should be understood that storage options using other dimensions are possible. As previously described, multiple signal lines can be used where each line contains one of two states. Here, a single line can adapted to contain one of three or more states. Accordingly, it is possible to combine these two storage types to achieve a greater level of storage density.

Memory cells within a ROM device allows for signals to traverse various pathways between the cells. The arrival of the electrical values from the actual storage cells at different times is dependent on the wordlines used to activate the cell. Given a number of electrical values at difference cells within a ROM structure, various paths to the sense-amplifier and a number of wordlines, there are a number of possible "outcomes". For example, for a memory cell configuration with three types of electrical values and three different paths to the sense-amplifier, there can be one of ten possible outcomes each time a wordline is activated (nine from the three types of electrical values and three paths to the sense-amplifier, and the tenth outcome being no electrical value is transmitted). Referring back to a common ROM architecture, the basic NOR ROM shown in FIG. 2A has one path to the sense-amplifier and two electrical values (i.e. one bitline and an electrical signal on the bitline sensed as a binary zero or one).

Generally, in order to evaluate the performance of ROM, various measures are taken of the various paths to the sense-amplifier, what electrical value was received by the sense amplifier and at what time it was received. The activation of one of the wordlines (rows) at different points in time, allows the ROM to re-use the same physical structures (primarily the bitlines and sense amplifiers) when accessing information. An example of creating unique paths to the storage cell, is the use of multiple wordlines for a single row of storage elements. This allows the activation of various cells along the row at different times (through multiple wordlines). Using multiple bitlines is an example of creating unique paths from the cell. Adding unique paths "to" and "from" the cell increases the amount of information stored by the cell. Uniquely addressable activation paths "to" a common storage element(s) can also be referred to as temporal storage, in that accessing information in the cell requires the assertion of each wordline at separate points in time (due to a single bitline for the output of the cell).

In theory, it is possible to design storage elements that can store an arbitrary numbers of bits. However, when it comes to the actual design, certain designs can be inefficient from a practical processing point of view. Approaching the design problem from the physical point of view (manufacturing process technology parameters) helps to more accurately determine the feasibility of a design. The use of the process-independent measurement ($\Lambda$) discussed above, further helps to reduce process-specific design possibilities to a set of design possibilities that can be implemented across many process technologies.

A. Layout Techniques

Three specific layout techniques of the present invention will now be discussed. These techniques result in increased storage density, yet have simple schematic representations. These techniques will then be applied to the design of conventional various well-known ROM cell architectures.

Multi-Layer Technique

The multi-layer technique uses existing process metals to increase cell density. Over the past few years, the number of conductor layers that have become available to the integrated circuit designer has increased from typically two in 1985 to eight in 2002. It is interesting to note that the number to conductor layers is predicted to reach eleven in 2016 [Semiconductor Industry Association. International technology roadmap for semiconductors. Technical report, Semiconductor Industry Association, 2001].

Most designers and manufacturers utilize the multiple conductor layers as inter-connect. The present invention provides for the use of these layers in representing information. For example, multiple bitlines can be built in multiple layers, stacked one above another. Increasing the number of bitlines per cell increases the number of states the cell can represent. Because the connections between metals are not easily modified after fabrication, this technique is quite suitable to ROMs (in all their forms). As process technology continues to scale, so will this multi-layer technique, since additional conductor layers equate to increased density for multi-layer ROMs.

Short Via-Stack Layout Technique

Figure 5:
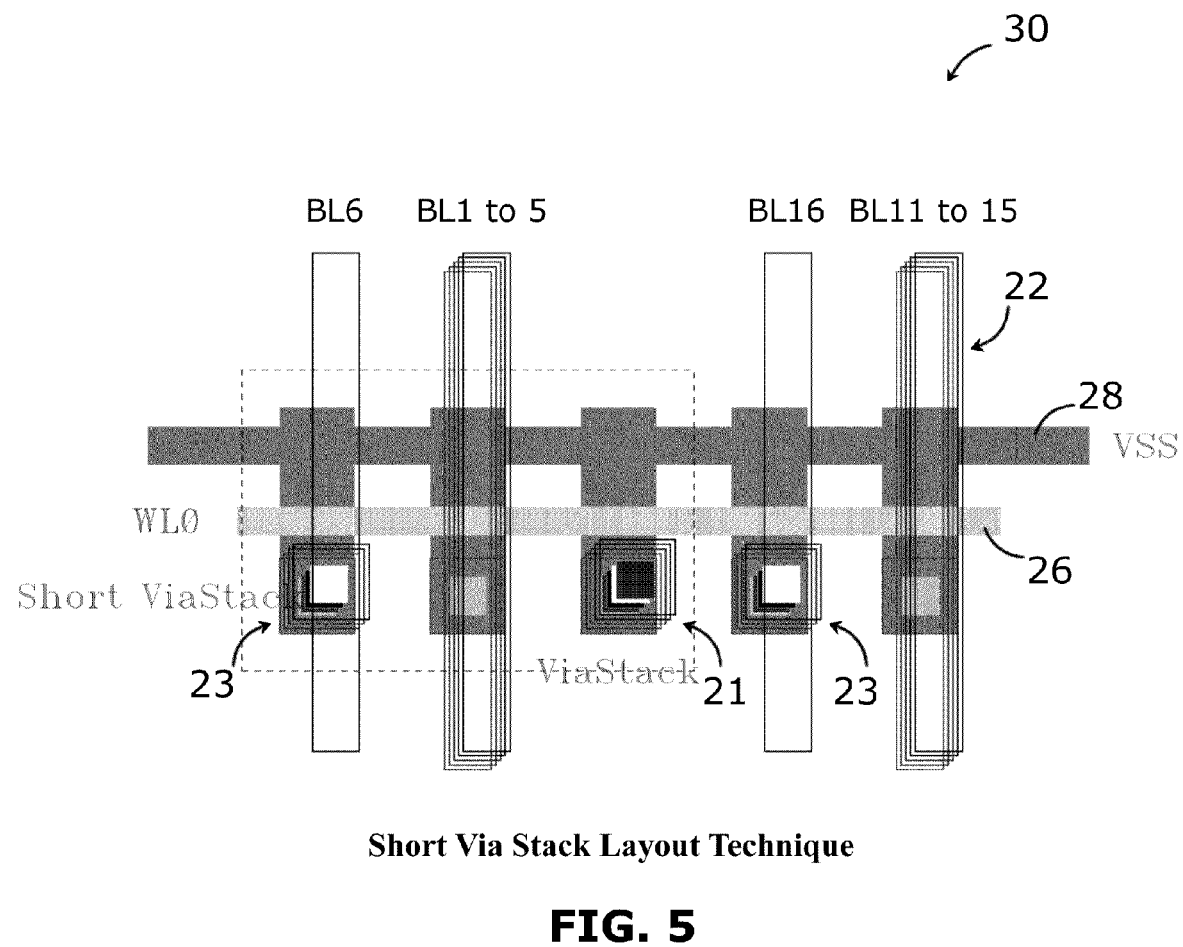
FIG. 5 is a layout design for a memory cell designed using the short via-stack technique of the present invention.

FIG. 5 illustrates another related technique of the present invention, namely an example layout for a memory cell 30 where multiple bitlines BL1 to BL5 are shown with a via-stack on either side. A regular full via-stack 21 is on one side and a "short" via-stack 23 is on the other. Also shown, are another set of bitlines BL10 to BL15 within an adjacent cell with another short via-stack 25. When multiple columns of via-stacks 21 and 23 are used within a cell to connect to multiple bitlines BLs, the restriction of the height of one or more columns of the via-stacks (i.e. "short" via-stack 23) allows for additional bitlines to run over top of the "short" stacks. This results in the ability to store more information within the same cell area.

Referring back to FIG. 5, since short via-stack 23 is provided on the left hand side of bitlines BL1 to BL5, it is possible to run an additional bitline BL6 over short via-stack 23. The regular via-stack 21 on the right-hand side of bitlines B1 to B5, can then be connected to one of the multiple bitlines BL1 to BL5 within its own cell or to the bitline B16 running over the short via-stack 25 in the adjacent cell (on the right).

Cross-Over Layout Technique

Figure 6:
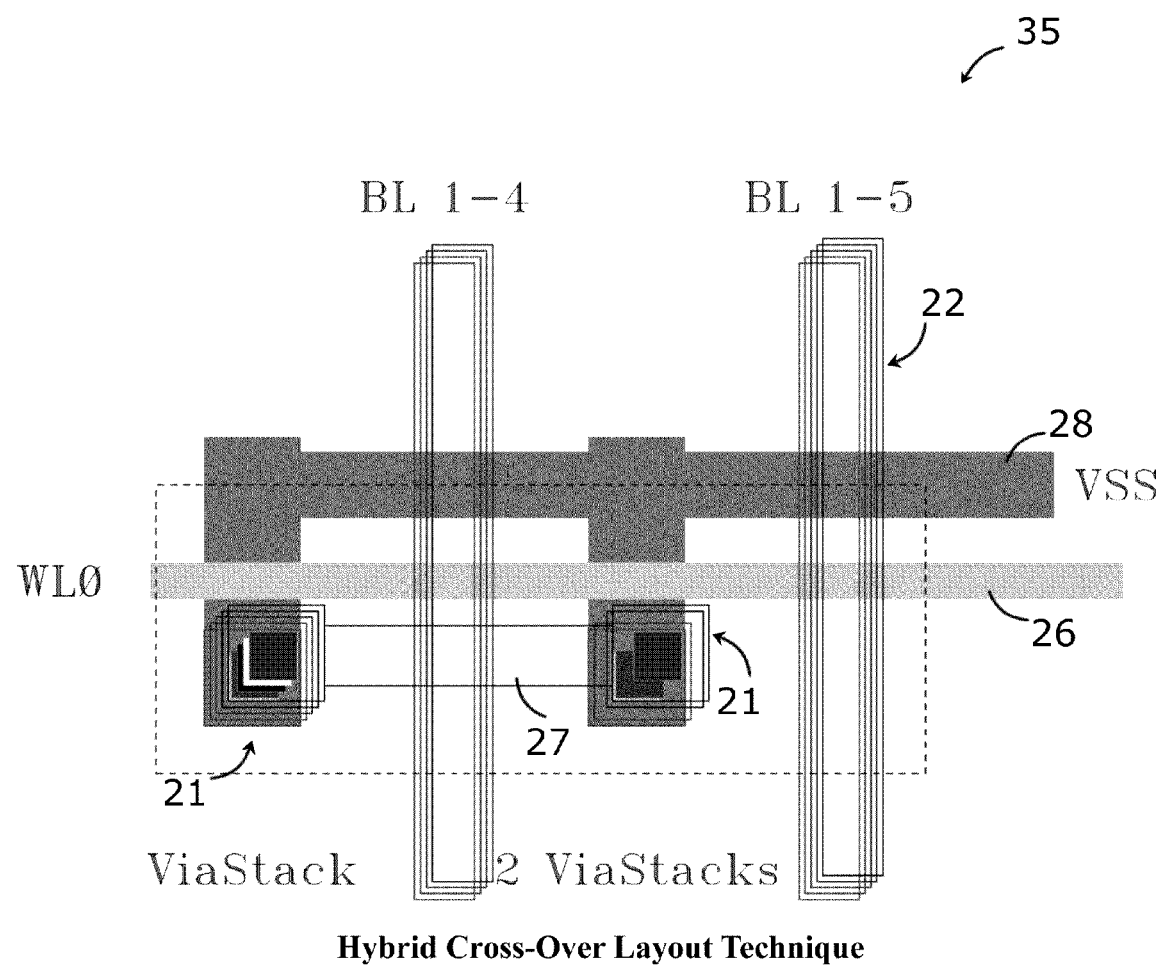
FIG. 6 is a layout design for a memory cell designed using the hybrid crossover technique of the present invention.

FIG. 6 illustrates a layout for a memory cell 35 where the cross-over layout technique of the present invention is applied. In memory device 35, multiple transistors are used together at the cost of one bitline in a column of bitlines. Specifically, as shown in FIG. 6, the top bitline BL5 in the first column of bitlines BL1–4 is removed. This allows a cross-over 27, namely conductor layer metal5 to be used to access the second column of bitlines BL10 to BL15. In this way, both multi-layered cells have access to both columns of bitlines BL1 to BL4 and BL10 to BL15. Accordingly, any two bitlines from either column BL1 to 4 or BL10 to 15 can be connected to the underlying transistors. A double via-stack 21 detnoted as "2 viastacks" in FIG. 6 represents two electrically separate via-stacks 21 which are "stacked" one on top another to provide electrical contacts between the multi-layered cells and the columns of bitlines BL1 to BL4 and BL10 to BL15.

B. Conventional ROM Cells

These layout techniques will now be illustrated in respect of a variety of conventional ROM memory structures. That is, previously designed schematic ROM cells will be illustrated in association with layout architectures that embody the layout techniques of the present invention. Using conventional notation, the repeatable memory cell is surrounded by a dashed box. Each ROM cell is constructed using $\Lambda$, which allows for equal design effort in the creation of each cell. That is, by defining the layout in terms of this common unit of area for each manufacturing process, it is not possible to "fine tune" each layout. In other words, the time it takes to design each cell is limited, since spending more time, does not "improve" the layout. In addition, the time it takes to layout a cell in one process is the same as the time it would take using all other processes.

The conventionally known Manhattan layout process is used for all cells and all cells are compared on a relative basis to the NOR ROM cell. At the end of the chapter the architectures will be compared, both in terms of relative density based on $\Lambda$ and absolute density, after compaction, in a 0.13-µm CMOS process.

NOR ROM Cell

Figure 7A:
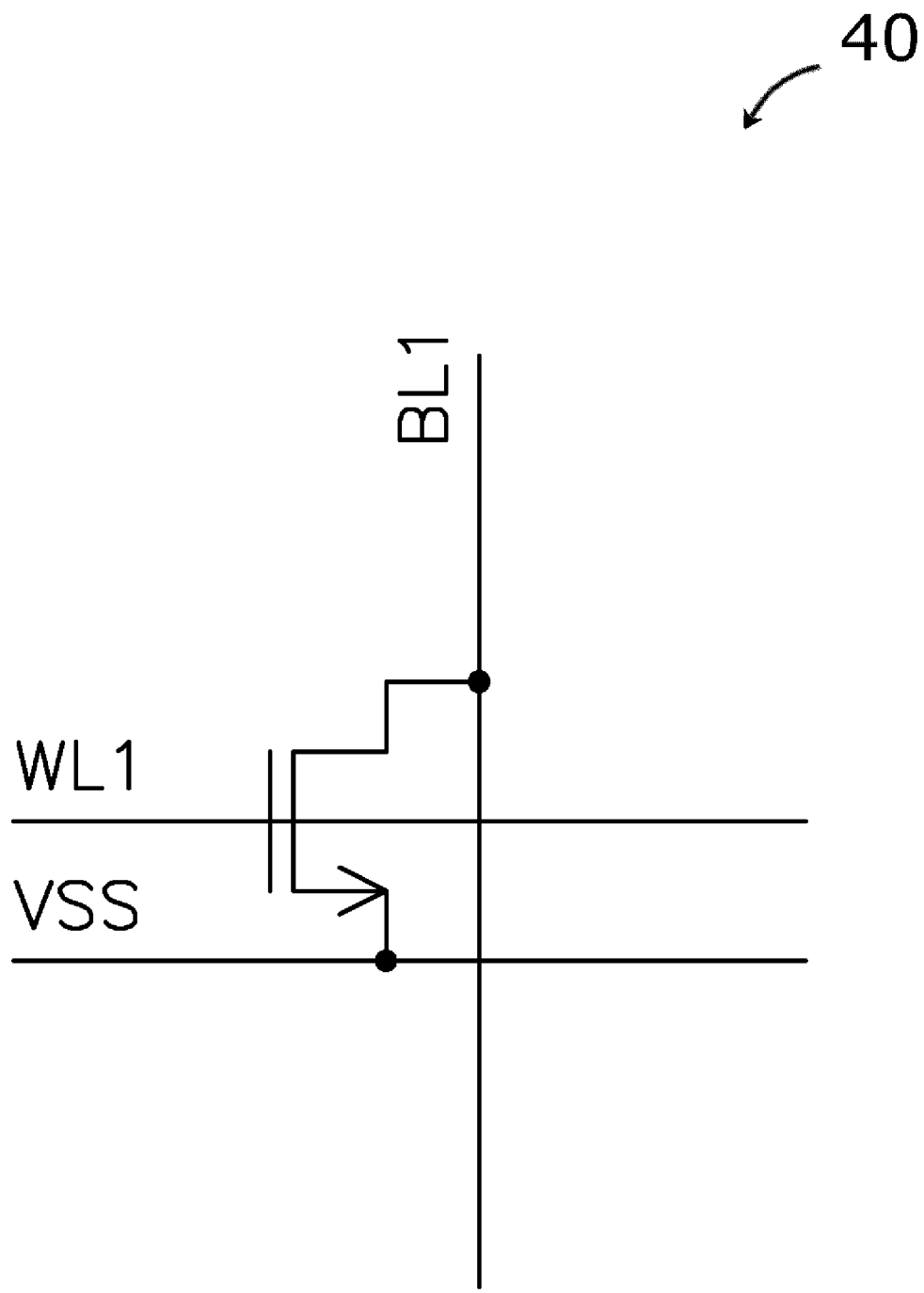
FIG. 7A is a schematic diagram of a conventional NOR ROM memory cell.
Figure 7B:
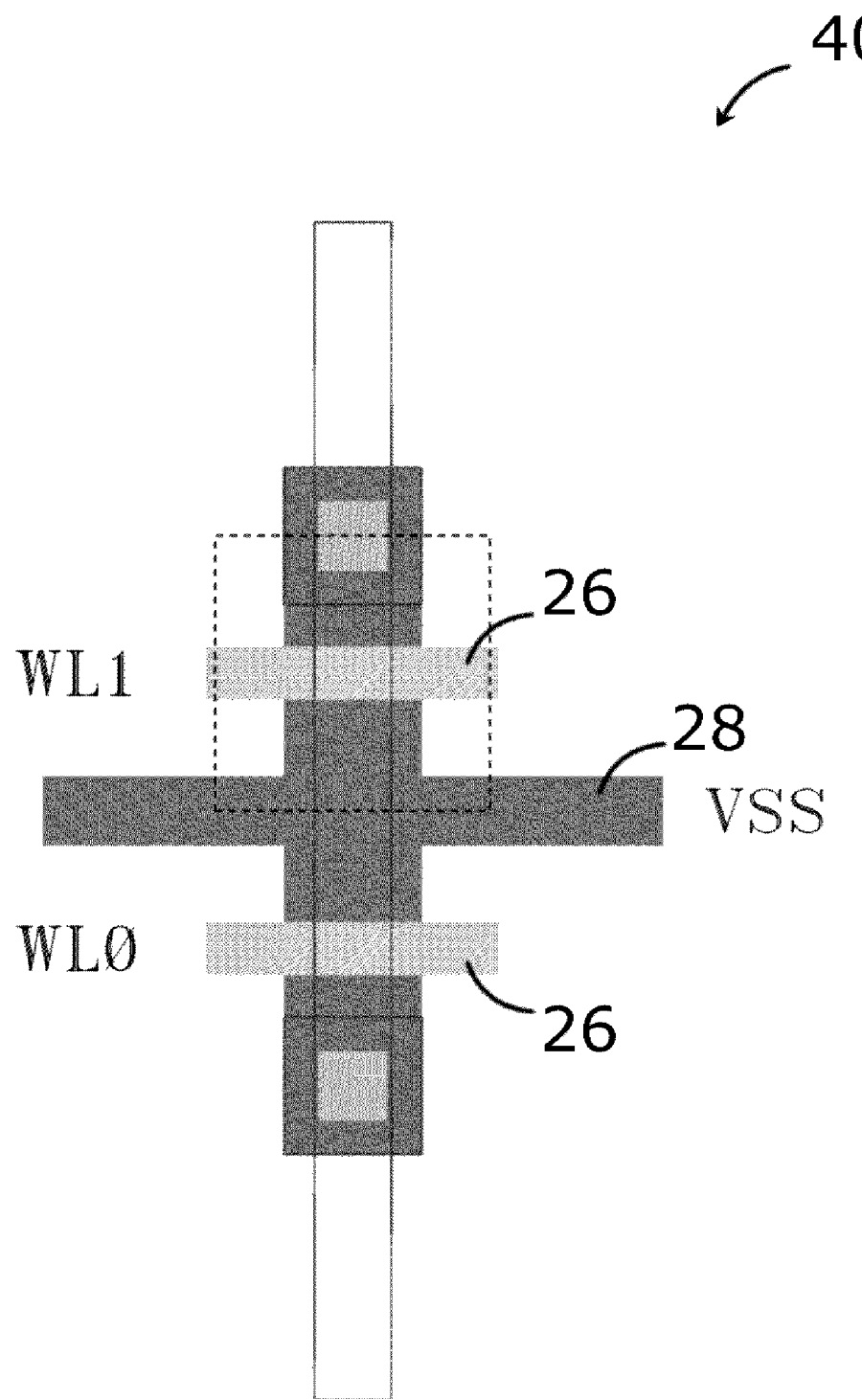
FIG. 7B is a layout design for the memory cell of FIG. 7A.

FIGS. 7A and 7B illustrate a NOR ROM memory cell 40 with a cell density of 1-bit per Λ (FIG. 7B). FIG. 7B illustrates the repeatable boundary for the cell as a dotted box. As shown, the NOR ROM memory device 40 consists of a transistor sharing both source and drain connections. Information is stored by the presence or absence of the transistor. As discussed above, transistors are defined when a diffusion layer 28 crosses a wordline WL (i.e. polysilicon layer 26) as shown. Bitline BL1 is routed in a conductor layer metal1 vertically over the array as shown. Wordlines WL0 and WL1, which run horizontally, are routed in polysilicon 26 and are strapped in conductor layer metal2 (not shown). Grounding for the pull-down NMOS transistors is provided on conductor layer metal1 at predetermined multiples of the ROM cells. A via connects the drain of the transistor to the bitline BL1 (first layer of metal). It should be noted that, the actual density of the ROM array is less than 1-bit per Λ when the wordline contacts and the ground and substrate contacts are taken into account.

NAND ROM Cell

Figure 8A:
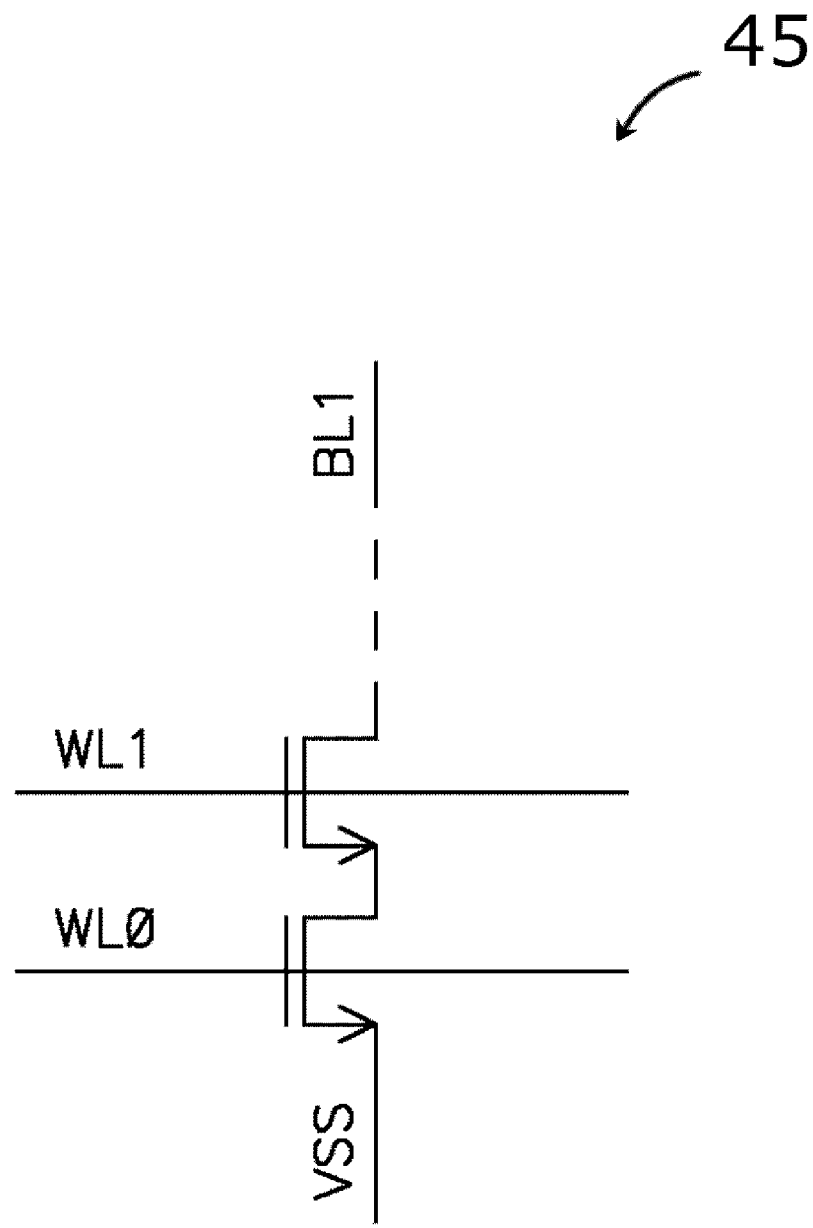
FIG. 8A is a schematic diagram of a conventional NAND ROM memory cell.
Figure 8B:
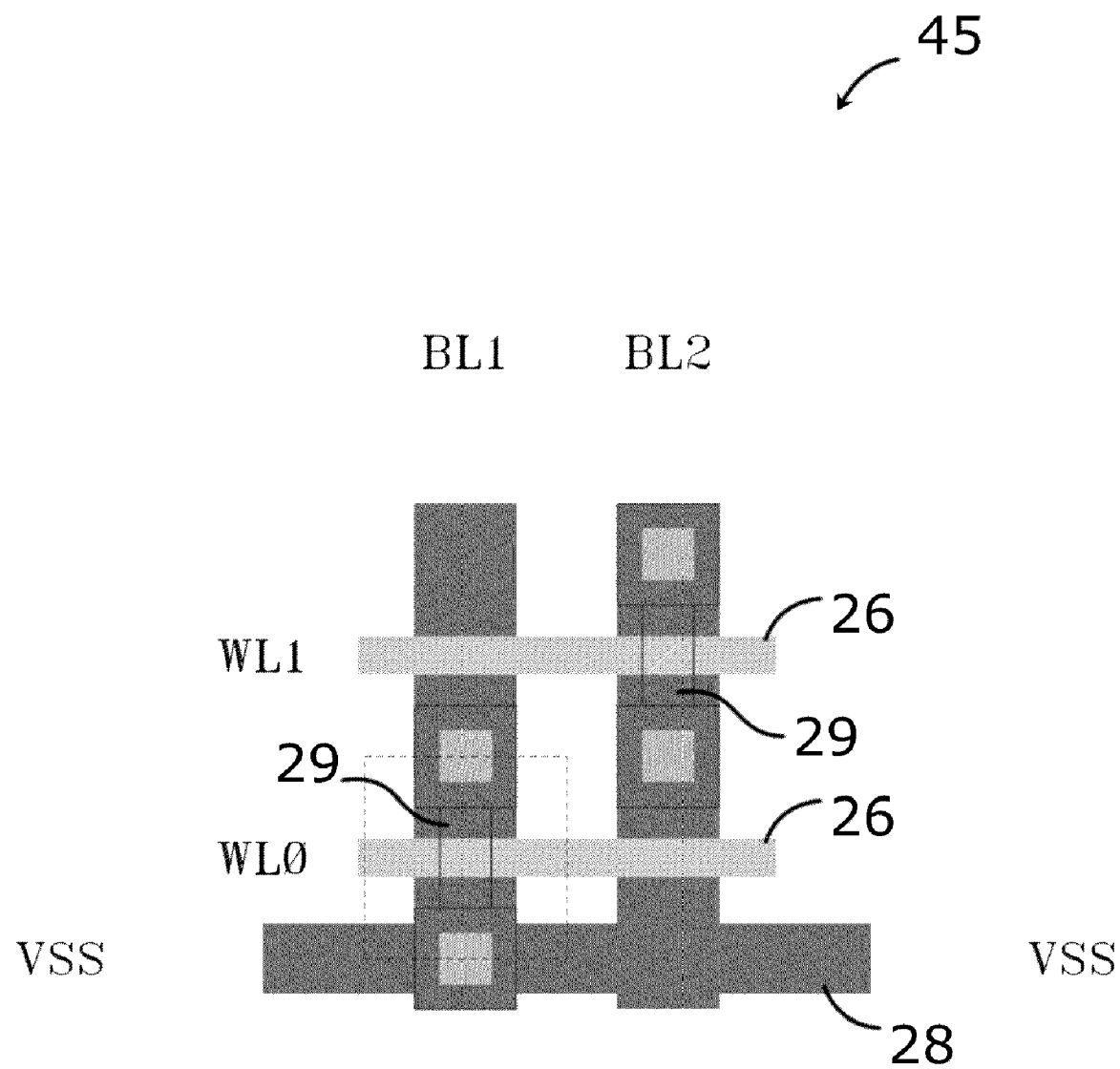
FIG. 8B is a layout design for the memory cell of FIG. 8A.

FIGS. 8A and 8B illustrate a NAND ROM memory cell 45 that is similar to the NOR ROM device 40 discussed in reference to FIGS. 7A and 7B since it has a density of 1-bit per Λ. However, instead of having the cells attach to a bitline BL1 in parallel, the NAND ROM device 45 aligns its cells in series to form a bitline BL1. FIG. 8B shows the surrounding box in dotted outline that represents the repeatable boundary for the memory cell. The value of the cell is determined by the presence or absence of a metal connection between the source and drain, which has the effect of bypassing the transistor. Two conductor layer metal1 "jumpers" 29 connect source and drain for each transistor within the devices, as shown in FIG. 8B. A read occurs, when one of the wordlines WL0 or WL1 goes low, shutting off a transistor in the column. If no bypass exists the bitline BL1 or BL2 will remain high, otherwise the bitline BL1 or BL2 will be pulled low through the series of transistors. For a large number of transistors in series, the read operation can be very slow relative to a similarly-sized NOR ROM device 40.

Multi-Valued ROM Cell

Figure 9A:
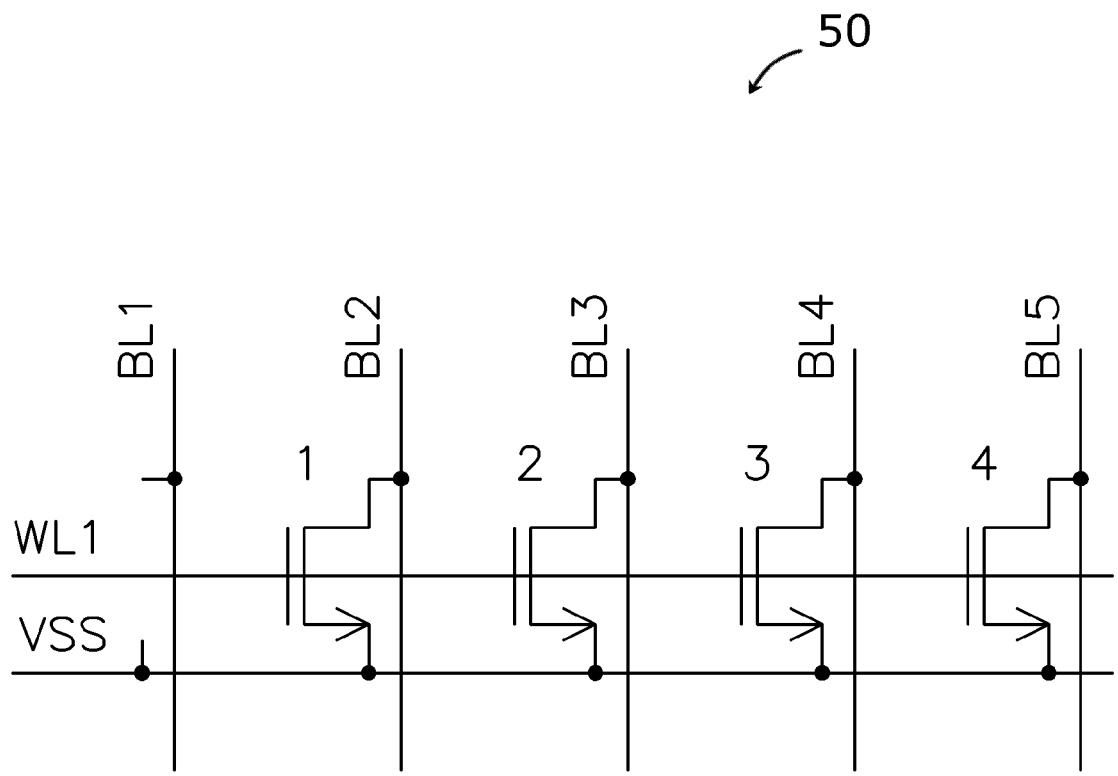
FIG. 9A is a schematic diagram of a conventional multi-valued ROM memory cell.
Figure 9B:
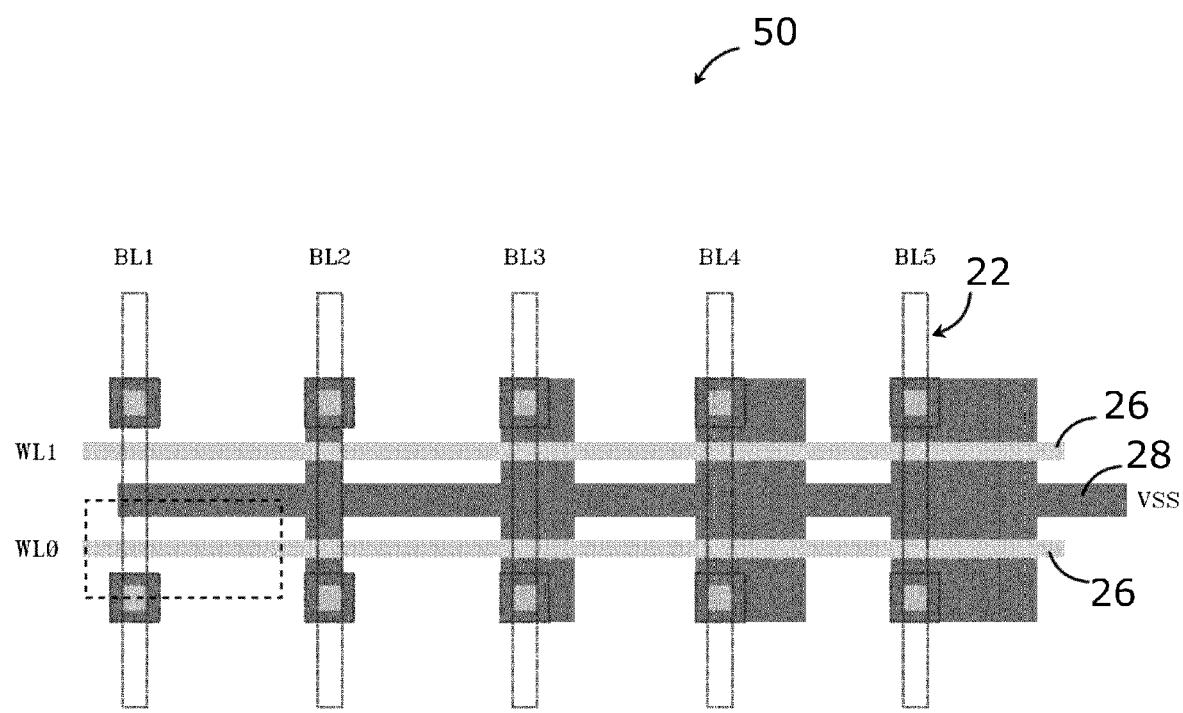
FIG. 9B is a layout design for the memory cell of FIG. 9A.

FIGS. 9A and 9B illustrate a multi-valued ROM memory cell 50 that relies on sensing the effects of different transistor drive strengths. Variations in drive strength can be accomplished by altering the width or length of a transistor as is conventionally known. Specifically, the relative widths of the transistors are represented by the number above the transistors (i.e. 1, 2, 3 or 4). FIG. 9B physically illustrates the different widths associated with the transistors. Accordingly, the transistor can be manufactured in one of five possible states. That is, each of the various sized transistors can be operational (i.e. four states) and the fifth state is where there is no transistor (i.e. an open circuit). As shown, the transistors are sized from the weakest drive strength to the strongest, left to right. It should be noted that the size of the cell (shown in dotted outline) is the same for all the transistor sizes. By fixing the cell size, the cells can be easily arrayed.

The cell density (for FIG. 9B) is given by:

$$\text{BitsPer}\Lambda = \log_2(\text{states})/2\Lambda \qquad (1)$$

Since there are five possible signal states on a bitline, the number of bits stored is log base two of the possible states (i.e. 5). The cell area is two Λ. The density of the cell can be determined by dividing the "bits" by the "area". It should be noted that this device uses electrical differentiation to stored multiple states on a signal line.

Multiple Bitline ROM Cell

Figure 10A:
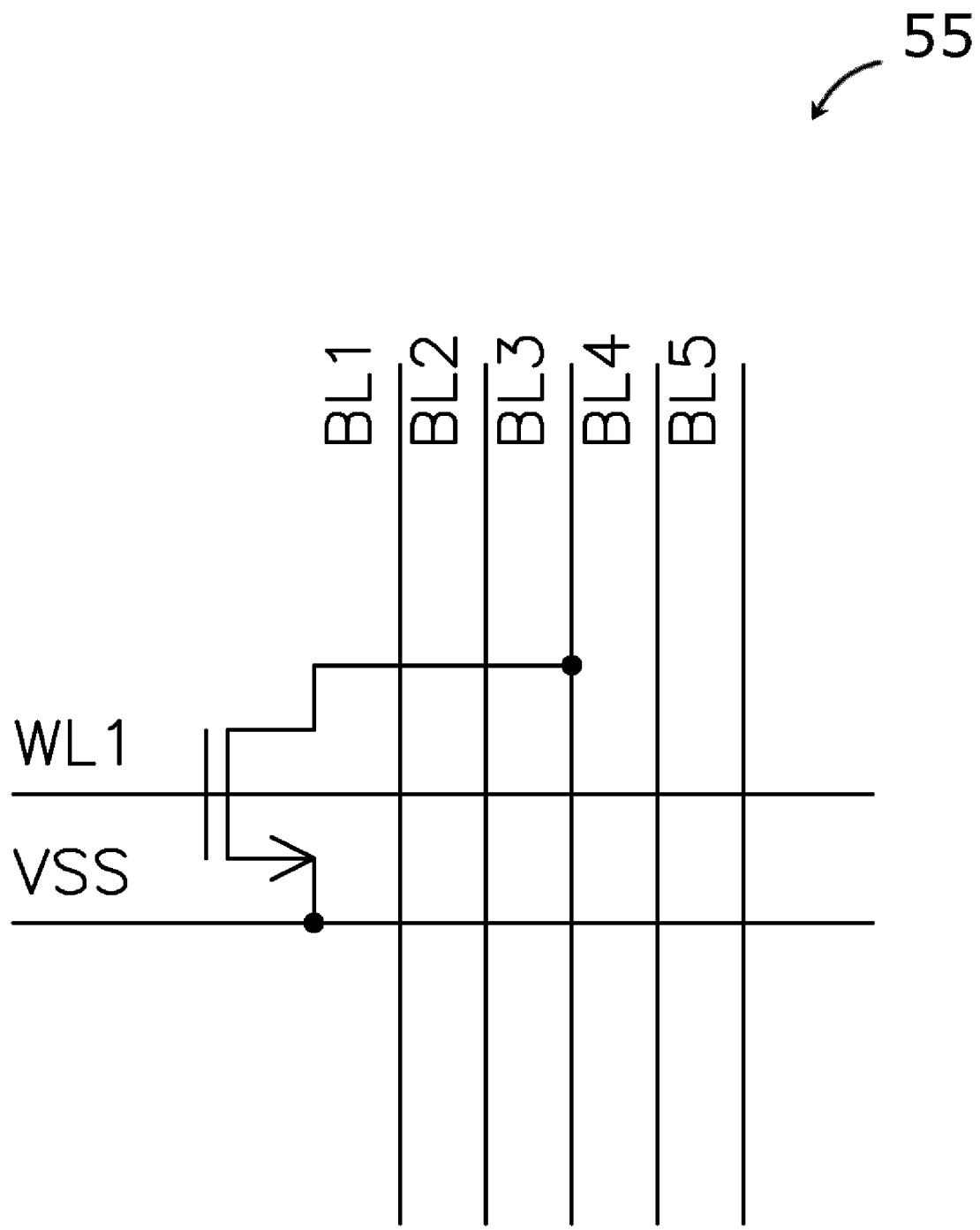
FIG. 10A is a schematic diagram of a conventional multi-bitline ROM memory cell.
Figure 10B:
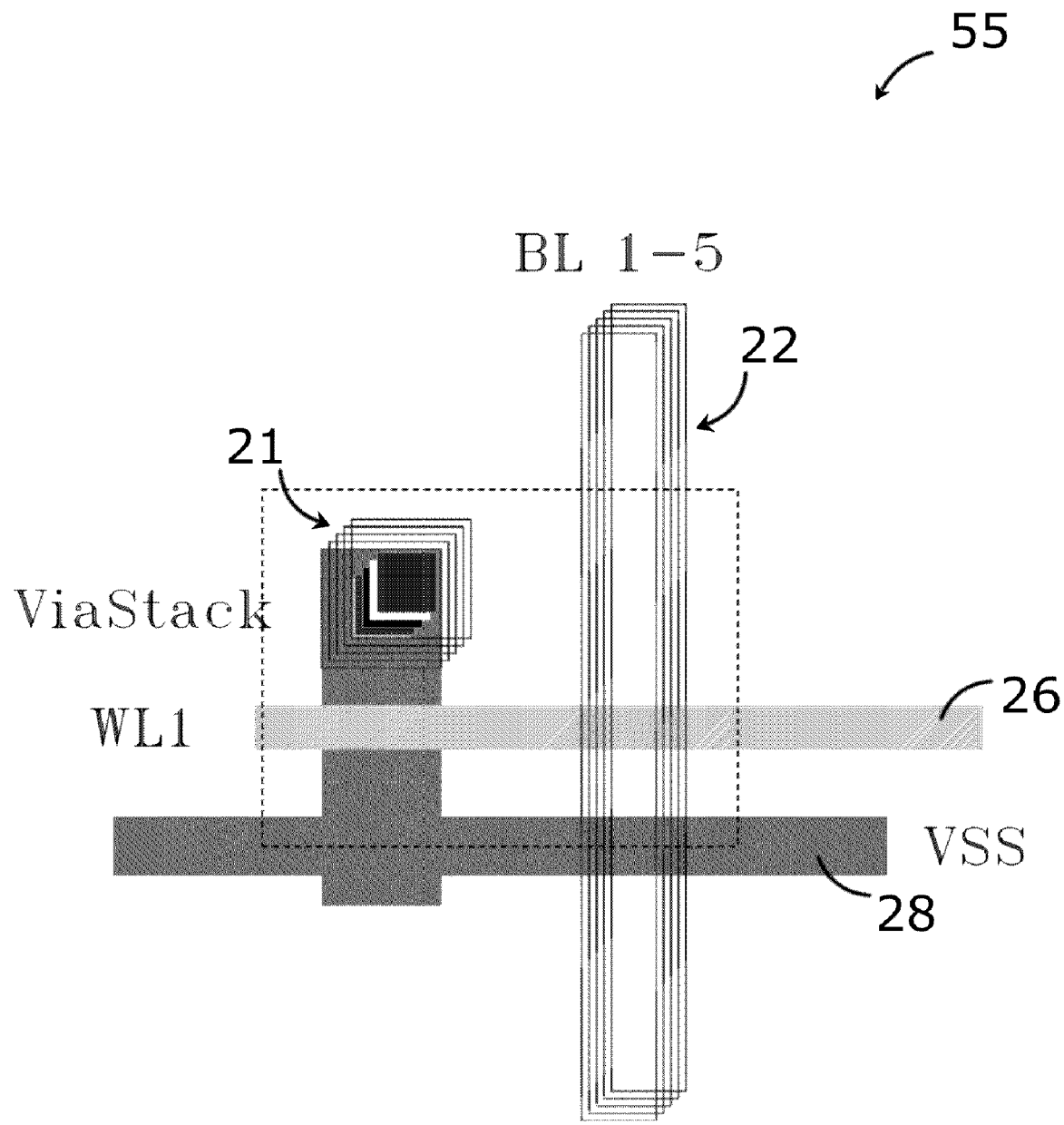
FIG. 10B is a layout design for the memory cell of FIG. 10A designed in accordance with the present invention.

FIGS. 10A and 10B illustrate a multiple-layer and multiple-bitline ROM memory cell 55 uses via-stacks and multiple conductor layer bitlines to allow a cell to connect to one of many bitlines BL1 to BL5 (or none). As manufacturing processes make more layers of metal interconnect available, it is beneficial to incorporate these layers into the design of a ROM memory device. The number of bitlines utilized within device 55 is determined by the number of conductor layers available in the manufacturing process. By sensing which bitline BL1 to BL5, if any, has been driven by the storage cell it is possible to decode the signals on multiple bitlines into multiple bits. The following equation gives the cell density for memory device 55 in terms of bits per Λ:

$$\text{BitsPer}\Lambda = \log_2(n+1)/3\Lambda \qquad (2)$$

where n is the number of metals bitlines available to attach to in the column of bitlines. It should be noted that $$n = m-1 \qquad (3)$$

where m is the number of metals available in the process, since one of the conductor layers is used to strap each wordline W0 and W1. Grounding for the pull-down NMOS transistors is provided on conductor layer metal1 at N intervals of N ROM cells.

It should also be noted that Λ is a process-independent measurement of unit area. The multi-bitline cell shown in FIG. 10B has an area of three Λ (the repeatable bounding box covers an area of six Λ) and there are n bitlines. So the number of possible combinations is the number of bitlines plus one for "no signal". The signals on bitlines can be sensed as one of two states. Thus when the log base two is taken, the result is returned in bits. To determine density we take the "bits" and divide this quantity by the "area". For comparison purposes, the multi-bitline architecture shown in FIG. 10B requires seven layers of metal for the bitlines in order to achieve a density of 1-bit per Λ (NOR ROM cell). As will be discussed below, the techniques of the present invention will be applied to hybrid ROM architectures which result in densities greater than 1-bit per Λ.

Multiple Transistor ROM Cell

Figure 11A:
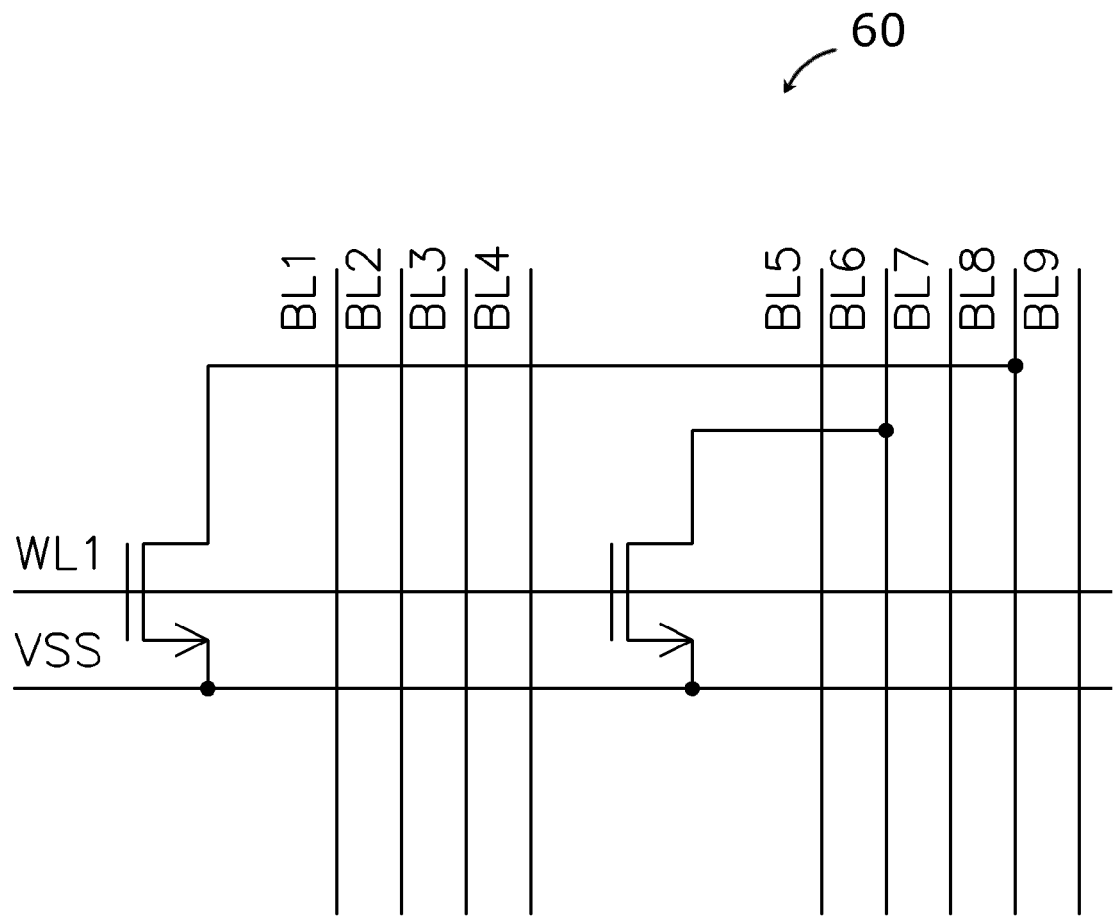
FIG. 11A is a schematic diagram of a conventional multiple transistor ROM memory cell.
Figure 11B:
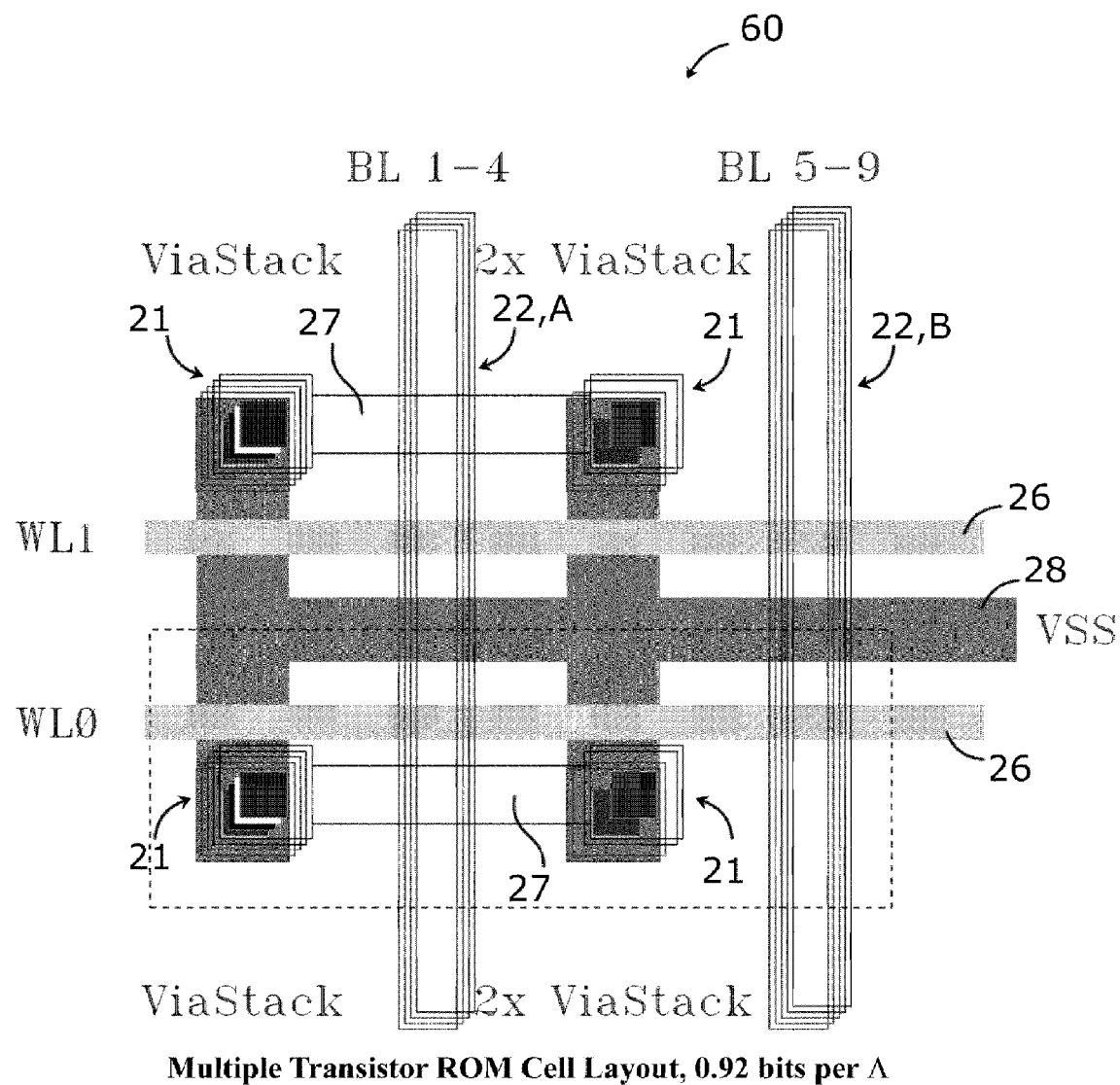
FIG. 11B is a layout design for the memory cell of FIG. 11A designed in accordance with the present invention.

FIGS. 11A and 11B illustrate a ROM memory cell 60 that uses multiple transistors (shown as A and B in FIG. 11B) in combination to store information. FIG. 11A illustrates a schematic for the multiple-transistor ROM cell and FIG. 11B shows the layout. In the case of device 60, both transistors A and B have access to the multiple bitline columns BL1 to BL4 and BL5 to BL9 using the crossover technique discussed above. In FIG. 11B, transistor A connects to the set of bitlines BL5 to BL9 through the two metal crossovers 27 as shown. Alternatively, transistor B could connect to the bitlines BL1 to BL4 through analogous metal crossovers. Basically, through both transistors, any combination of the bitlines BL1 to BL9 can be chosen. By using the cross-over technique described above, increased density is achieved.

Specifically, if n is the number of bitlines available, then the following equation gives the cell density for two transistors:

$$\text{BitsPer}\Lambda = \log_2(_{2*n-1}C_2 + (2*n-1) + 1)/6\Lambda \qquad (4)$$

The multiple-transistor cell of FIGS. 11A and 11B has an area of six Λ. There are 2*n−1 bitlines. We can choose a combination of two, one or none of the bitlines. Because the signals on each bitlines can be sensed as one of two states, the log base two of the total possible combinations returns a result in bits. Again, to determine density we take the "bits" and divide by the "area".

Simple Decode

An alternative technique uses a simple decoding scheme disclosed in U.S. Pat. No. 6,002,607 to Dvir where x transistors can represent 2*x bits. This scheme requires 2*x+1 bitlines, where all bitlines, but one, represent a bit. Using the simple decoding scheme, the following equation gives the cell density in terms of bits per Λ:

$$\text{BitsPer}\Lambda = (2*x)/(1.5*x+3)\Lambda \quad (5)$$

Provided that, $$n = 2*x+1 \quad (6)$$

where x is the number of transistor in the cell and n is the number of conductor layer bitlines available to attach to in the column of bitlines. It should be noted that due to the decoding scheme, the amount of information stored in the memory cell directly depends on the number of transistors. As a result, this design asymptotically approaches a maximum of 1.33 bits per Λ. This is provided that enough conductor layers are available to implement the structure using the multi-layer technique.

C. New ROM Cells

In this section new ROM architectures are discussed. Table 3.1 summarizes the following sections, outlining the techniques and cells used to create the hybrid cells. For comparison purposes, the measure bits per Λ is also listed.

12A). Connecting the gate to multiple wordlines would result in a short between those wordlines for all the cells in a row.

Each ROM cell 65 can connect to one of five wordlines WL1 to WL5 running horizontally over the row of cells. Proper operation requires that each of the wordlines WL1 to WL5, in-tern, goes high. This precipitates the knowledge of which wordline the cell is attached to (or the absence of a transistor).

The cell density is given by:

$$\text{BitsPer}\Lambda = \log_2(n+1)/4\Lambda \quad (7)$$

where n is the number of wordlines in the row of wordlines. The area of the cell is four Λ. Log base two of the possible connections returns the number of bits that can be stored in the cell. Density is given by dividing the "bits" by the "area".

Vertical Wordline ROM Cell

Figure 13A:
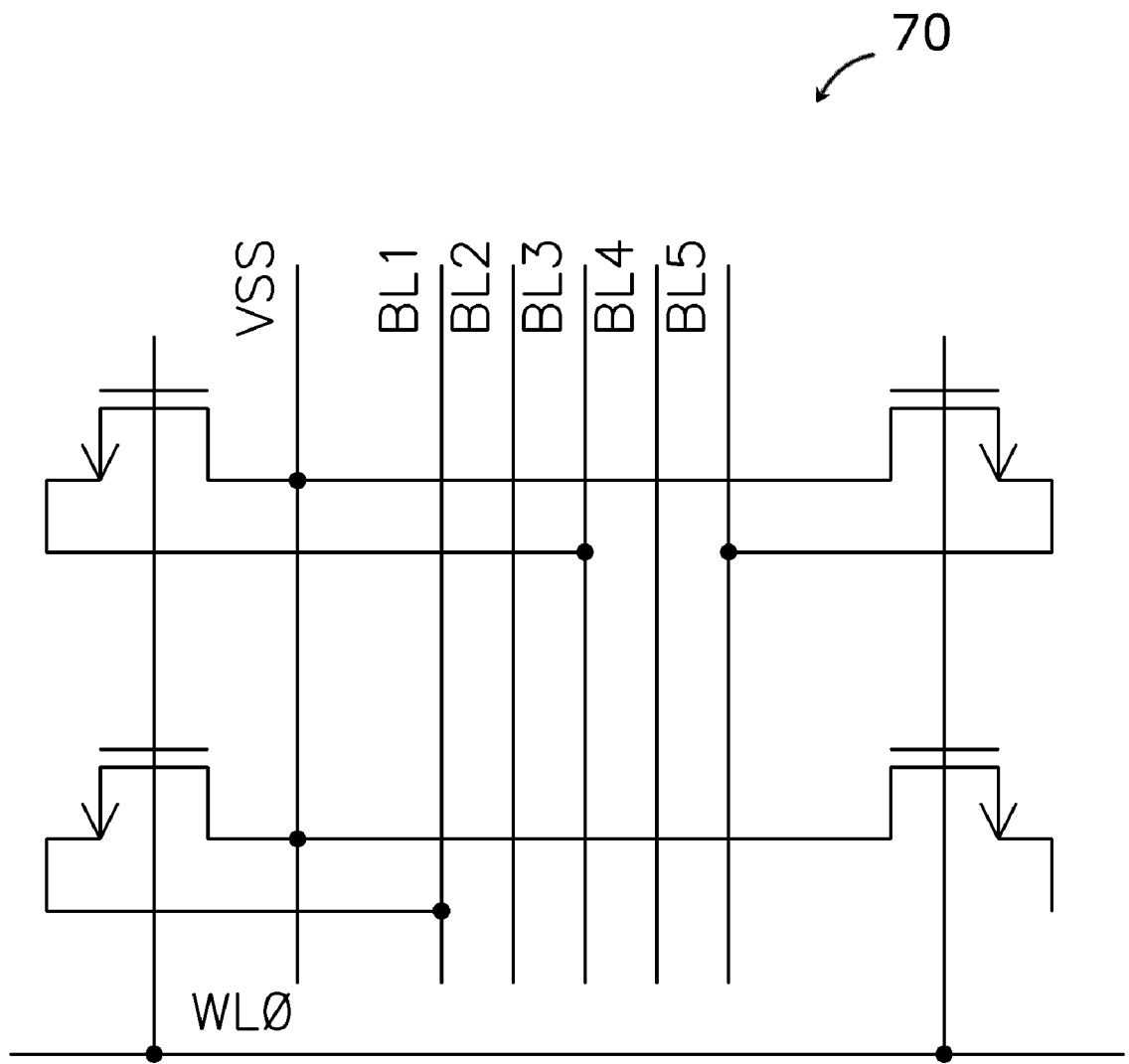
FIG. 13A is a schematic diagram of a vertical wordline ROM memory cell designed in accordance with the present invention.
Figure 13B:
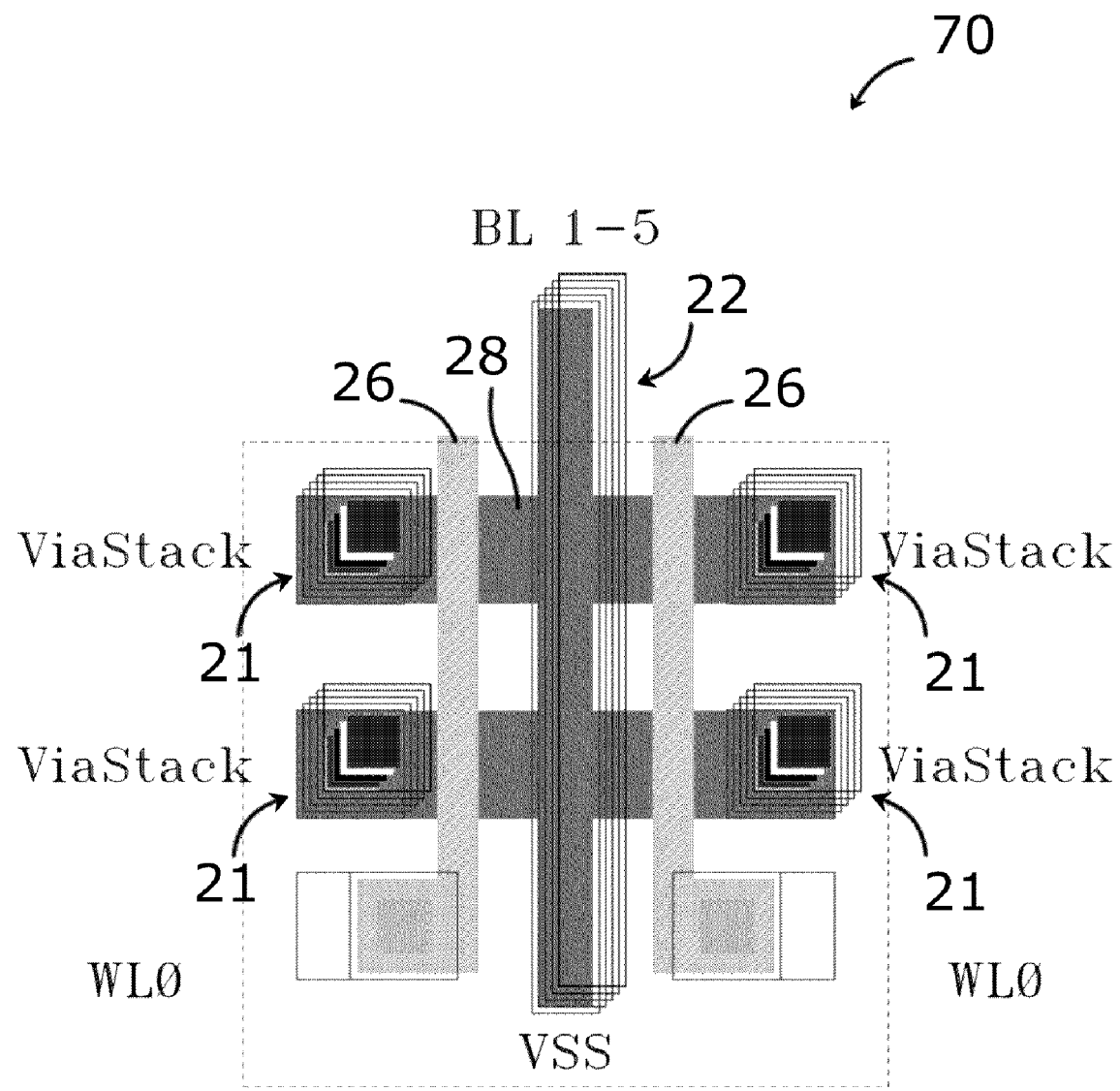
FIG. 13B is a layout design for the memory cell of FIG. 13A designed in accordance with the present invention.

FIGS. 13A and 13B illustrates a vertical wordline ROM memory cell 70 that uses short vertical wordlines WL0 that jut-out from the typical wordline. In a typical ROM, the wordlines WLs run horizontally over the row of memory cells. The primary advantage of using short vertical wordlines WL0 is that they can control two or more base cells in the vertical direction.

The equation for maximum cell density, in terms of bits per Λ is given by:

$$\text{BitsPer}\Lambda = \log_2(\text{Sum}(i=0 \text{ to } x \text{ of } nCi))/(1.5*x+3)\Lambda \quad (8)$$

TABLE 3.1

The make-up of each ROM cell. Bits per Λ is calculated for a six conductor layer 0.13-μm CMOS process.

| Name | Bits per Λ | Multi Layer | Short Stack | Cross Over | NOR | NAND | Multi BL | Multi Value | Multi Trans | Multi WL | Vert WL |
|---|---|---|---|---|---|---|---|---|---|---|---|
| NOR | 1.00 | | | | X | | | | | | |
| NAND | 1.00 | | | | | X | | | | | |
| Multi-Bitline (ML) | 0.86 | X | | | | | X | | | | |
| Multi-Transistor (MT) | 0.92 | X | | | X | | X | | X | | |
| Multi-Value (MV) | 1.16 | | | | X | | | X | | | |
| Multi-Wordline (MW) | 0.65 | X | | | X | | | | | X | |
| Vert WL (x = 4) | 0.55 | X | | | | | X | | | | X |
| Hybrid 3-NOR to 1-ML | 1.33 | X | | | X | | X | | | | |
| Hybrid 4-NOR to 2-MT | 1.26 | X | X | | X | | X | | X | | |
| Hybrid 1-NOR to 2-MT | 1.11 | X | X | | X | | X | | X | | |
| Hybrid 1-NOR to 3-MT | 1.07 | X | | | X | | X | | X | | |
| Hybrid 2-NOR to 2-MT | 1.14 | X | | X | X | | X | | X | | |
| Hybrid 2-MV to 1-ML | 1.74 | X | | | X | | X | X | | | |
| Hybrid 1-MV to 1-ML | 1.55 | X | | | X | | X | X | | | |
| Hybrid 1-NAND to 2-MW | 0.75 | X | | | | X | X | | | X | |

It should be noted that the bits per Λ is dependent on number of conductor layers in the process. As such, the relative density of the cells can be expected to change for various manufacturing processes.

Multiple Wordline ROM Cell

Figure 12A:
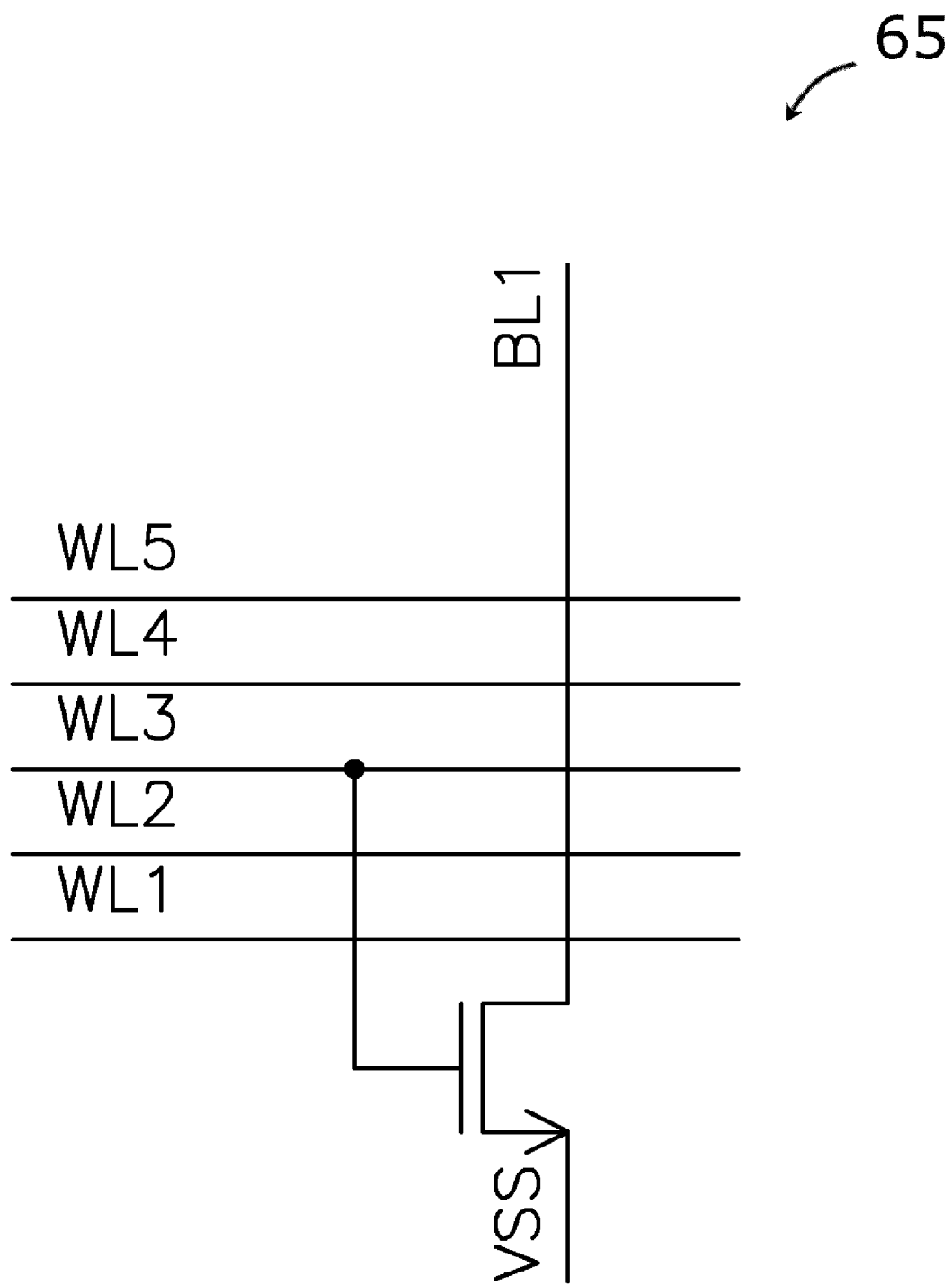
FIG. 12A is a schematic diagram of a multiple worldline ROM memory cell.
Figure 12B:
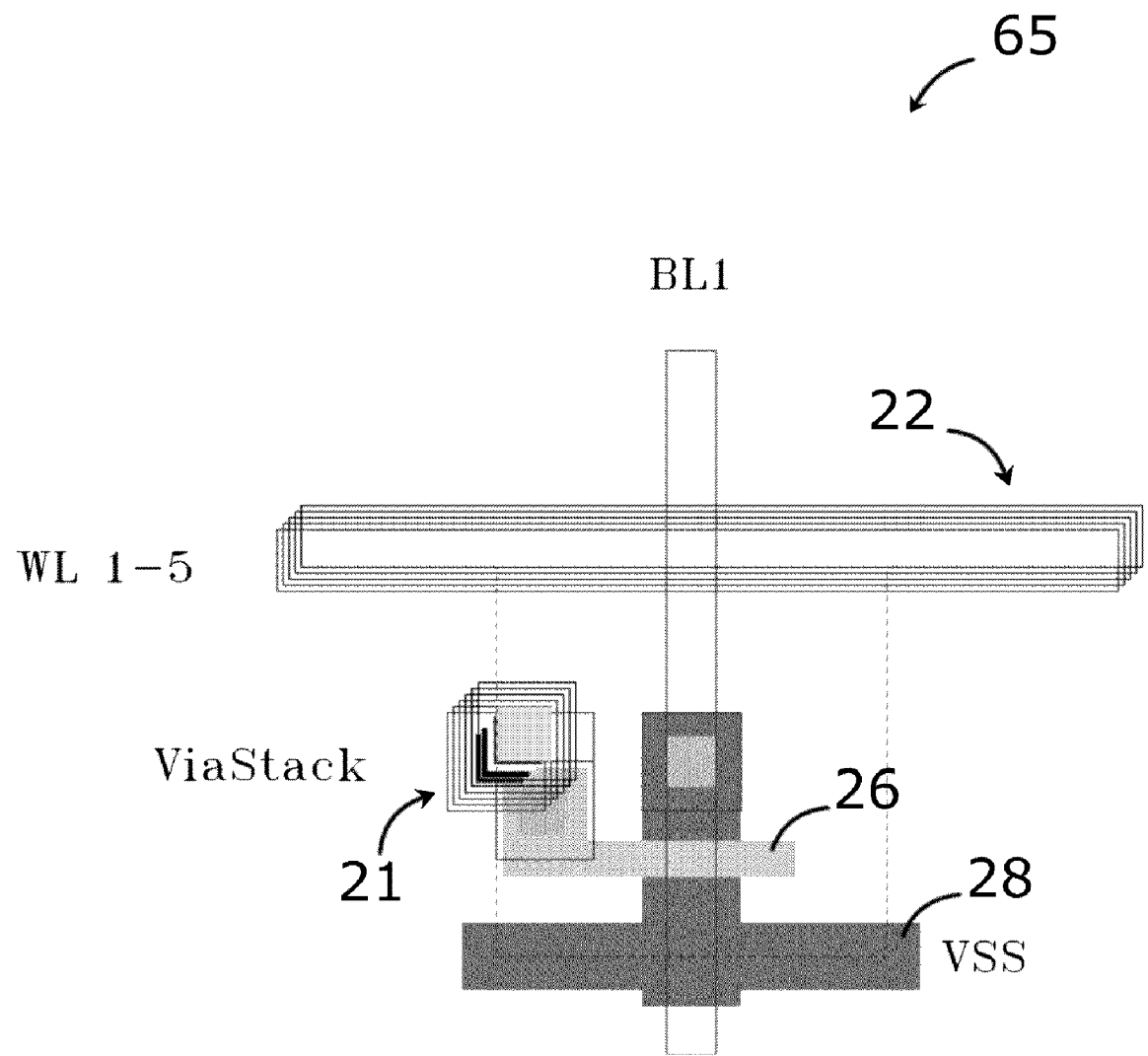
FIG. 12B is a layout design for the memory cell of FIG. 12A designed in accordance with the present invention.

FIGS. 12A and 12B illustrate a multiple wordline ROM cell 65 that uses multiple wordlines WL1 to WL5 to facilitate information storage. Specifically, each wordline in the row of wordlines WL1 to WL5 is individually accessed to determine which one controls the gate of the transistor. By positioning the wordline connection the information stored in the memory cell can be programmed. As shown, the gate of the transistor connects to one of the wordlines WL3 (FIG.

where n is the number of metals bitlines available to attach to in the column of bitlines and x is the number of transistors in the cell. Note that, $$n = m-1 \quad (9)$$

where m is the number of metals available in the process. One of the conductor layers is used to strap the wordline. The number of states that can be represented by the cell is the combination of bitlines BLs and transistors (i.e. n-bitlines choose x-transistors). Log base two of the number of states returns the number of bits stored in the cell. The area of the cell grows in accordance to the number of transistors, x. It should be noted that, x is assumed to be an even number. An odd number would leave a hole in the cell.

D. New Hybrid ROM Cells

By combining two or more cell types it is possible to achieve cell densities beyond that of the individual cell types. The resulting hybrid cells also make use of the multi-layer, short via-stack and cross-over techniques where possible, to further increase density. In a manufacturing process where m metals are available, n metals are used for the multi-layered column bitlines. Such that, $$n=m-2 \qquad (10)$$

The assumption is that one metal will be used for the NOR or multi-value ROM cell bitline while another will be used for wordline strapping.

Hybrid 3 NOR to 1 Multi-Layer ROM Cell

Figure 14A:
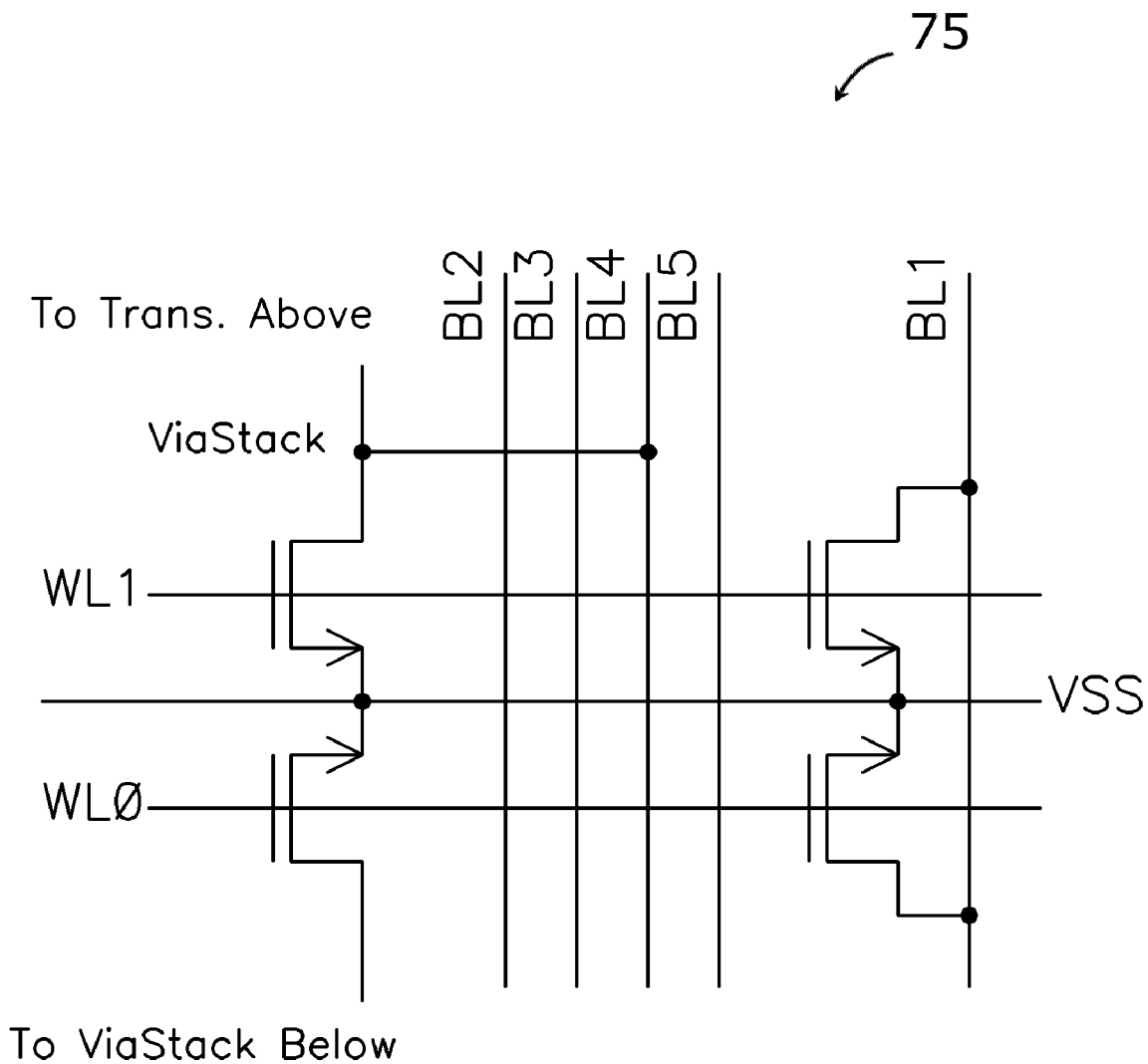
FIG. 14A is a schematic diagram of a hybrid 3 NOR to 1 multi-layer ROM memory cell designed in accordance with the present invention.
Figure 14B:
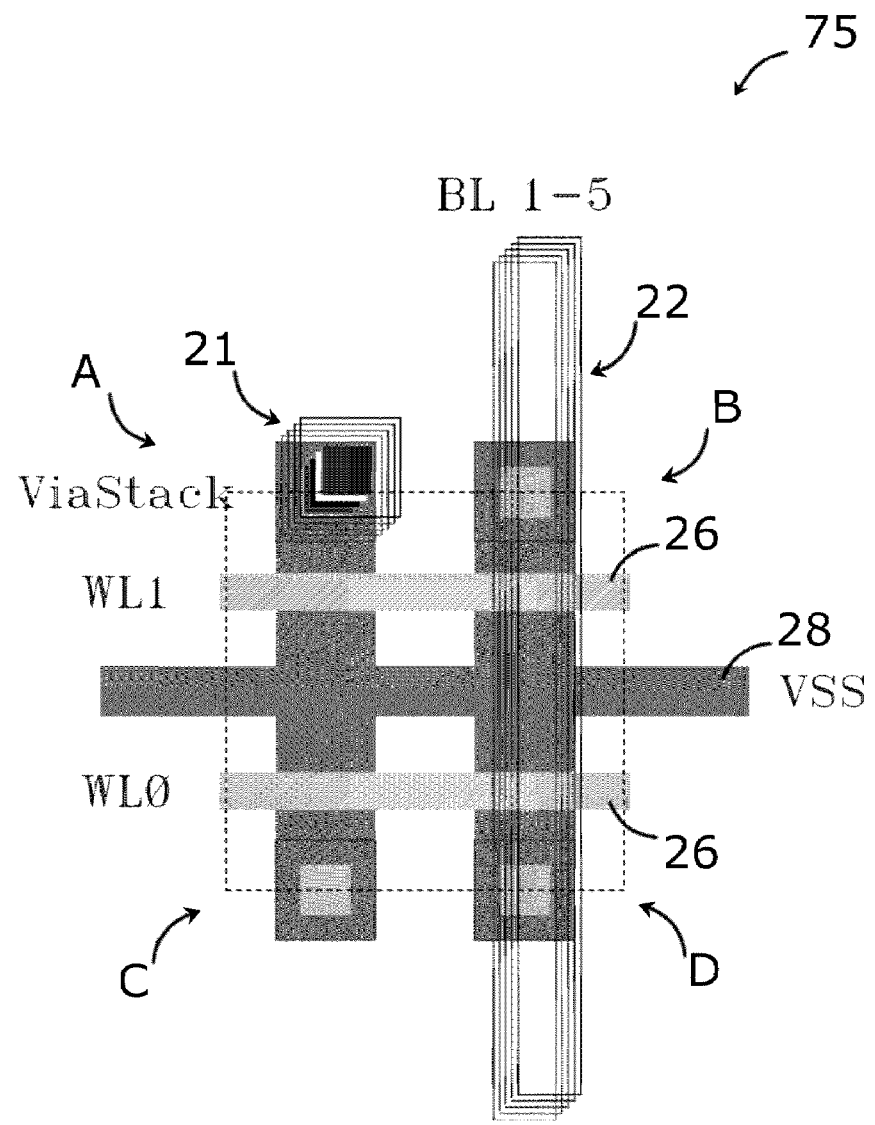
FIG. 14B is a layout design for the memory cell of FIG. 14A designed in accordance with the present invention.

FIGS. 14A and 14B illustrate a hybrid ROM memory cell 75 that combines three NOR cells and one multi-layered ROM cell. FIG. 14B illustrates the layout for a 1.33-bit per Λ ROM cell, built using a six conductor layer process. This cell 75 incorporates the multi-layer and multi-bitline layout features discussed above. Specifically, three 1-bit NOR cells are mixed with one multi-bitline cell, over a four Λ area. The multi-bitline cell can connect to one of four bitlines 22 (in this case) or have its transistor removed; thus providing five unique possibilities (or 2.3 bits). The NOR cells, under the column of multiple bitlines, attach to the first bitline (metal1 layer) and represent a zero or one by the presence or absence of the transistor. The NOR cell that shares the via-stack 21 of the multi-bitline cell represents a "zero" by the presence of the connection to one of the multiple bitlines (which one does not matter), and represents a "one" by the absence of the transistor.

The two transistors B and D shown on the right side of FIG. 14B connect directly to a metal1 bitline (not shown) within bitline stack 22. These transistors B and D store 1-bit of information, depending on the presence or absence of the transistor (both transistors are present in this case). The multi-bitline cells are located on even wordlines WL0, WL2, and Wl4, and are attached to via-stack 21. The connection to one of n-bitlines or the absence of the transistor selects one of n+1 unique conditions. The 1-bit cells on odd wordlines that share the drain contact with the multi-bitline cell represent their data through the presence or absence of the transistor. They do not affect which of the bitlines the multi-bitline cell will connect to. Instead, during the sensing of a row on an odd wordline, the n-bitlines are "AND'ed" together. In other words, any one of the bitlines can be pulled low to indicate a value of "zero" stored in the 1-bit NOR cell.

The following equation gives the cell density of memory cell 75 in terms of bits per Λ:

$$\text{BitsPer}\Lambda=(\log_2(n+1)+3)/4\Lambda \qquad (11)$$

where n is the number of metals bitlines available to attach to in the column of bitlines. The "three bits" comes from the three base NOR cells. The "log base two" bits are generated by the possible connections to the multiple bitlines from the fourth multi-bitline cell. The total area for the cell is four Λ. Thus density is given by the sum of the "three bits" plus the "log base two bits", divided by the area.

Within multi-bitline cells, the use of multiple bitlines reduces the drain capacitance on the bitlines as the bitlines, on average, connect to one third the number of cells they would have otherwise connected to. However, it should be noted that stacking the bitlines, over a column of cells, increases the capacitance between bitlines as will be further discussed.

Hybrid 1 NOR to 2 Multi-Transistor ROM Cell

Figure 15A:
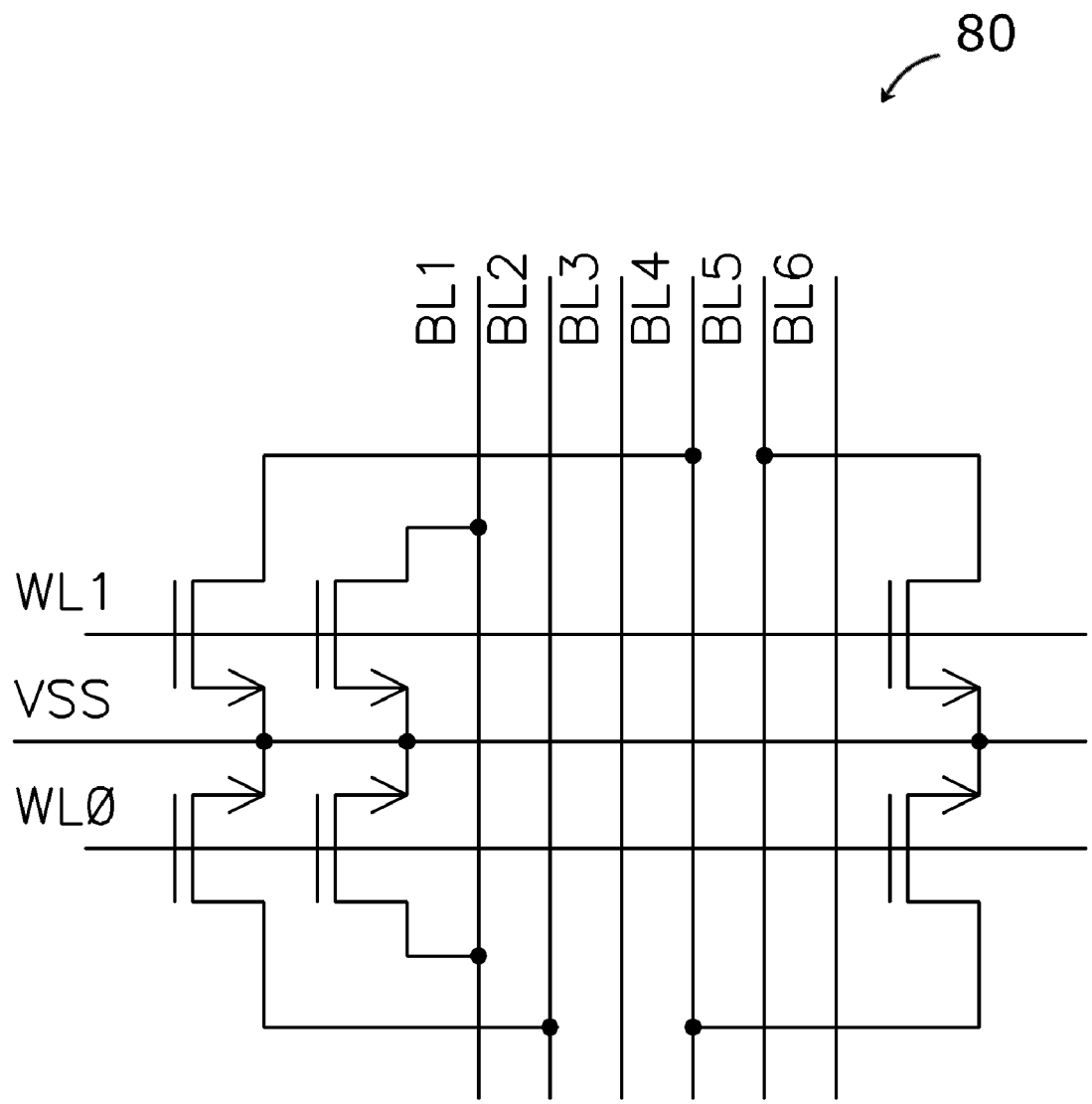
FIG. 15A is a schematic diagram of a hybrid 1 NOR to 2 multi-transistor ROM memory cell designed in accordance with the present invention.
Figure 15B:
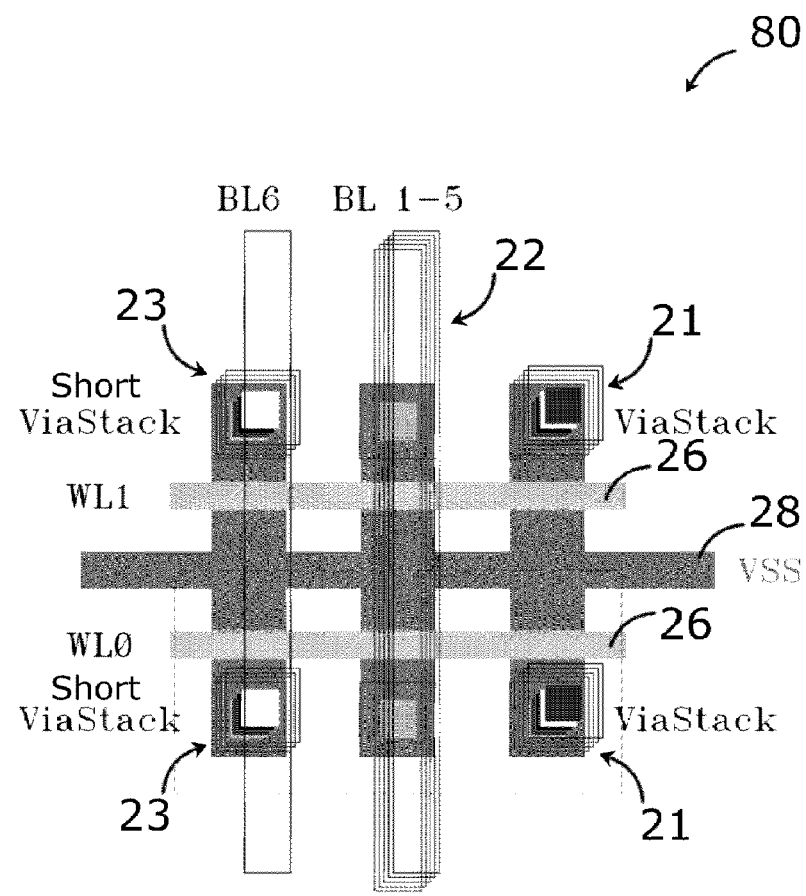
FIG. 15B is a layout design for the memory cell of FIG. 15A designed in accordance with the present invention.

FIGS. 15A and 15B illustrate a hybrid ROM memory cell 80 that uses a combination of one NOR and two multi-layered cells. The pair of multi-layered cells (identified by the via-stack on the drain of the transistors) work in conjunction to store multiple bits. The multi-layered cells are provided on either side of the NOR device which is located under the column of bitlines BL1 to BL5 (i.e. conductor layers 22) and connects to the metal1 bitline BL1. In this case, multiple bitlines BL2 to BL6 are used to connect the multi-layered cells to two of the n-bitlines (n=5 in this case). The value stored in these cells is determined by the selective pulling low of the bitlines BL2 to BL6 and is generated as follows: no-bitline is pulled low (absence of both transistors or bitline connections), one bitline is pulled low (absence of one of the transistors or one bitline connection) or two of n-bitlines are pulled low. It should also be noted that a short via-stack 23 has been utilized to make room for an additional bitline BL6.

It should be noted that the drain contacts are not shared but rather have a via-stack 21 for each of the multi-layered transistors. The use of a multi-transistor cell prohibits the sharing of the drain contacts with a NOR cell (in contrast to the hybrid 3 NOR to 1 multi-bitline cell 75 of FIGS. 14A and 14B where this is the case), because the ability to connect to any two of the n-bitlines makes it impossible to tell which "shared" NOR cell the information is coming from.

The resulting density, in bits per Λ, is given by:

$$\text{BitsPer}\Lambda=(\log_2({}_nC_2+n+1)+1)/4.5\Lambda \qquad (12)$$

where n is the number of bitlines available to attach to in the column of bitlines (in this case, five). The "plus one bit" comes from the NOR cell. The other two NOR cells (from the multi-transistor ROM cell) can connect to two (n-bitlines choose two possibilities), one (n possibilities) or no (one possibility) bitlines. The log base two of these possible connections returns the bits stored within the multi-transistor cell. Thus density is the sum of the bits stored in the NOR cell and multi-transistor cell, divided by the cell area of four and a half Λ. The result in this case is 1.11-bits per Λ.

Hybrid 1 NOR to 3 Multi-Transistor ROM Cell

Figure 16A:
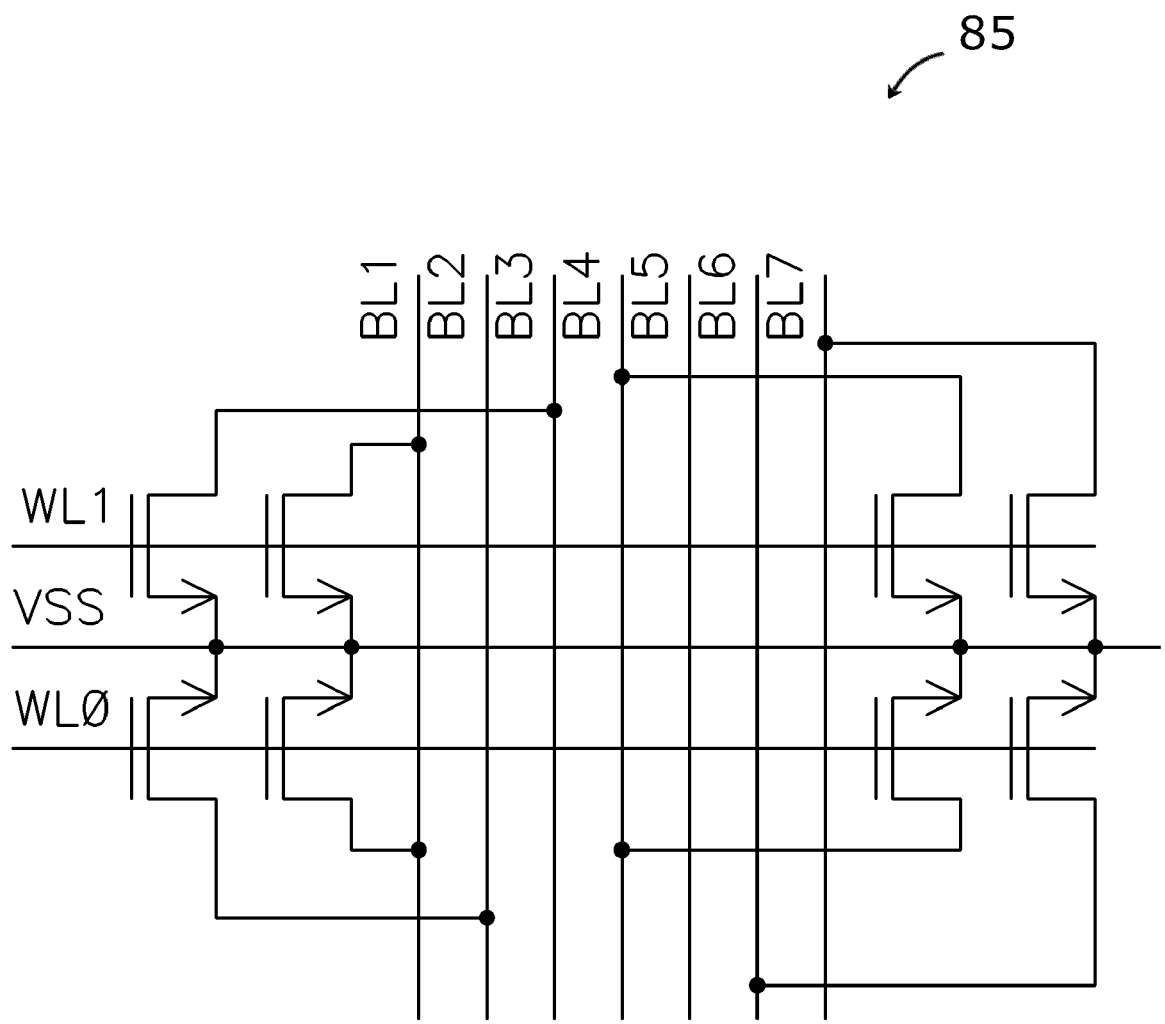
FIG. 16A is a schematic diagram of a hybrid 1 NOR to 3 multi-transistor ROM memory cell designed in accordance with the present invention.
Figure 16B:
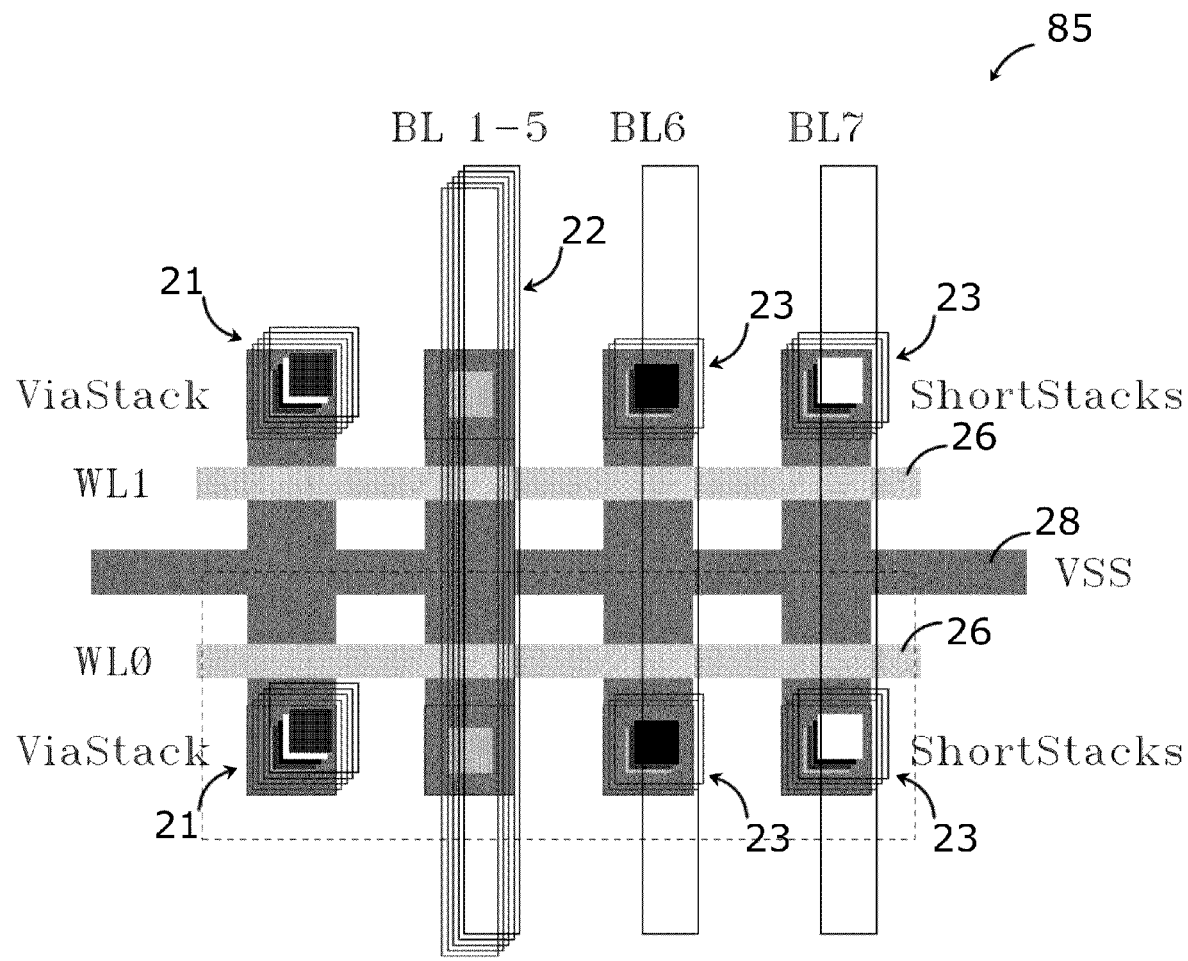
FIG. 16B is a layout design for the memory cell of FIG. 16A designed in accordance with the present invention.

FIGS. 16A and 16B illustrate a hybrid memory cell 85 that is an extension to the multi-transistor design, consisting of a multi-transistor cell and NOR cell. The multi-transistor cell consists of three multi-layered cells. In addition, two short via-stacks 23 are used to increase the number of bitlines available to hybrid memory cell 85. Specifically, two short via-stacks 23 are used to allow two extra bitlines BL6 and BL7 to run over top of the cell. The via-stack under BL6 (metal5) goes up to metal3 and the via-stack under BL7 (metal5) goes up to metal4 (in this case the normal height of a via-stack is up to metal5).

The density, in bits per Λ, is given by:

$$\text{BitsPer}\Lambda=(\log_2({}_{n+2}C_3+{}_{n+2}C_2+(n+2)+1)+5)/8\Lambda \qquad (13)$$

where n is the number of metal bitlines available to attach to in the column of bitlines. There are eight NOR cells that make up this hybrid cell. Five of which are basic NOR cells, which contribute five bits to the density equation. That leaves three NOR cells that can choose from n+2 bitlines. The possible combinations consist of n+2 choose three, n+2 choose two, n+2 choose one (equates to n+2), or none (which is one possibility). The log base two of the combinations return the number of bits. To find the density, the "bits" are added together, and then divided by the cell area of eight Λ.

Hybrid 2 NOR to 2 Multi-Transistor ROM Cell

Figure 17A:
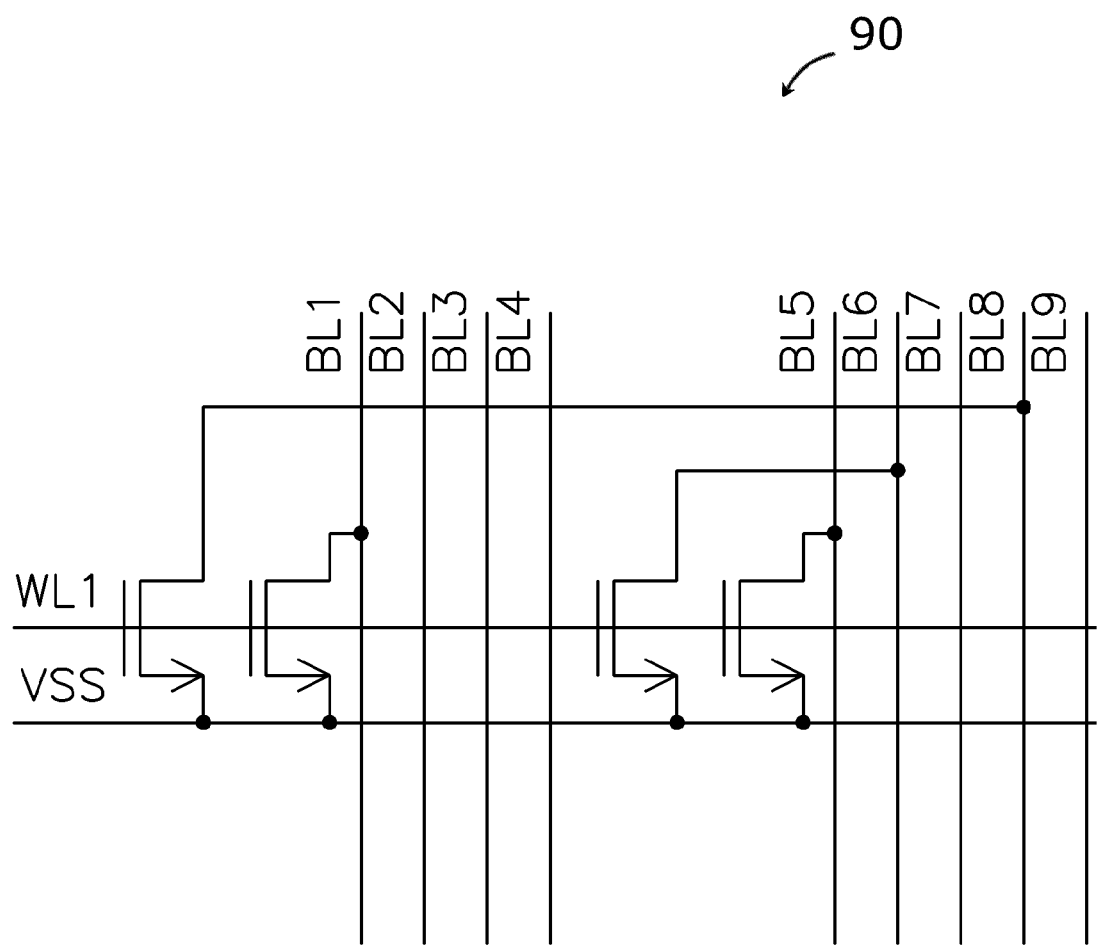
FIG. 17A is a schematic diagram of a hybrid 2 NOR to 2 multi-transistor ROM memory cell designed in accordance with the present invention.
Figure 17B:
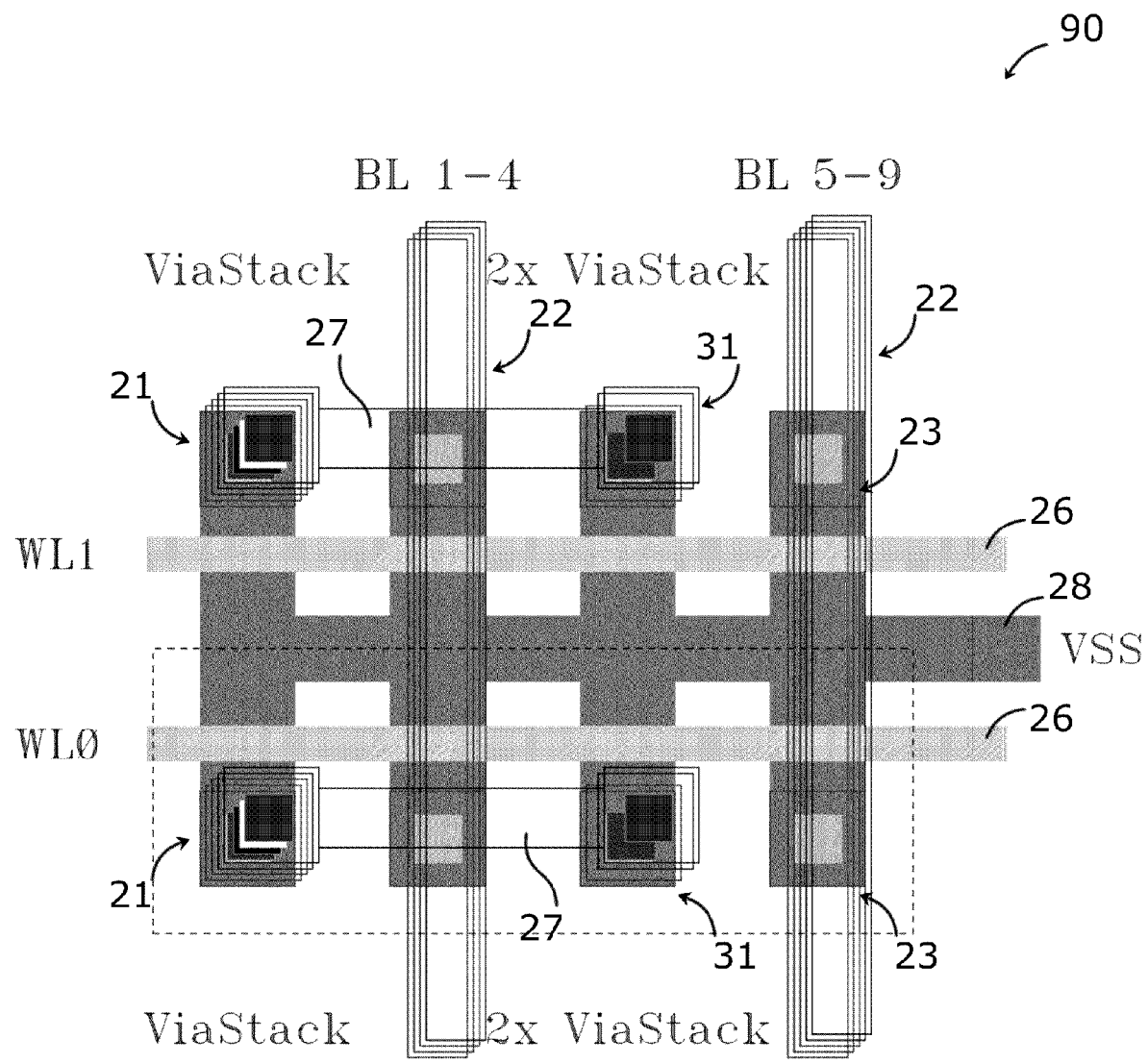
FIG. 17B is a layout design for the memory cell of FIG. 17A designed in accordance with the present invention.

FIGS. 17A and 17B illustrate another hybrid ROM memory cell 90 that consists of two NOR cells and one multi-transistor cell (which itself consists of two multi-layered cells). In previous cell designs, the multi-transistor cell was limited to a single bitline column. The structure of ROM memory cell 90 has been designed using the crossover technique described above to allow access to multiple bitline columns 22.

Specifically, as shown in FIG. 17B, the top bitline (not shown) in the first column of bitlines is removed reducing the number of bitlines in the column from five to four (i.e. to BL1 to BL4). This allows for the horizontal metal strip, crossovers 27 to be used to access a second column of bitlines BL5 to BL9 through via-stacks 21 as shown. In this way, the multi-layered cells can choose any two bitlines in either column of bitlines BL1 to BL4 or BL5 to BL9. A double via-stack 31 is used to access the desired bitlines. Double via-stack 31 consists of two via-stacks 21 that are stacked on top of each other and each can vary in height, so long as they do not electrically connect to each other. Double via-stack 31 provides the access to any two bitlines in either column of bitlines. As noted, double via-stacks 31 do not connect to each other. Rather, the lower via-stack of each double via-stack 31 brings the signal from the underlying NOR cell up. The upper via-stack of each double via-stack 31 brings the signal from the crossovers 27 down to access the bitlines BL5 to BL9. In certain cases, depending on which bitlines need to be connected to, crossover 27 may or may not be needed for any given cell in the array.

The cell density is given by:

$$\text{BitsPer}\Lambda = (\log_2 {}_{(2*n-1)}C_2 + {}_{(2*n-1)}C_1 + 1) + 2)/6\Lambda \quad (14)$$

where n is the number of metals bitlines available to attach to in the column of bitlines. The number of bits stored is calculated by the adding the two bits from the NOR cells with the "log base two" of the possible combinations generated by the multi-transistor cell and the two sets of bitline columns. As we have seen before, the number of combinations is arrived at by choosing two, one or zero combinations from the total number of bitlines. However, in this case, we have almost doubled the total number of bitlines (2*n–1). Given a cell area of six $\Lambda$, the density is simply the total "bits" divided by the area.

Hybrid 2 Multi-Valued to 1 Multi-Layered ROM Cell

Figure 18A:
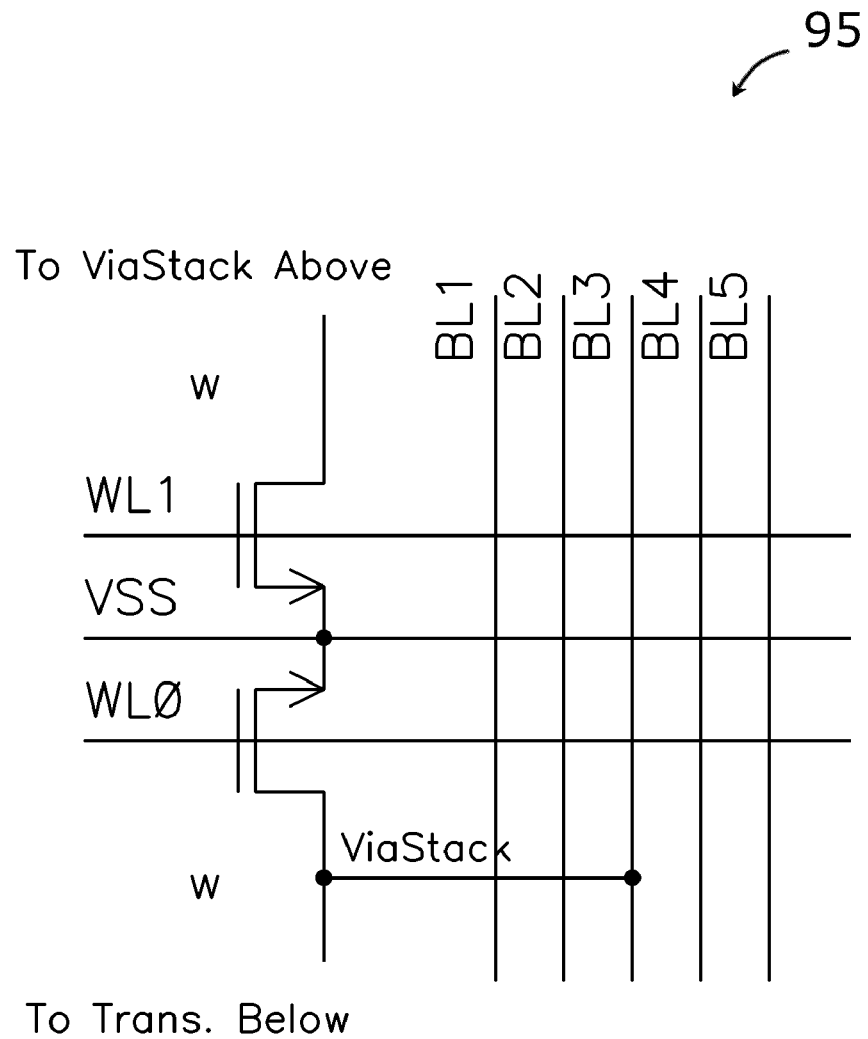
FIG. 18A is a schematic diagram of a hybrid 2 multi-valued to 1 multi-layered ROM memory cell designed in accordance with the present invention.
Figure 18B:
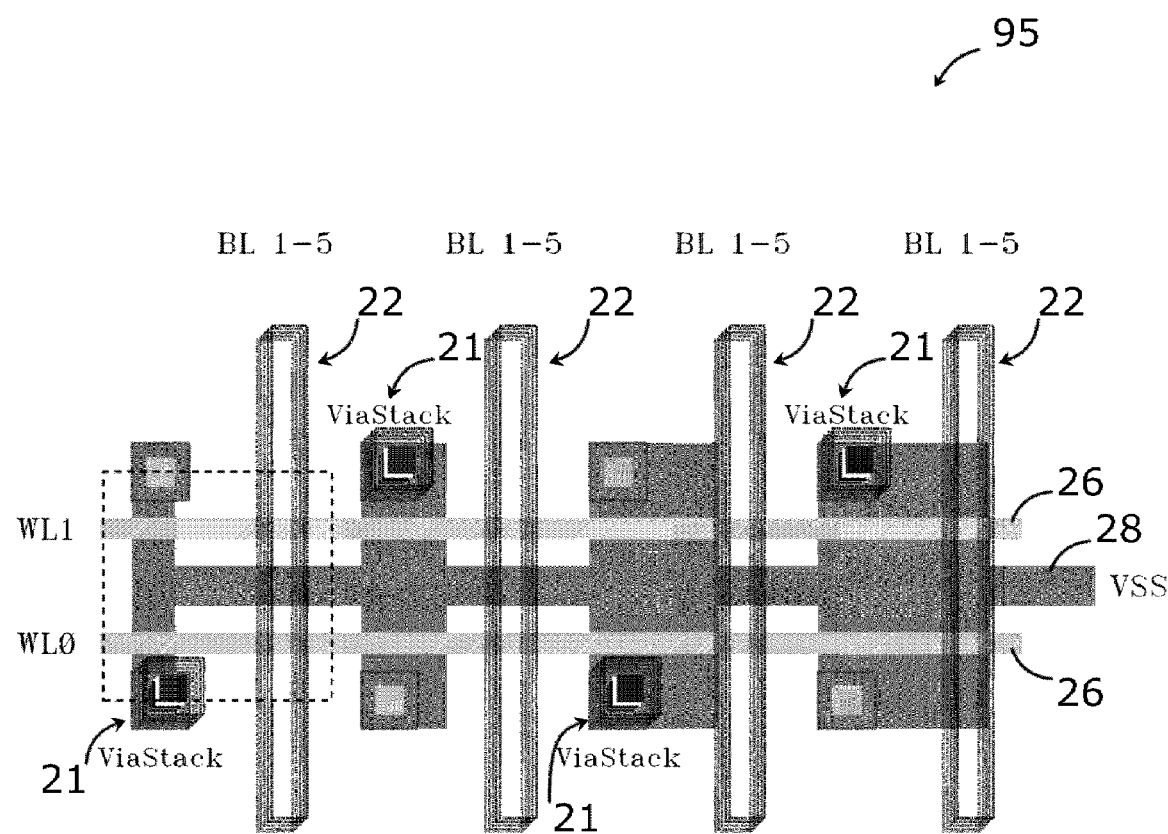
FIG. 18B is a layout design for the memory cell of FIG. 18A designed in accordance with the present invention.

FIGS. 18A and 18B illustrate another hybrid ROM memory cell 95 where the multi-layer technique of the present invention is applied to a multi-valued cell. The result is a hybrid cell 95 with a relatively high density in relation to all the conventional, new and hybrid cells discussed previously.

Specifically, alternating via-stacks 21 on either side of wordlines WL0 and WL1 are used to balance the number of bits in each row. The multi-value cells that determine which bitline the via-stack 21 connects to, contain more information in the form of which bitline that information comes out on. The multi-value cells that do not determine which bitline the via-stack 21 connects to, are sensed through all bitlines in the column (an effective "OR" operation on the sensed result of all the bitlines). In other words, for these "sharing" cells no information is contained regarding which bitline the result comes out on. It should be noted that, the via-stack 21 must connect to one of the bitlines, otherwise the "shared" cell will not be able to output its data. As such, each multi-valued cell can have five possible states (including no transistor). Thus the density, in bits per $\Lambda$, is given by:

$$\text{BitsPer}\Lambda = (\log_2(n*5) = \log_2(5)/4\Lambda \quad (15)$$

where n is the number of metals bitlines available to attach to in the column of bitlines. And "5" is the number of drive-states the multi-value transistor can produce. Hence the multi-valued cell that "owns" the via-stack 21 can represent "n by five" states; and the "share" cell, five states. The log base two of the states returns the number of bits represented. Thus the sum of the "bits" divided by the area of four $\Lambda$, yields the density of the hybrid cell. For memory cell 95 a five drive-state multi-valued cell was assumed. Note that the density equation will not always scale proportionately with the number of drive-states. The physical design must be taken into account to accurately modify the density equation. Essentially, the number of drive-states effects the cell area.

Hybrid 1 Multi-Valued to Multi-Layered ROM Cell

Figure 19A:
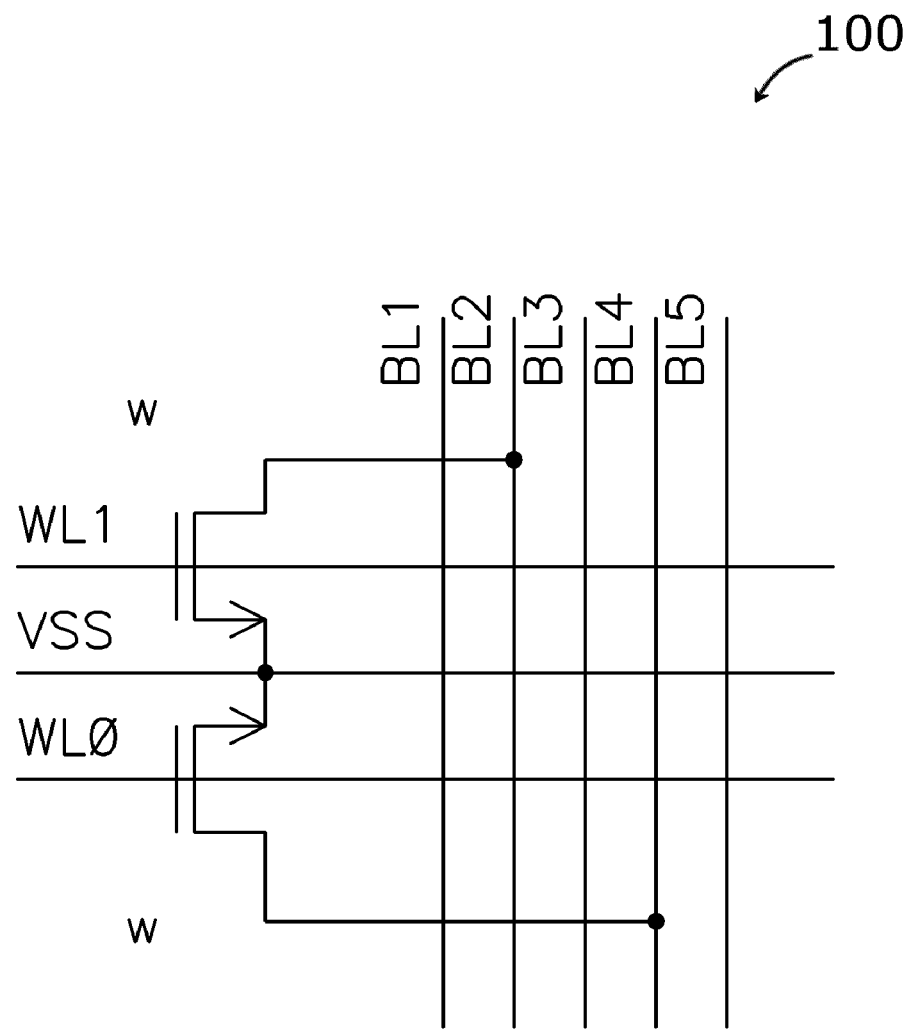
FIG. 19A is a schematic diagram of a hybrid 1 multi-valued to 1 multi-layered ROM memory cell designed in accordance with the present invention.
Figure 19B:
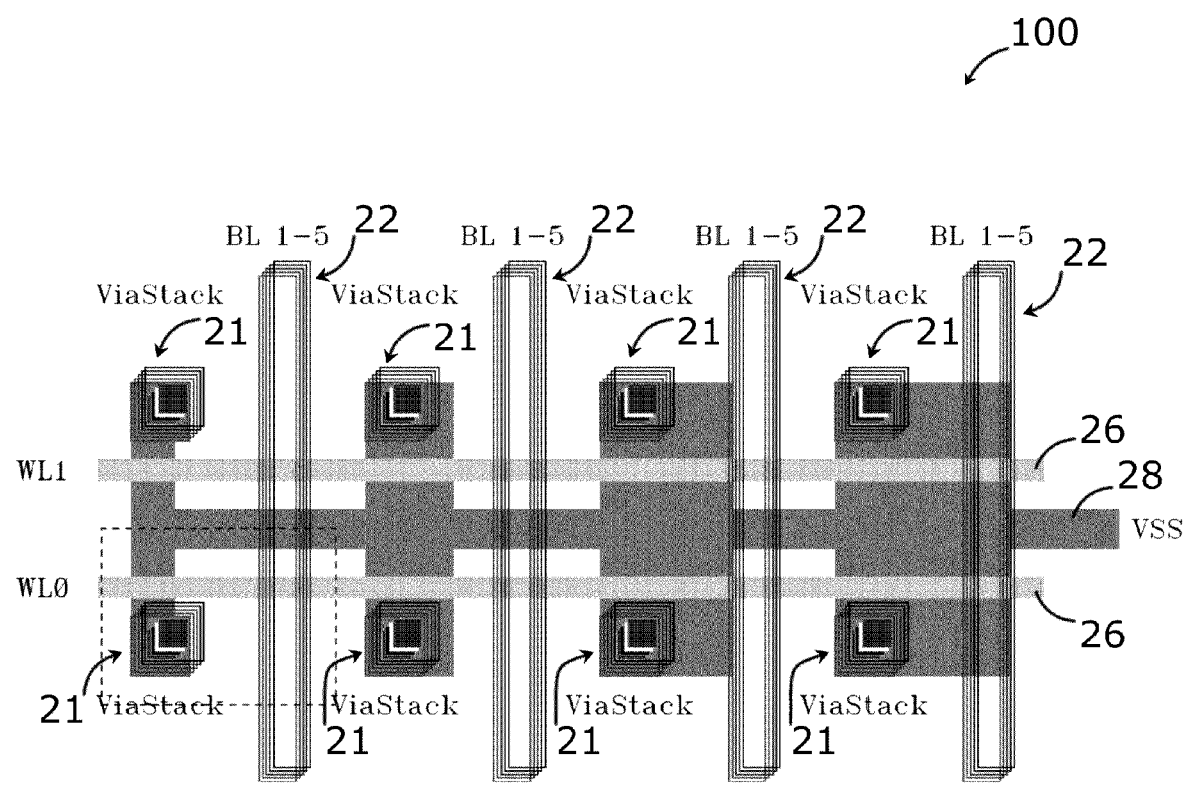
FIG. 19B is a layout design for the memory cell of FIG. 19A designed in accordance with the present invention.

FIGS. 19A and 19B illustrate another hybrid ROM memory cell 100 that is similar to the previous hybrid multi-value cell except each cell has its own via-stack 21 as shown. Each of the multi-value cells can represent five states (or 2.3-bits), by changing the transistor width (w). In addition each cell can connect to any one bitline in the column of bitlines.

The density, in bits per $\Lambda$, is given by:

$$\text{BitsPer}\Lambda = \log_2(n*5)/3\Lambda \quad (16)$$

where n is the number of metals bitlines available to attach to in the column of bitlines. "5" is the number of drive-states for the multi-valued cell. Log base two of the total possible states (n*5) returns the number of bits stored in the cell. Density is given by dividing the "bits" by three $\Lambda$.

Hybrid 1 NAND to 1 Multi-Wordline ROM Cell

Figure 20A:
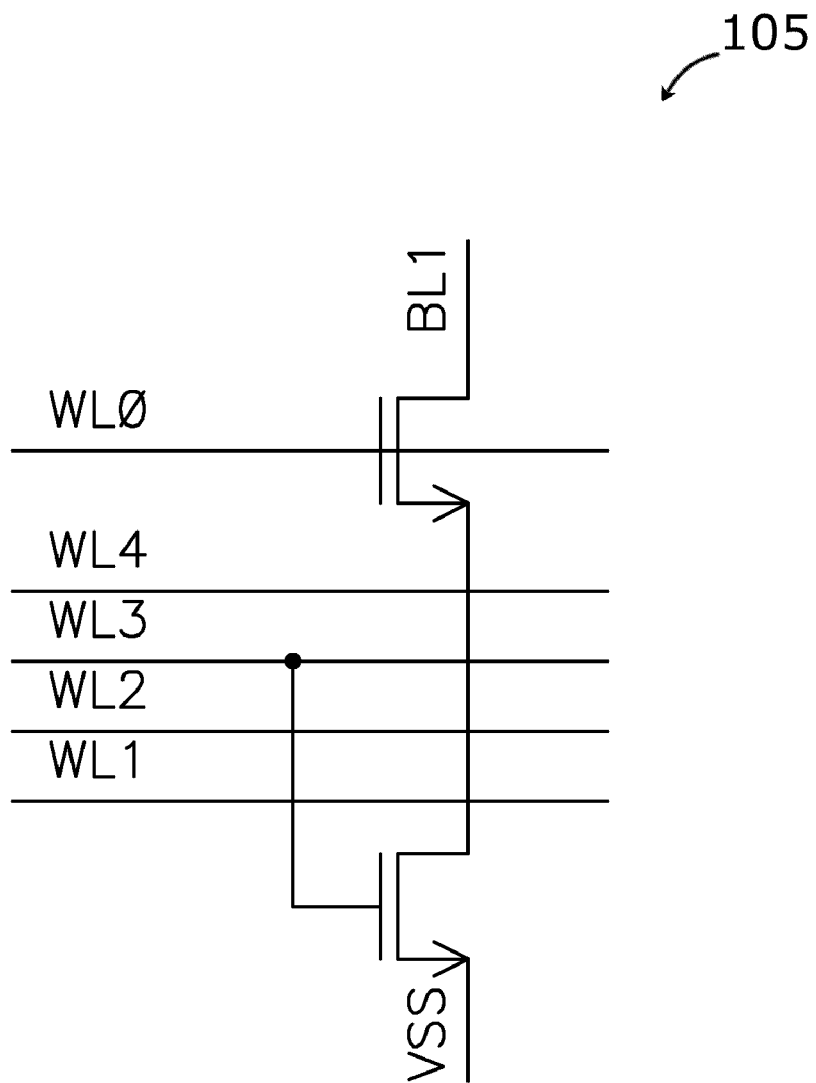
FIG. 20A is a schematic diagram of a hybrid 1 NAND to 1 multi-wordline ROM memory cell designed in accordance with the present invention.
Figure 20B:
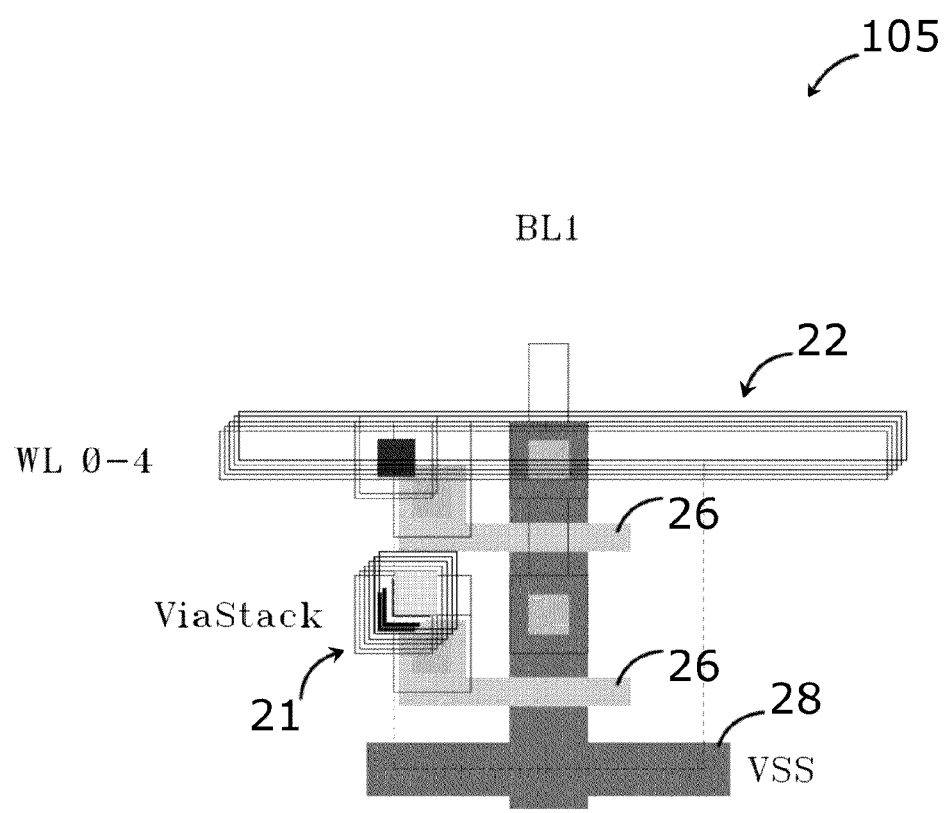
FIG. 20B is a layout design for the memory cell of FIG. 20A designed in accordance with the present invention.

FIGS. 20A and 20B illustrate another hybrid ROM memory cell 105 that combines a basic NAND cell and a multiple wordline cell. It has been determined that a multiple wordline structure works best with NAND ROM cell architecture. As previously discussed, the NAND architecture works by placing the cells in series to form the bitline. Through the presence or absence of jumper 29 over the transistor, the cell is able to store a logical zero or one. As shown, in this case wordlines WL0 to WL4 are in metal2 to metal6 and jumper 29 is implemented in metal1. Wordline WL0 (metal2) connects to the basic NAND cell, while the remainder of the wordlines WL1 to WL4 are connected to by the multi-wordline cell.

The cell density is given by:

$$\text{BitsPer}\Lambda = \log_2(n-1)+1)/4\Lambda \quad (17)$$

where n is the number of metals wordlines available to attach to in the row of wordlines. n is derived from the total metals available, such that:

$$n = m-1 \quad (18)$$

where m is the number of metals in the process. One metal is reserved for the bitlines. Note that, one wordline is used to attach to the basic NAND cells. The others from the multiple wordline structure. Thus there are n–1 possible connections for the multiple wordline, as the first wordline connects to the basic NAND cell. The "one" bit comes from the basic NAND cell. Log base two of the possible wordline connections returns the number of bits stored in this structure. Summing the bits from the NAND and multi-wordline cells, then dividing by the cell area of four $\Lambda$, gives the cell density.

General Comparison

Figure 21:
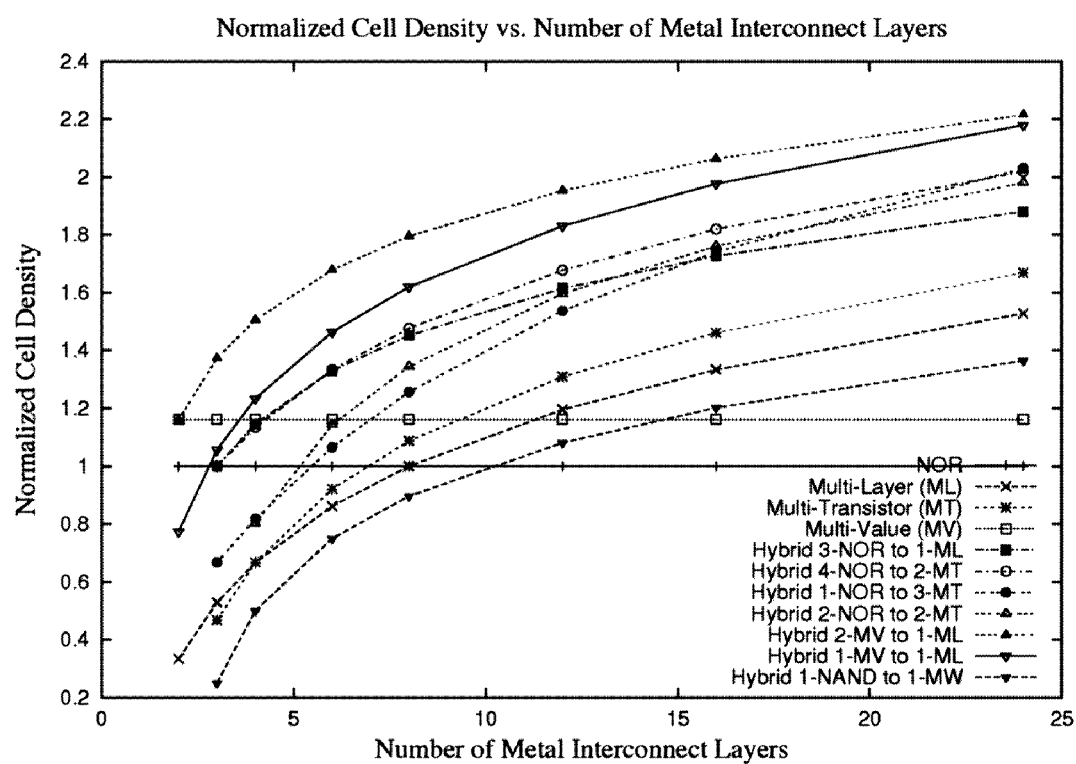
FIG. 21 is a graphical representation of normalized cell density vs. number of conductor layers.

FIG. 21 is a graph that compares the normalized cell density of the different ROM architectures versus the number of metals in various manufacturing processes. Cell densities have been normalized to the NOR ROM cell, which has a density of 1-bit per Λ. The NOR cell and multi-valued cell are unaffected by the number of conductor layers, while the other cell densities increase with the number of conductor layers. Those hybrid cells with a low ratio of NOR/multi-valued to multi-layered cells increase at a greater rate with the number of metals than those with a higher ratio. However, for a small number of metals, the higher ratio of NOR/multi-valued cells results in more compact architectures (and thus higher densities). It can be seen from the graph in FIG. 21, that the benefit of using a 2 multi-value to 1 multi-layer ROM cell is clearly evident with a 74% increase in cell density over that of the NOR ROM cell (for six conductor layers).

Table 3.2 illustrates how the minimum width of a conductor layer expands over the range of available conductor layers. However, metal width is of little interest when working with ROMs. Of more interest is metal pitch and even more so, the metal pitch with a via, as a ROM may require a via connection at every cell. As conventionally known, pitch is defined as the width of the layer plus the required spacing between two instances of the layer. Thus the pitch of the metal, including the via, becomes a limiting factor of how close the cells can be manufactured.

TABLE 3.2

Process Metal vs. Relative Width

| | Process | | | | | | | |
|---|---|---|---|---|---|---|---|---|
| | P1 | P2 | P3 | P4 | P5 | P6 | P7 | P8 |
| 0.13-μm CMOS | 1.00 | >1.00 | >1.00 | >1.00 | >1.00 | >1.00 | >1.67 | >1.67 |
| 0.18-μm CMOS | 1.00 | >1.00 | >1.00 | >1.00 | >1.00 | >1.67 | na | Na |
| 0.25-μm CMOS | 1.00 | >1.00 | >1.00 | >1.00 | >1.33 | na | na | Na |
| 0.35-μm CMOS | 1.00 | >1.00 | <1.67 | na | na | na | na | Na |

It should be noted how the metals above the first metal remain the same width until the upper metal(s) are reached which bodes well for the use of multiple bitlines.

Table 3.3 shows how the pitch of the metal grows with the increase in process layer. While metal pitch may be a good gauge for routing problems, in a ROM, the metal pitch with a via is of more importance (see Table 3.4).

TABLE 3.3

Process Metal vs. Relative Metal Pitch.

| | Process | | | | | | | |
|---|---|---|---|---|---|---|---|---|
| | P1 | P2 | P3 | P4 | P5 | P6 | P7 | P8 |
| 0.13-μm CMOS | 1.00 | 1.25 | 1.25 | 1.25 | 1.25 | 1.25 | 2.50 | 2.50 |
| 0.18-μm CMOS | 1.00 | >1.17 | >1.17 | >1.17 | >1.17 | >1.67 | na | na |
| 0.25-μm CMOS | 1.00 | >1.17 | >1.17 | >1.17 | >1.33 | na | na | na |
| 0.35-μm CMOS | 1.00 | >1.00 | <1.33 | na | na | na | na | na |

Again, it should be noted how the metal pitch remains constant for the "inner" metals.

Table 3.4 illustrates how the minimum pitch of a metal with a via increases with the process layer. Remember, relative pitch represents how much larger the metal pitch is on a higher level metal relative to metal1. These numbers are representative of the effect an increase in metal size and spacing would have on the density of a ROM. The metal width (Table 3.2) and pitch (Table 3.3) are only half the story. In a ROM, the metals need to connect to the drain of the transistors at regular locations. These connections cannot be offset in one direction to permit the tighter packing of the connections to save space (as would happen in a routed digital design). Thus, it is necessary to examine the metal pitch with a via.

TABLE 3.4

Process Metal vs. Relative Metal Pitch with Lower Via.

| | Process | | | | | | | |
|---|---|---|---|---|---|---|---|---|
| | P1 | P2 | P3 | P4 | P5 | P6 | P7 | P8 |
| 0.13-μm CMOS | 1.00 | <1.14 | <1.14 | <1.14 | <1.14 | <1.14 | >1.71 | >1.71 |
| 0.18-μm CMOS | 1.00 | <1.14 | <1.14 | <1.14 | <1.14 | <1.71 | na | na |
| 0.25-μm CMOS | 1.00 | <1.14 | <1.14 | <1.14 | >1.42 | na | na | na |
| 0.35-μm CMOS | 1.00 | >1.00 | <1.42 | na | na | na | na | na |

From Table 3.4, it can be seen that multiple conductor layers can be used with little impact on the size of the ROM. For example, in 0.13-μm CMOS by taking an "8% area penalty" (assuming the constraining factor is only in the horizontal direction, or a 17% area penalty if both the horizontal and vertical constraints are factored in) it is possible to use six layers of metal to increase the density up to 74% by using a hybrid ROM cell. On the other hand, using eight layers of metal would prohibitively increase the cell size.

To give the reader an idea of the physical size of these cell arrays, we will calculate cell storage densities for the different manufacturing processes. Table 3.5 and FIG. 25 lists Λ sizes for each technology based on the metal pitches with a via and the minimum transistor sizes. In Table 3.6 and FIG. 22, we see the theoretical cell storage over a 1-mm² area for various processes (each containing a different number of metals and a different Λ size). The following equation is used to calculate the amount of cell storage:

$$\text{Storage} = (1000 \text{ }\mu m/\text{GridSize})^2 * \text{BitsPer}\Lambda \quad (19)$$

It should be noted that only the size of the storage cells is taken into account—at this time the area of the periphery is ignored.

TABLE 3.5

Theoretical Cell Storage in Mb for Various Processes in a 1-mm² Area Based on a Process Independent Grid.

| ROM Cell | 0.13-μm CMOS 6 Metals (Mb) | 0.18-μm CMOS 5 Metals (Mb) | 0.25-μm CMOS 4 Metals (Mb) | 0.35-μm CMOS 3 Metals (Mb) |
|---|---|---|---|---|
| NOR | 2.44 | 1.06 | 0.69 | 0.39 |
| NAND | 2.44 | 1.06 | 0.69 | 0.39 |
| Multi-Layer (ML) | 2.10 | 0.82 | 0.46 | 0.21 |

TABLE 3.5-continued

Theoretical Cell Storage in Mb for Various Processes in a 1-mm² Area Based on a Process Independent Grid.

| ROM Cell | 0.13-μm CMOS 6 Metals (Mb) | 0.18-μm CMOS 5 Metals (Mb) | 0.25-μm CMOS 4 Metals (Mb) | 0.35-μm CMOS 3 Metals (Mb) |
|---|---|---|---|---|
| Multi-Transistor (MT) | 2.25 | 0.86 | 0.46 | 0.18 |
| Multi-Value (MV) | 2.83 | 1.23 | 0.81 | 0.45 |
| Multi-Wordline (MW) | 1.58 | 0.62 | 0.35 | 0.15 |
| Vert WL (x = 4) | 1.34 | 0.47 | na | na |
| Hybrid 3-NOR to 1-ML | 3.25 | 1.33 | 0.80 | 0.39 |
| Hybrid 4-NOR to 2-MT | 3.09 | 1.24 | 0.73 | 0.36 |
| Hybrid 1-NOR to 2-MT | 2.71 | 1.05 | 0.59 | 0.26 |
| Hybrid 1-NOR to 3-MT | 2.60 | 1.01 | 0.57 | 0.26 |
| Hybrid 2-NOR to 2-MT | 2.79 | 1.06 | 0.56 | na |
| Hybrid 2-MV to 1-ML | 4.25 | 1.77 | 1.08 | 0.55 |
| Hybrid 1-MV to 1-ML | 3.78 | 1.53 | 0.90 | 0.43 |
| Hybrid 1-NAND to 2-MW | 1.83 | 0.69 | 0.35 | 0.10 |

Figure 23:
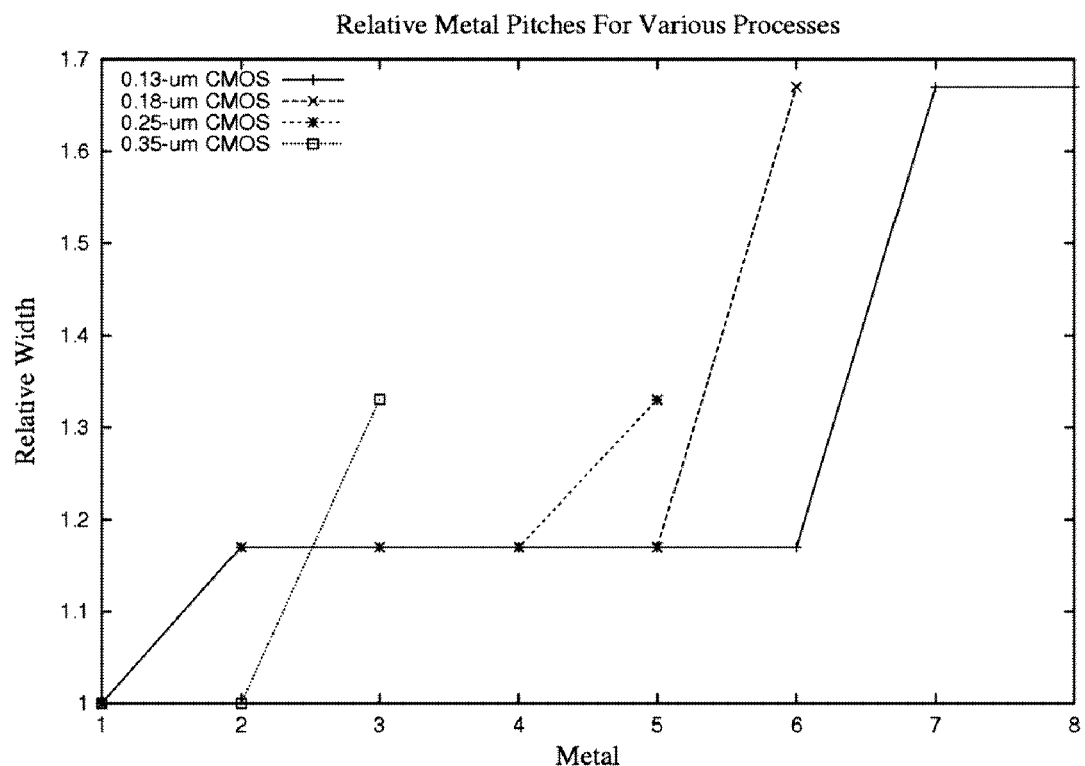
FIG. 23 is a graphical representation of relative metal pitch for various manufacturing technologies.

Table 3.6 and FIG. 23 illustrate the effect of the extra conductor layers on the amount of information that could be stored in a 1-mm² area. The lower layer metals do not have an impact on Λ as the transistor size and spacings outdistance those of the metals. However, the higher level metals expand Λ and can severely impact the area of the ROM (as can be seen when using 8 metals in a 0.13-μm CMOS process).

TABLE 3.6

Theoretical Cell Storage in Mb for Various Processes in a 1-mm² Area Based on Conductor layers and Minimum Transistor Sizes.

| ROM Cell | 0.13-μm CMOS 6 Metals (Mb) | 0.18-μm CMOS 5 Metals (Mb) | 0.25-μm CMOS 4 Metals (Mb) | 0.35-μm CMOS 3 Metals (Mb) |
|---|---|---|---|---|
| NOR | 3.70 | 1.93 | 1.00 | 0.44 |
| NAND | 3.70 | 1.93 | 1.00 | 0.44 |
| Multi-Layer (ML) | 3.19 | 1.45 | 0.67 | 0.23 |
| Multi-Transistor (MT) | 3.40 | 1.52 | 0.67 | 0.21 |
| Multi-Value (MV) | 4.29 | 2.18 | 1.16 | 0.52 |
| Multi-Wordline (MW) | 2.39 | 1.09 | 0.50 | 0.18 |
| Vert WL (x = 4) | 2.04 | 0.83 | na | na |
| Hybrid 3-NOR to 1-ML | 4.92 | 2.35 | 1.15 | 0.44 |
| Hybrid 4-NOR to 2-MT | 4.68 | 2.19 | 1.05 | 0.41 |
| Hybrid 1-NOR to 2-MT | 4.11 | 1.86 | 0.85 | 0.30 |
| Hybrid 1-NOR to 3-MT | 3.94 | 1.78 | 0.82 | 0.30 |
| Hybrid 2-NOR to 2-MT | 4.23 | 1.88 | 0.80 | na |
| Hybrid 2-MV to 1-ML | 6.44 | 3.12 | 1.56 | 0.63 |
| Hybrid 1-MV to 1-ML | 5.72 | 2.70 | 1.30 | 0.49 |
| Hybrid 1-NAND to 2-MW | 2.77 | 1.21 | 0.50 | 0.11 |

Figure 22:
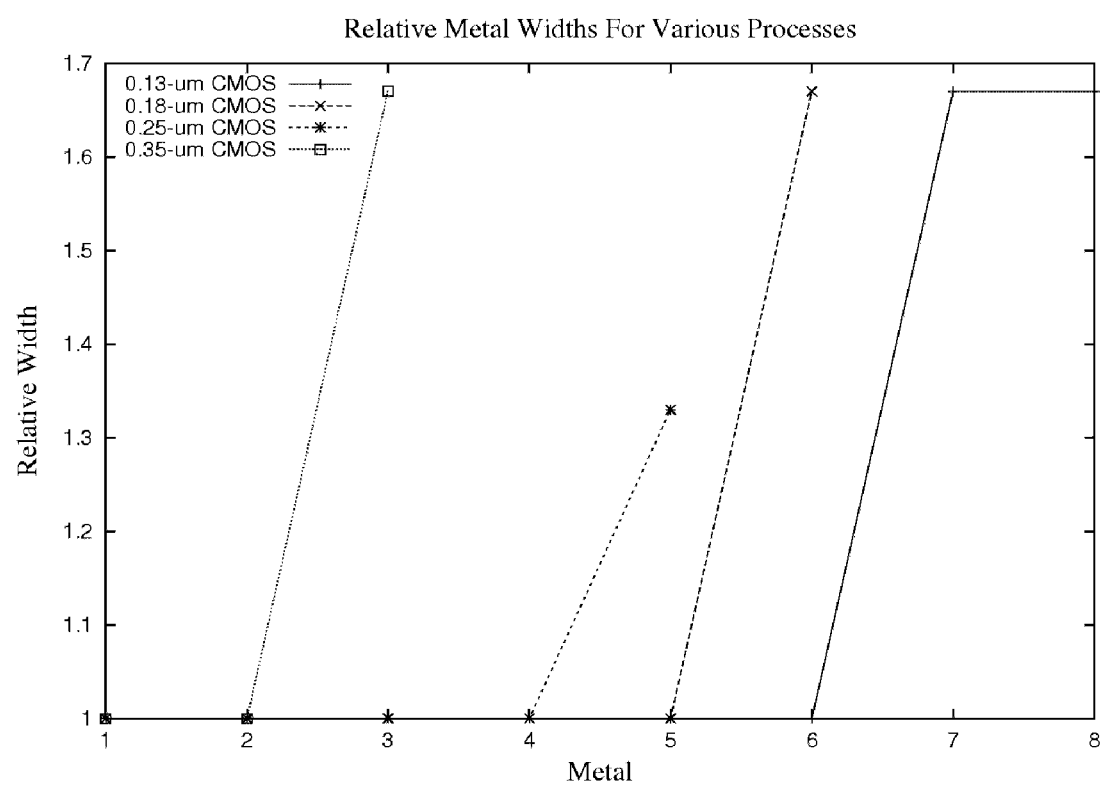
FIG. 22 is a graphical representation of relative metal width for various manufacturing technologies.

As can be seen, in FIG. 22 the greatest effect on density is the decrease in Λ (which is dependent on the manufacturing process), and second to that is the various ROM cell architectures.

Comparison in 0.13-μm CMOS

In the previous section we compared the architectures in a process-independent way. In this section, we have compacted each of the ROM architectures in a six conductor layer 0.13-μm CMOS process.

TABLE 3.7

Normalized Cell Density Before and After Compaction in a six conductor layer 0.13-μm CMOS.

| ROM Cell | Not Compacted Normalized Density | Compacted 0.13-μm CMOS Normalized Density | Ratio |
|---|---|---|---|
| NOR | 1.00 | 1.00 | 1.00 |
| NAND | 1.00 | 1.04 | 1.04 |
| Multi-Layer (ML) | 0.86 | 0.89 | 1.03 |
| Multi-Transistor (MT) | 0.92 | 1.10 | 1.20 |
| Multi-Value (MV) | 1.16 | 1.28 | 1.10 |
| Multi-Wordline (MW) | 0.65 | 0.58 | 0.89 |
| Vert WL (x = 4) | 0.55 | 0.49 | 0.89 |
| Hybrid 3-NOR to 1-ML | 1.33 | 1.28 | 0.96 |
| Hybrid 4-NOR to 2-MT | 1.26 | 1.19 | 0.94 |
| Hybrid 1-NOR to 2-MT | 1.11 | 1.07 | 0.96 |
| Hybrid 1-NOR to 3-MT | 1.07 | 1.01 | 0.95 |
| Hybrid 2-NOR to 2-MT | 1.14 | 1.14 | 1.00 |
| Hybrid 2-MV to 1-ML | 1.74 | 1.92 | 1.10 |
| Hybrid 1-MV to 1-ML | 1.55 | 1.79 | 1.16 |
| Hybrid 1-NAND to 2-MW | 0.75 | 0.72 | 0.96 |

Table 3.7 shows the normalized bits per area (relative to the NOR cell) before and after compacting the cells in a 0.13-μm CMOS process. Each ROM cell has been compressed to a minimum size. The higher the value the higher the density. In the ratio column, we see the impact of compression. Those cells whose ratio is less than one did not compact as well as the NOR ROM cell. On the other hand, those cells whose ratio is greater than one, compacted more than the NOR ROM cell.

It is interesting to note the effect compaction had on the normalized bits per area in 0.13-μm CMOS. The maximum variation was 20%, yielding evidence as to the accuracy of the normalized area analysis.

TABLE 3.8

Theoretical Cell Storage in Mb for 0.13-μm CMOS Manufacturing Technology in a 1-mm² Area.

| ROM Cell | Process Independent 0.13-μm CMOS (Mb) | Compacted 0.13-μm CMOS (Mb) |
|---|---|---|
| NOR | 2.44 | 3.86 |
| NAND | 2.44 | 4.01 |
| Multi-Layer (ML) | 2.10 | 3.43 |
| Multi-Transistor (MT) | 2.25 | 4.26 |
| Multi-Value (MV) | 2.83 | 4.94 |
| Multi-Wordline (MW) | 1.58 | 2.22 |
| Vert WL (x = 4) | 1.34 | 1.89 |
| Hybrid 3-NOR to 1-ML | 3.25 | 4.95 |
| Hybrid 4-NOR to 2-MT | 3.09 | 4.58 |
| Hybrid 1-NOR to 2-MT | 2.71 | 4.12 |
| Hybrid 1-NOR to 3-MT | 2.60 | 3.90 |
| Hybrid 2-NOR to 2-MT | 2.79 | 4.41 |
| Hybrid 2-MV to 1-ML | 4.25 | 7.40 |
| Hybrid 1-MV to 1-ML | 3.78 | 6.91 |
| Hybrid 1-NAND to 2-MW | 1.83 | 2.79 |

With these new compacted sizes we can calculate the storage over a 1-mm² area (Table 3.8) The values in Table 3.8 are based on memory cell size and do not include sense amplifiers or other peripheral components. We include this information for the purposes of comparisons to other memory technologies that were not discussed herein.

RAM-ROM in the Same Space

Because information is being stored in the multiple layers above the transistors, it is possible to overlay a ROM on top of a RAM. For example, using the multi-layer technique, a ROM could be built above a Flash EEPROM or SRAM array. By identifying which bitline the information comes out on, it is possible to simultaneously read both the value stored in the memory cell and the ROM. One of the key benefits is that the ROM requires no transistors, other than those commonly found in the SRAM.

Figure 24A:
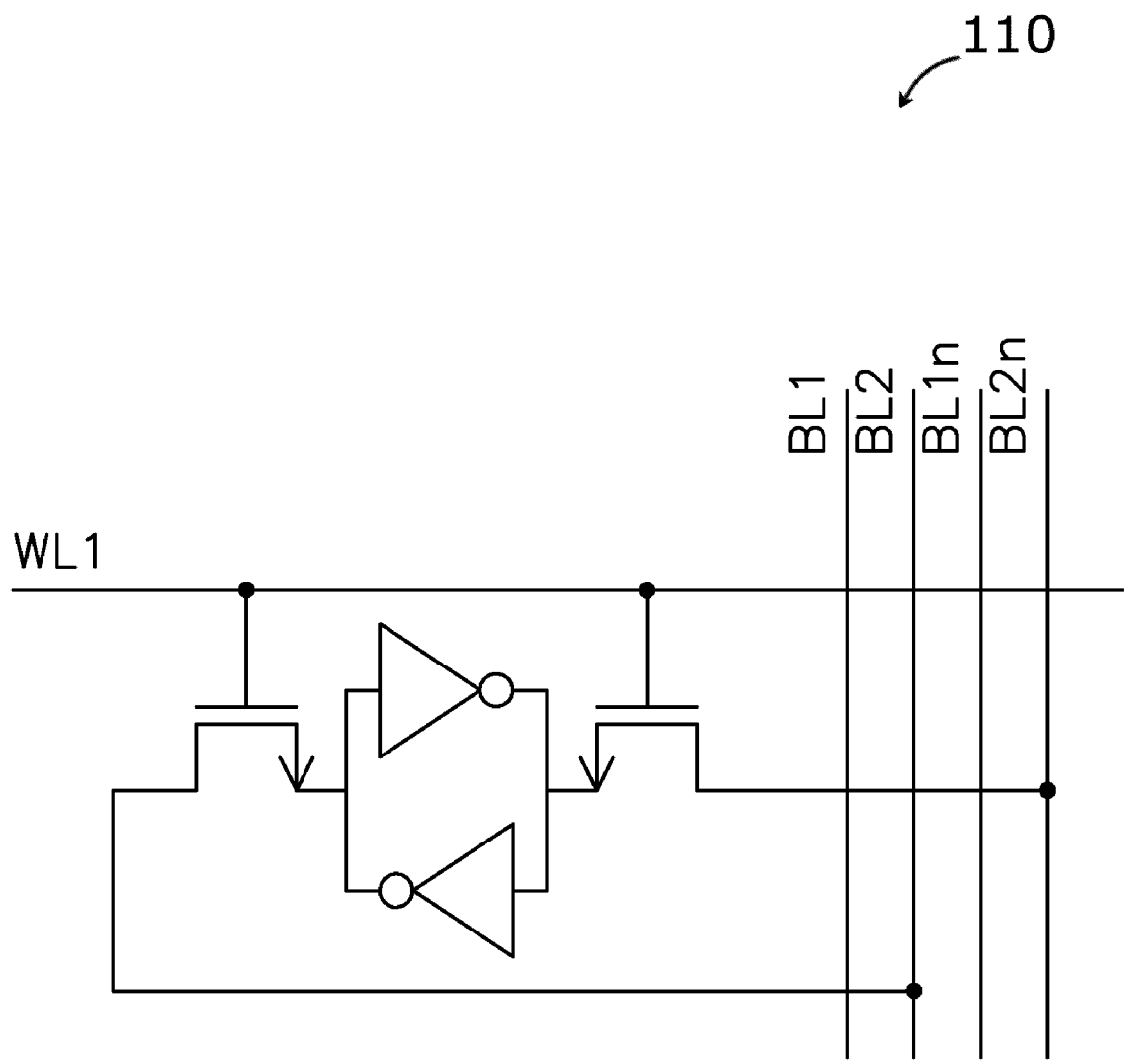
FIG. 24A is a schematic diagram of a SRAM-ROM memory combination using one bitline columns designed in accordance with the present invention.
Figure 24B:
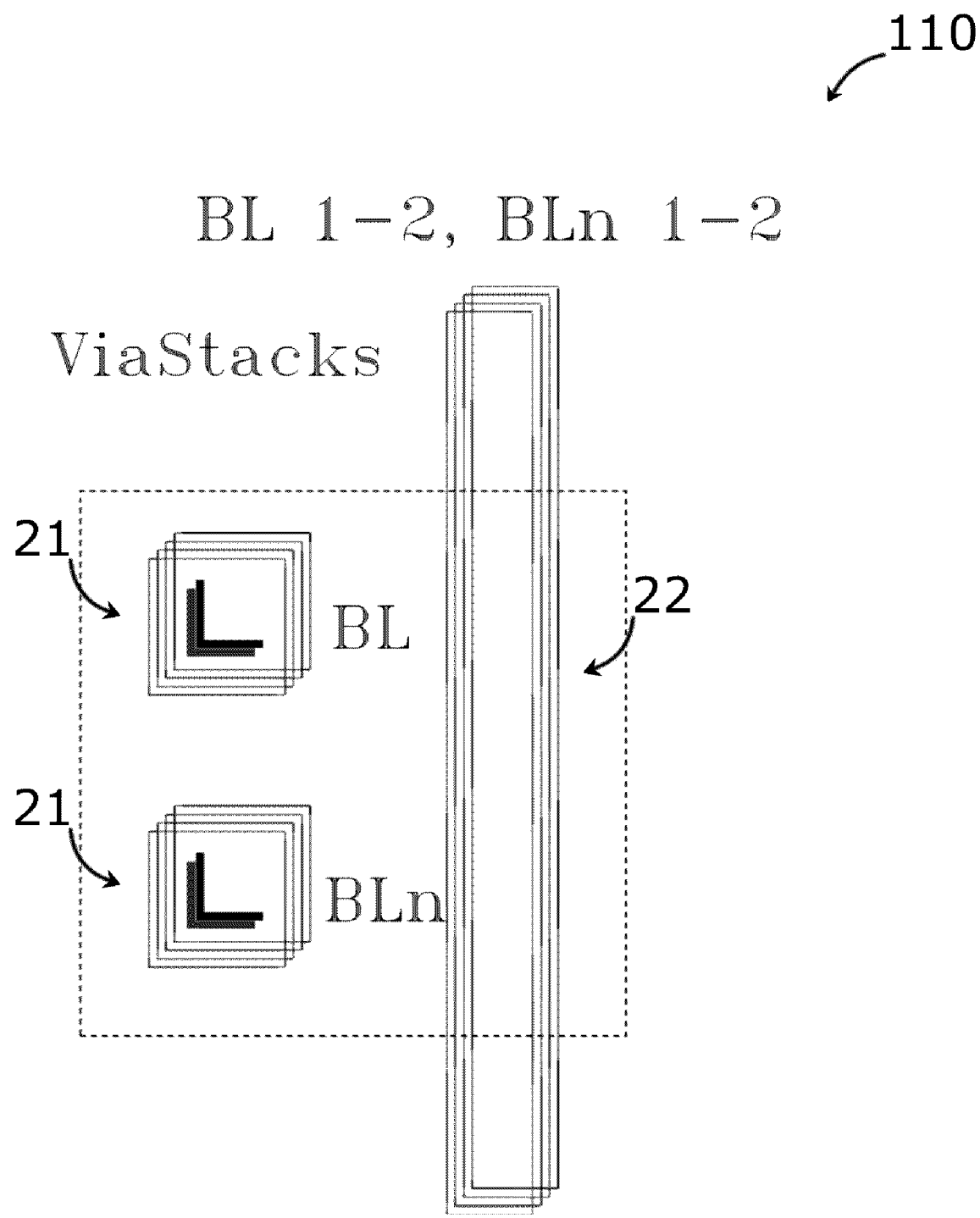
FIG. 24B is a layout design for the memory cell of FIG. 24A designed in accordance with the present invention.

FIGS. 24A and 24B illustrate the schematic and layout for a SRAM-ROM memory combination using one bitline BL column 110. As before, the area to implement the ROM structure above the SRAM is shown by a dashed box in FIGS. 24B and 24B. FIG. 24A illustrates the schematic structure of a SRAM-ROM combination using one bitline BL column. Wordlines WL are assumed to be strapped at multiples of the memory cell.

The density, in bits per $\Lambda$, is given by:

$$\text{BitsPer}\Lambda = (\log_2(n/2)+1)/4\Lambda \tag{20}$$

where n is the number of metal bitlines available to attach to in the column of bitlines. The number of metal bitlines is divided in half (half for the true bitline and half for the complementary bitline). Log base two of the total possible states (n/2) returns the number of bits stored in the ROM cell. One bit is added to account for the SRAM cell. Density is given by dividing the "bits" by the area of four $\Lambda$.

Figure 24C:
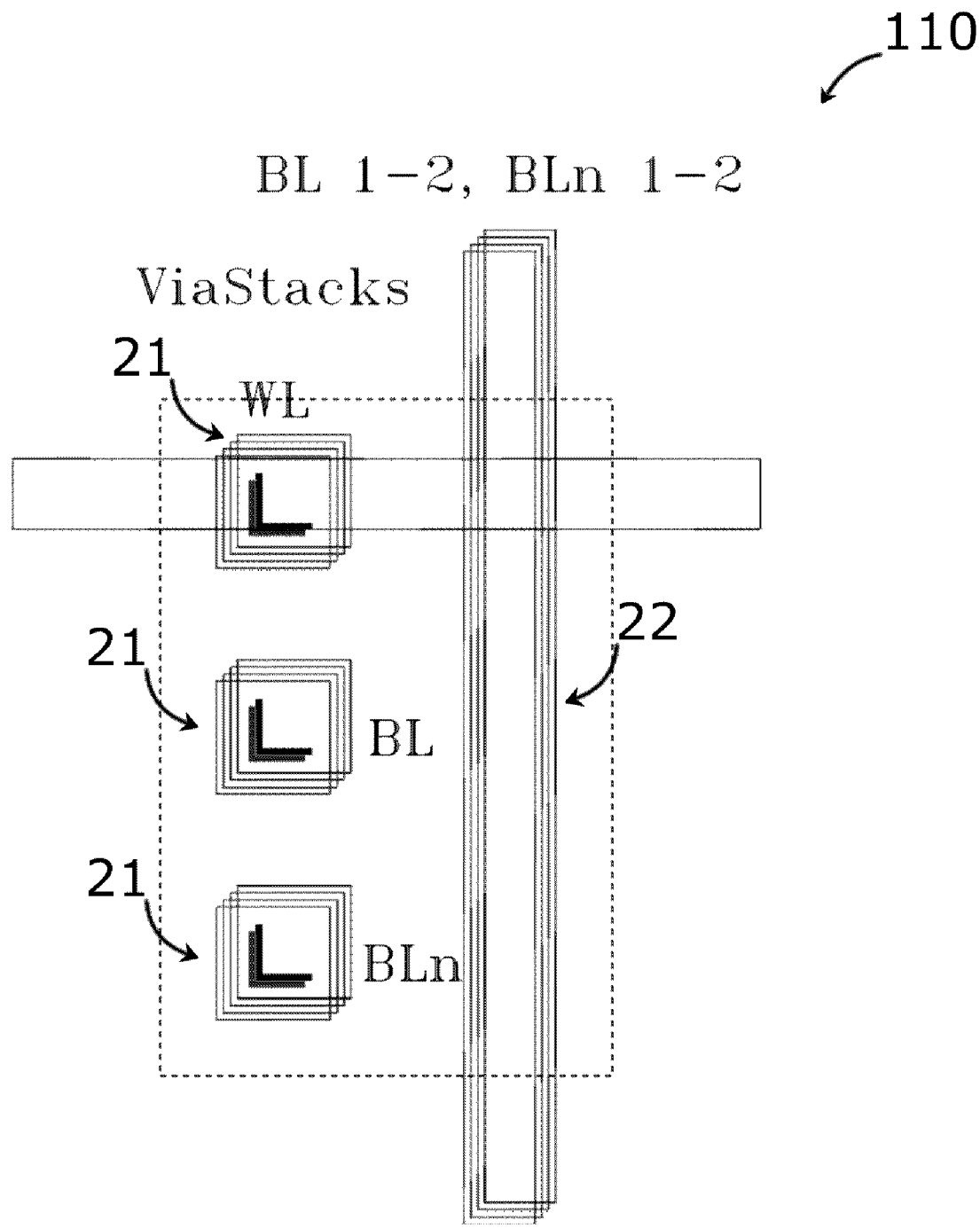
FIG. 24C is a layout design for the memory cell of FIG. 24A using one wordline WL via designed in accordance with the present invention.

FIG. 24C illustrate a layout for a SRAM-ROM using a bitline BL column with one wordline WL via as shown. Here, a wordline via (strap) is provided at each memory cell. The density, in bits per $\Lambda$, is given by:

$$\text{BitsPer}\Lambda = (\log_2(n/2)+1)/6\Lambda \tag{21}$$

where n is the number of metals bitlines available to attach to in the column of bitlines. The number of metal bitlines is divided in half (half for the true bitline and half for the complementary bitline). Log base two of the total possible states (n/2) returns the number of bits stored in the ROM cell. One bit is added to account for the SRAM cell. Density is given by dividing the "bits" by the area of six $\Lambda$.

Figure 25A:
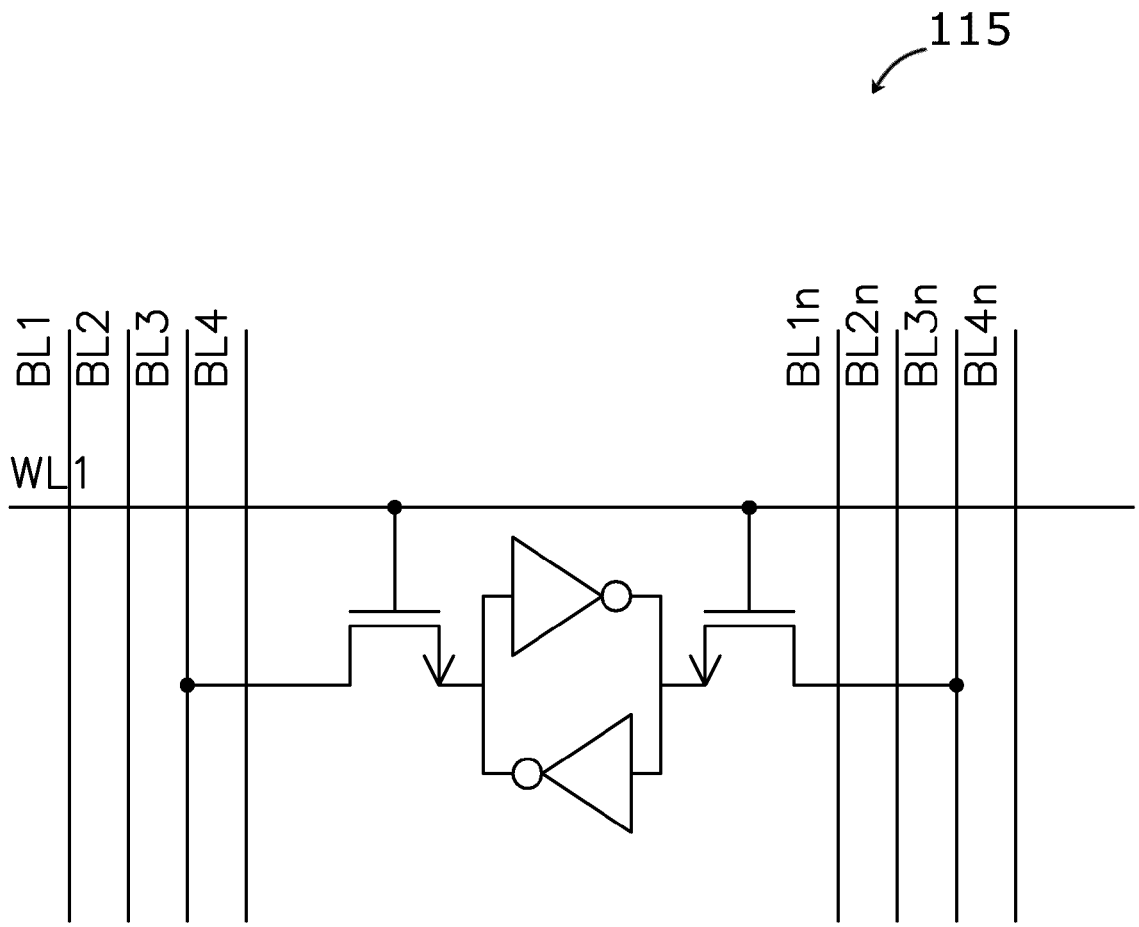
FIG. 25A is a schematic diagram of a SRAM-ROM memory combination using two bitline columns designed in accordance with the present invention.
Figure 25B:
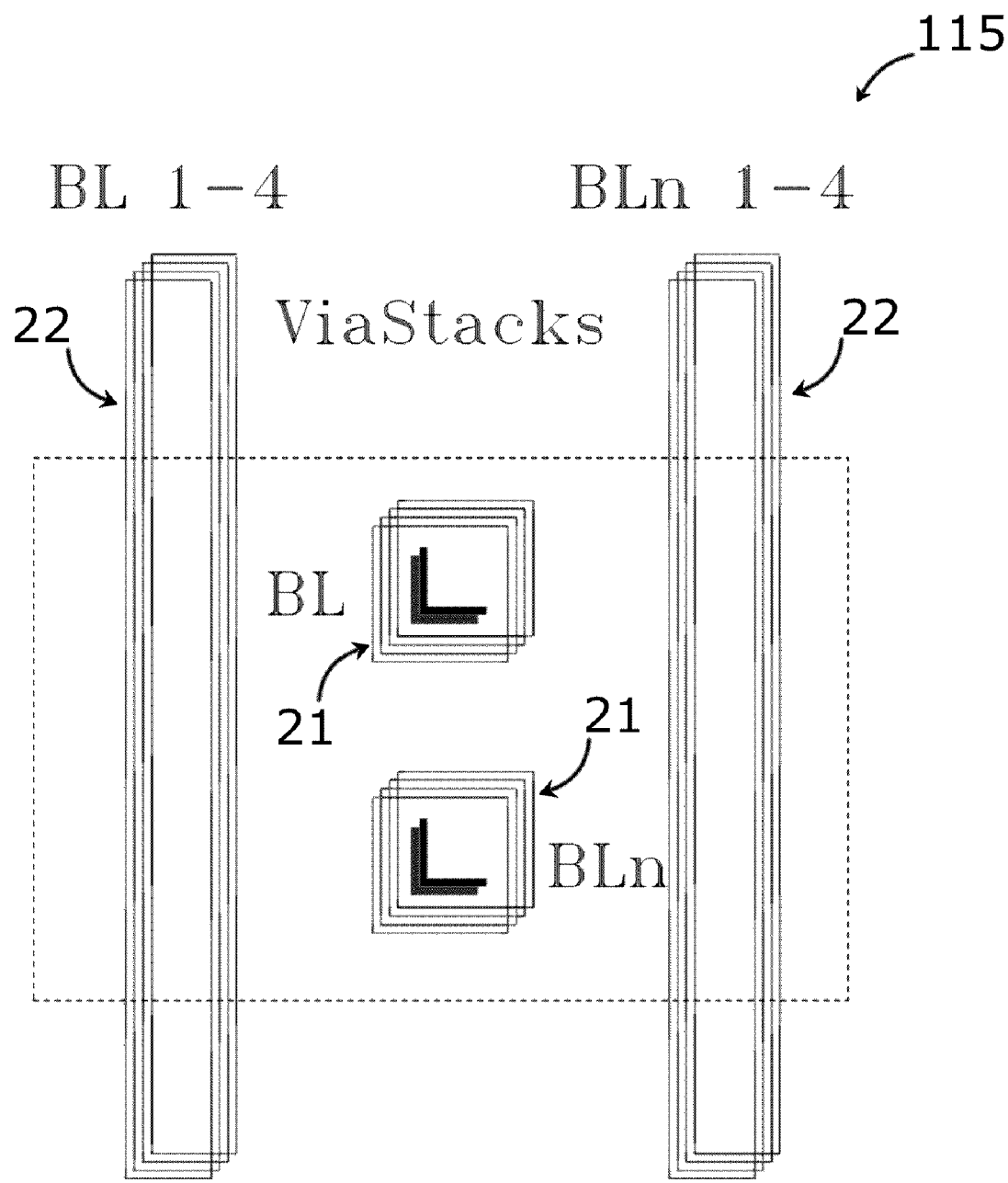
FIG. 25B is a layout design for the memory cell of FIG. 24A designed in accordance with the present invention.

FIGS. 25A and 25B illustrate the schematic and layout for a SRAM-ROM memory combination using two bitlines BL columns 115. As before, the area to implement the ROM structure above the SRAM is shown by a dashed box in FIG. 24B. FIG. 25A illustrates the schematic structure of a SRAM-ROM combination using two columns of bitlines BLs. Wordlines WL are assumed to be strapped at multiples of the memory cell. The density, in bits per $\Lambda$, is given by:

$$\text{BitsPer}\Lambda = (\log_2(n)+1)/6\Lambda \tag{22}$$

where n is the number of metal bitlines available to attach to in the column of bitlines. Log base two of the total possible states (n) returns the number of bits stored in the ROM cell. One bit is added to account for the SRAM cell storage. Density is given by dividing the "bits" by the area of six $\Lambda$.

Figure 25C:
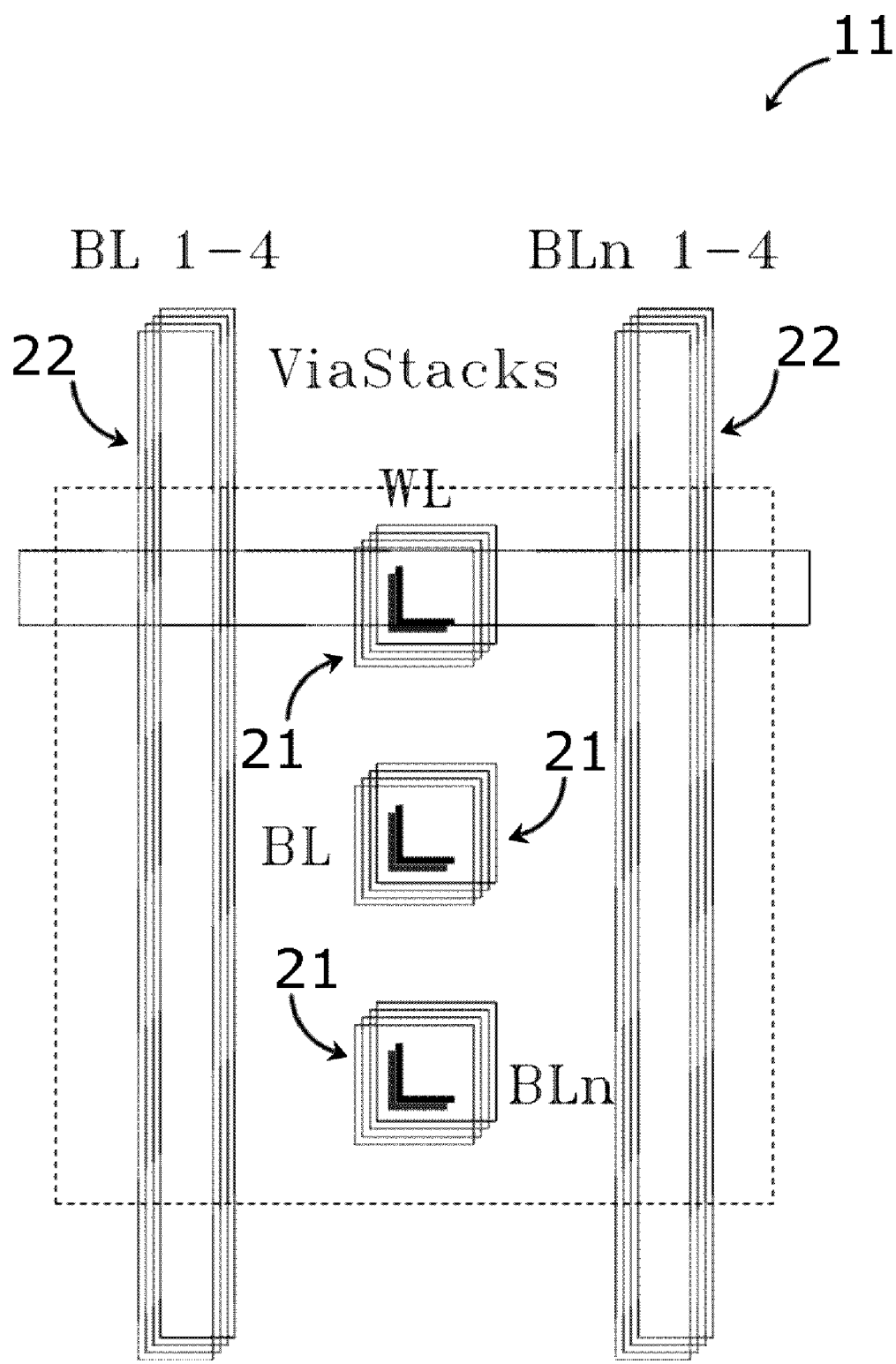
FIG. 25C is a layout design for the memory cell of FIG. 24A using one wordline WL via designed in accordance with the present invention.
Figure 26:
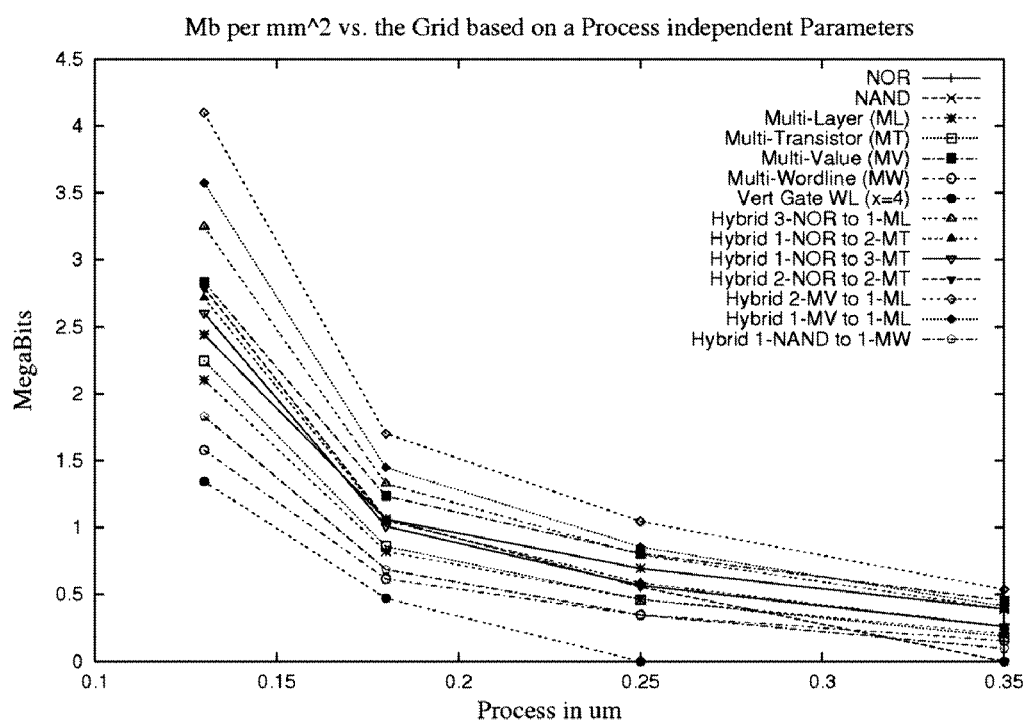
FIG. 26 is a graphical representation of theoretical storage capacity for various manufacturing technologies.
Figure 27:
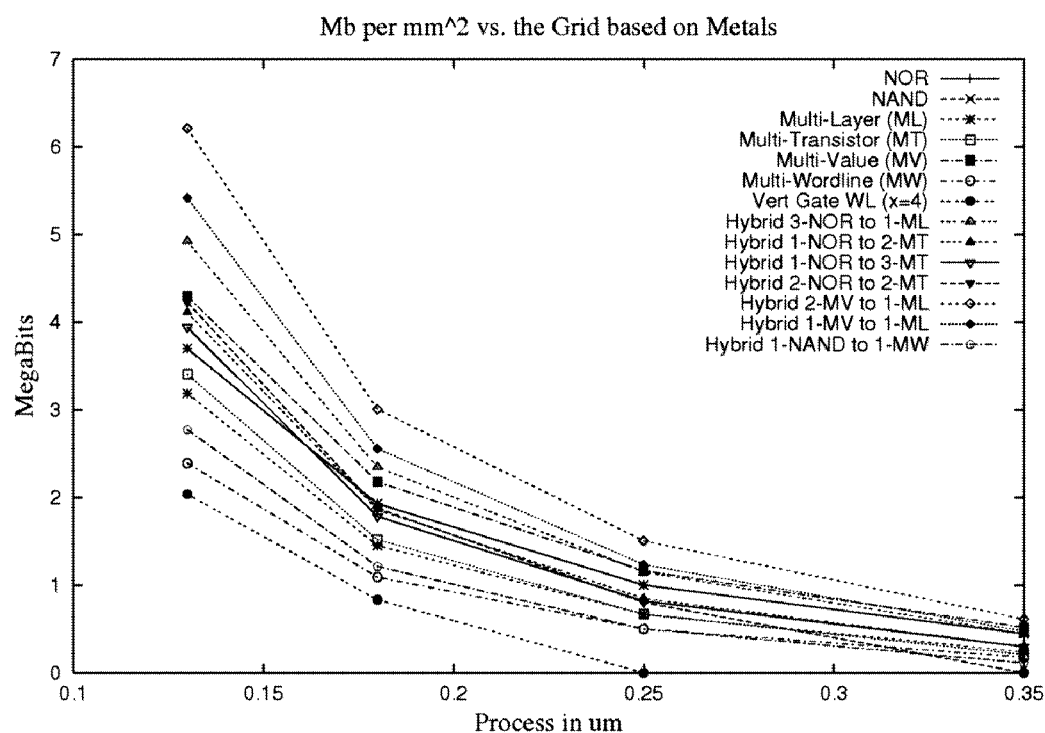
FIG. 27 is a graphical representation of theoretical storage capacity for various manufacturing technologies.

FIG. 25C illustrates the layout of a SRAM-ROM using two bitline BL columns that include a wordline WL via. Here a wordline via (stap) is provided at each memory cell. The density, in bits per $\Lambda$, is given by:

$$\text{BitsPer}\Lambda = (\log_2(n)+1)/9\Lambda \tag{23}$$

where n is the number of metal bitlines available to attach to in the column of bitlines. Log base two of the total possible states (n) returns the number of bits stored in the ROM cell. One bit is added to account for the SRAM cell storage. Density is given by dividing the "bits" by the area of nine $\Lambda$.

Observations

It is beneficial, in terms of cell density, to use multi-layered bitlines in the design of a ROM. It is important to balance the use of extra metals against the potential increase in ROM size when determining the number of conductor layers to use. It should be noted that the middle layers of metal tend to have the same dimensions. Thus making the use of extra metals, through the hybrid ROM cells, clearly beneficial. Compacting has little relative effect on the density of the ROM cells (Table 3.8). In other words, compacting the various architectures does not significantly benefit one cell more than another. Compacting, in general, does have a major effect on the density of all the ROM architectures. However, for our purposes, it demonstrates the accuracy of a normalized area when comparing various ROM architectures. Based on the results discussed above, it has been determined that the hybrid NOR multi-valued multi-layer cell offers the highest density for less than 10 metals in a process.

With advancements in process technology, many more interconnect metals have been made available to the designer. By using these extra metals in a ROM, the density of general ROM design technique has been increased significantly. Given the opportunity to redesign an integrated circuit, these are the techniques that would benefit the design. Starting off, the sense-amplifiers should be replaced with current sense-amplifiers. The use of the memory cell structure of the present invention allows for increased densities due to the fact that the number of conductor layers available in the manufacturing process has consistently been increasing. That is, since the structure of the present invention forms the bitlines BL associated with each column of cells by stacking the multiple metal process layers associated with standard integrated circuit manufacturing processes, increased densities will result from the natural industry trend to increase the number of conductor layers available during manufacturing.

It should be understood that the present invention could be applicable to other integrated circuit devices. For example, a SRAM consists of six transistors, two bitlines and a wordline. Using the concept of multiple conductor layer bitlines it would be possible to replace the two bitlines with stacks of bitlines. As a result, the information coming out of the bitlines would represent the information stored in the SRAM, on which bitlines the information came out on, would represent the information stored in the ROM. No extra transistors would be needed in the SRAM memory cell to implement the ROM. The effect of adding two via stacks on the area of the SRAM cell would need to be analyzed to determine its potential benefit.

As will be apparent to those skilled in the art, various modifications and adaptations of the structure described above are possible without departing from the present invention, the scope of which is defined in the appended claims.

What is claimed is:

1. A multi-layered memory device for storing data and subsequently reading out the stored data, said memory device utilizing a plurality of existing stacked process conductor layers, said memory device comprising:

(a) plurality of memory cells arranged in columns and rows, each memory cell including at least one transistor, each transistor being adapted to store information;

(b) plurality of wordlines corresponding to the plurality of rows, each wordline being used in common in each row of said memory cells, at least one of said wordlines being connected to a corresponding memory cell in the column of memory cells;

(c) plurality of bitlines, said bitlines arranged substantially orthogonal to said wordlines, at least one of said bitlines being used in common for data read-out along a column of memory cells;

(d) at least one via-stack, said via-stack comprising a plurality of vias positioned to connect adjacent conduction layers, said via-stack being arranged in close proximity to at least one memory cell, said via-stack being adapted to electrically connect at least one transistor within at least one memory cell to at least one of the existing stacked process conductor layers;

wherein said existing stacked process conductor layers are used to implement within the multi-layered memory device, at least one of an additional wordline as defined in (b) and an additional bitline as defined in (c).

2. The memory device of claim 1, wherein said existing stacked process conductor layers are used to implement a plurality of additional bitlines within the device.

3. The memory device of claim 1, wherein said existing stacked process conductor layers are used to implement a plurality of additional wordlines within the device.

4. The memory device of claim 1, wherein at least one of said via-stacks has a height less than the height of the existing stacked process conductor layers in order to allow for at least one conductor layer within said existing stacked process conductor layers to run over top of said via-stack.

5. The memory device of claim 1, wherein said existing stacked process conductor layers includes at least one crossover conductor layer for electrically connecting to the transistor of a first memory cell through a first via-stack and to the transistor of a second memory cell through a second via-stack.

6. The memory device of claim 1, wherein said memory device includes a series of adjacent memory cells, each adjacent memory cell having a different value.

7. The memory device of claim 1, wherein each memory cell is associated with at least two bitlines.

8. The memory device of claim 1, wherein each memory cell is associated with at least two wordlines.

9. The memory device of claim 1, wherein said memory device is a ROM device and wherein each memory cell contains one transistor and is associated with at least four bitlines.

10. The memory device of claim 1, wherein said memory device is a ROM device and wherein each memory cell contains two transistors and is associated with at least five bitlines.

11. The memory device of claim 1, wherein said memory device is a ROM device and wherein each memory cell contains four transistors and is associated with at least ten bitlines.

12. The memory device of claim 1, wherein said information stored by each said memory cell is non-integer number of bits.

13. The memory device of claim 1, wherein said memory device is a hybrid multi-valued ROM device utilizing at least one multi-valued transistor to provide multiple drives, and wherein said at least one multi-valued transistor are selectively associated with two or more bitlines.

14. The memory device of claim 1, wherein said memory device is a hybrid multi-valued ROM device utilizing a set of multi-valued transistors to provide multiple drives, and wherein each said memory cell contains two transistors selected from said set of multi-valued transistors and is associated with two wordlines and one via-stack.

15. The memory device of claim 1, wherein said memory device is a hybrid multi-valued ROM device utilizing a set of multi-valued transistors to provide multiple drives, and wherein each said memory cell contains one transistors selected from said set of multi-valued transistors and is associated with one wordline and one via-stack.

16. The memory device of claim 1, wherein said memory device is a combination ROM-RAM memory device comprising a ROM memory structure implemented over a RAM memory structure, wherein a plurality of bitlines are selectively connected to said RAM memory structure at the time of manufacture.

17. The memory device of claim 1, wherein each memory cell contains at least two transistors, and wherein each transistor within each memory cell is selectively associated or unassociated with a bitline.

18. The memory device of claim 1, wherein each memory cell is one of a plurality of cell types to allow for a diversity of information storage capacity amongst memory cells, wherein each cell type is configured at the time of manufacture to allow for a maximum amount of bitline selection selected from the group consisting of none, one, and greater than one.

19. A method of manufacturing a multi-layered memory device for storing data and subsequently reading out the stored data, said method utilizing existing stacked process conductor layers, said method comprising:

(a) providing and arranging a plurality of memory cells in columns and rows, each memory cell including at least one transistor, each transistor being adapted to store information;

(b) providing a plurality of wordlines corresponding to the plurality of rows, each wordline being used in common in each row of said memory cells, at least one of said wordlines being connected to a corresponding memory cell in the column of memory cells;

(c) providing and arranging a plurality of bitlines substantially orthogonal to said wordlines, at least one of said bitlines being used in common for data read-out along a column of memory cells;

(d) providing a via-stack by positioning a plurality of vias coupling conductive layers, and arranging said via-stack in close proximity to at least one memory cell, said via-stack being adapted to electrically connect at least one transistor within the at least one memory cell to at least one of the existing stacked process conductor layers;

wherein the existing stacked process conductor layers are used to implement within the memory device at least of an additional wordline as defined in (b) and a bitline as defined in (c).

20. The method of claim 18, further comprising the step of using the existing stacked process conductor layers to implement a plurality of additional bitlines within the device.

21. The method of claim 18 further comprising the step of using the existing stacked process conductor layers to implement a plurality of additional wordlines within the device.

22. The method of claim 18, further comprising the step of forming at least one via-stack having a height less than the height of the existing stacked process conductor layers and forming at least one conductor layer within said existing stacked process conductor layers such that said conductor layer runs over top of said via-stack.

23. The method of claim 18, further comprising the step of forming at least one crossover conductor layer for electrically connecting to the transistor of a first memory cell through a first via-stack and to the transistor of a second memory cell through a second via-stack.

24. The method of claim 18, further comprising the step of forming said memory device such that it includes a series of adjacent memory cells, each adjacent memory cell having a different value.

25. The method of claim 18, wherein each memory cell contains at least two bitlines.

26. The method of claim 18, wherein each memory cell contains at least two wordlines.

27. The method of claim 18, wherein said memory device is a ROM device and wherein each memory cell is manufactured to contain one transistor and to be associated with at least four bitlines.

28. The method of claim 18, wherein said memory device is a ROM device and wherein each memory cell is manufactured to contain two transistors and to be associated with at least five bitlines.

29. The method of claim 18, wherein said memory device is a ROM device and wherein each memory cell is manufactured to contain four transistors and to be associated with at least ten bitlines.

30. The method of claim 18, wherein said information stored by each said memory cell is non-integer number of bits.

31. The method of claim 18, wherein said memory device is a hybrid multi-valued ROM device utilizing at least one multi-valued transistor to provide multiple drives, and wherein said at least one multi-valued transistor are selectively associated with two or more bitlines.

32. The method of claim 18, wherein said memory device is a hybrid multi-valued ROM device utilizing a set of multi-valued transistors to provide multiple drives, and wherein each said memory cell is manufactured to contain two transistors selected from said set of multi-valued transistors and to be associated with two wordlines and one via-stack.

33. The method of claim 18, wherein said memory device is a hybrid multi-valued ROM device utilizing a set of multi-valued transistors to provide multiple drives, and wherein each said memory cell is manufactured to contain one transistor selected from said set of multi-valued transistors and to be associated with one wordline and one via-stack.

34. The method of claim 18, wherein said memory device is manufactured to be a combination ROM-RAM memory device comprising a ROM memory structure implemented over a RAM memory structure, wherein a plurality of bitlines are selectively connected to said RAM memory structure at the time of manufacture.

35. The method of claim 18, wherein each memory cell contains at least two transistors, and wherein each transistor within each memory cell is selectively associated or unassociated with a bitline.

36. The method of claim 18, wherein each memory cell is one of a plurality of cell types to allow for a diversity of information storage capacity amongst memory cells, wherein each cell type is configured at the time of manufacture to allow for a maximum amount of bitline selection selected from the group consisting of none, one, and greater than one.

\* \* \* \* \*